United States Patent
Ikeda et al.

(10) Patent No.: US 12,342,707 B2
(45) Date of Patent: Jun. 24, 2025

(54) DISPLAY DEVICE AND ELECTRONIC DEVICE

(71) Applicant: Semiconductor Energy Laboratory Co., Ltd., Atsugi (JP)

(72) Inventors: Hisao Ikeda, Zama (JP); Ryo Hatsumi, Hadano (JP); Daiki Nakamura, Atsugi (JP); Takeya Hirose, Atsugi (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 18/685,268

(22) PCT Filed: Aug. 18, 2022

(86) PCT No.: PCT/IB2022/057727
§ 371 (c)(1),
(2) Date: Feb. 21, 2024

(87) PCT Pub. No.: WO2023/031718
PCT Pub. Date: Mar. 9, 2023

(65) Prior Publication Data
US 2024/0349579 A1    Oct. 17, 2024

(30) Foreign Application Priority Data

Aug. 31, 2021 (JP) ................. 2021-140634
Sep. 24, 2021 (JP) ................. 2021-155023

(51) Int. Cl.
*G06F 3/042* (2006.01)
*G06V 40/13* (2022.01)
(Continued)

(52) U.S. Cl.
CPC ....... *H10K 59/879* (2023.02); *G06V 40/1318* (2022.01); *H10K 30/87* (2023.02);
(Continued)

(58) Field of Classification Search
CPC .. G06V 40/13; G06V 40/1318; H10K 59/879; H10K 30/87; H10K 39/34; H10K 59/8792; G06F 3/042; G06F 2203/04108
See application file for complete search history.

(56) References Cited

U.S. PATENT DOCUMENTS 5,953,985 A    9/1999   Kobayashi
6,120,338 A    9/2000   Hirano et al.
(Continued)

FOREIGN PATENT DOCUMENTS

CN    102159972 A    8/2011
CN    102830568 A    12/2012
(Continued)

OTHER PUBLICATIONS

Translation of WO2021/074738 (Year: 2021).*
(Continued)

*Primary Examiner* — Lixi C Simpson
(74) *Attorney, Agent, or Firm* — Eric J. Robinson; Robinson Intellectual Property Law Office, P.C.

(57) ABSTRACT

A display device having an image capturing function is provided. The display device includes a first pixel and a second pixel. The first pixel includes a light-emitting device. The second pixel includes a light-receiving device and a lens. The light-emitting device and the light-receiving device share an electrode. The lens and the light-receiving device include a region overlapping with each other. The width of the lens is greater than the width of a light-receiving portion of the light-receiving device. The cross-sectional shape of the lens in a thickness direction including an optical axis is a substantial trapezoid. The surface including a leg of the substantially trapezoidal shape has a convex shape. The surface including an upper base of the substantially trapezoidal shape and the light-receiving portion are provided to
(Continued)

FIG. 1C face each other. The first pixel and the second pixel are provided to be adjacent to each other.

15 Claims, 29 Drawing Sheets

(51) Int. Cl.
  *H10K 30/87* (2023.01)
  *H10K 39/34* (2023.01)
  *H10K 59/80* (2023.01)
(52) U.S. Cl.
  CPC ......... *H10K 39/34* (2023.02); *H10K 59/8792* (2023.02); *G06F 3/042* (2013.01); *G06F 2203/04108* (2013.01)

(56) References Cited

U.S. PATENT DOCUMENTS

| | | | |
|---|---|---|---|
| 8,551,804 | B2 | 10/2013 | Hori et al. |
| 9,019,449 | B2 | 4/2015 | Baek et al. |
| 10,862,072 | B2 | 12/2020 | Park et al. |
| 11,394,014 | B2 | 7/2022 | Kubota et al. |
| 11,657,642 | B2 | 5/2023 | Husth |
| 11,659,758 | B2 | 5/2023 | Kamada et al. |
| 2002/0072139 | A1 | 6/2002 | Kashiwabara |
| 2011/0148290 | A1 | 6/2011 | Oota |
| 2011/0175118 | A1 | 7/2011 | Hori et al. |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2012/0320288 | A1 | 12/2012 | Baek et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0256754 | A1 | 9/2017 | Defranco et al. |
| 2018/0190193 | A1 | 7/2018 | Kim et al. |
| 2018/0190908 | A1 | 7/2018 | Ke et al. |
| 2019/0372057 | A1 | 12/2019 | Park et al. |
| 2020/0203662 | A1 | 6/2020 | Mollard et al. |
| 2020/0394382 | A1* | 12/2020 | Kim ................. G06V 40/1318 |
| 2021/0005669 | A1 | 1/2021 | Kamada et al. |
| 2021/0066669 | A1 | 3/2021 | Kubota et al. |
| 2021/0360154 | A1* | 11/2021 | Slobodin ................. H04N 23/90 |
| 2022/0376006 | A1* | 11/2022 | Li ........................ H10K 50/84 |
| 2023/0255094 | A1 | 8/2023 | Kamada et al. |

FOREIGN PATENT DOCUMENTS

| | | |
|---|---|---|
| CN | 108269938 A | 7/2018 |
| CN | 110544749 A | 12/2019 |
| CN | 112186111 A | 1/2021 |
| CN | 112602112 A | 4/2021 |
| EP | 2535746 A | 12/2012 |
| EP | 3576157 A | 12/2019 |
| EP | 3994658 A | 5/2022 |
| JP | 2000-036385 A | 2/2000 |
| JP | 2003-059663 A | 2/2003 |
| JP | 2008-098106 A | 4/2008 |
| JP | 2008-147072 A | 6/2008 |
| JP | 2008-251270 A | 10/2008 |
| JP | 2010-080224 A | 4/2010 |
| JP | 2013-003588 A | 1/2013 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-024414 A | 2/2016 |
| JP | 2016-197494 A | 11/2016 |
| JP | 2019-179696 A | 10/2019 |
| JP | 2019-208027 A | 12/2019 |
| JP | 2020-101659 A | 7/2020 |
| JP | 2020-160305 A | 10/2020 |
| JP | 2021-012366 A | 2/2021 |
| JP | 2021-039342 A | 3/2021 |
| KR | 2012-0138688 A | 12/2012 |
| KR | 2018-0079040 A | 7/2018 |
| KR | 2019-0135848 A | 12/2019 |
| KR | 2021-0004867 A | 1/2021 |
| WO | WO-2018/087625 | 5/2018 |
| WO | WO-2021/002791 | 1/2021 |
| WO | WO-2021/074738 | 4/2021 |

OTHER PUBLICATIONS

International Search Report (Application No. PCT/IB2022/057727) Dated Oct. 25, 2022.
Written Opinion (Application No. PCT/IB2022/057727) Dated Oct. 25, 2022.
Zakhidov.A et al., "Orthogonal processing: A new strategy for organic electronics", Chem. Sci. (Chemical Science), Apr. 7, 2011, vol. 2, No. 6, pp. 1178-1182.
Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke. T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

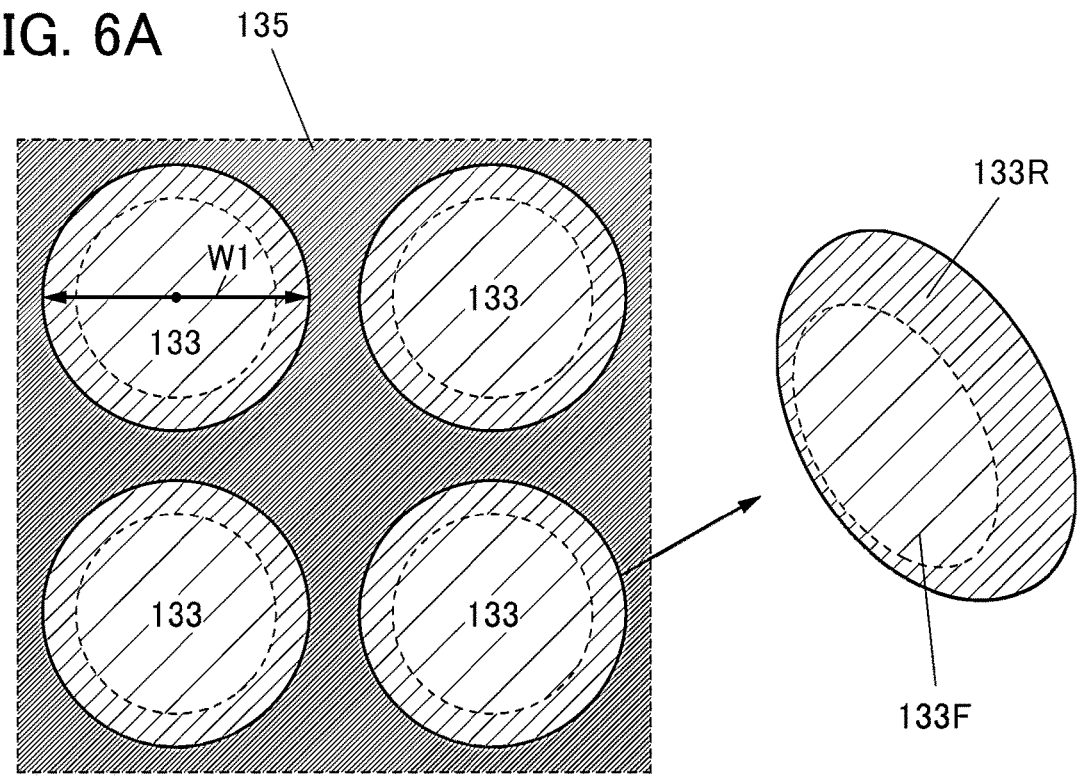
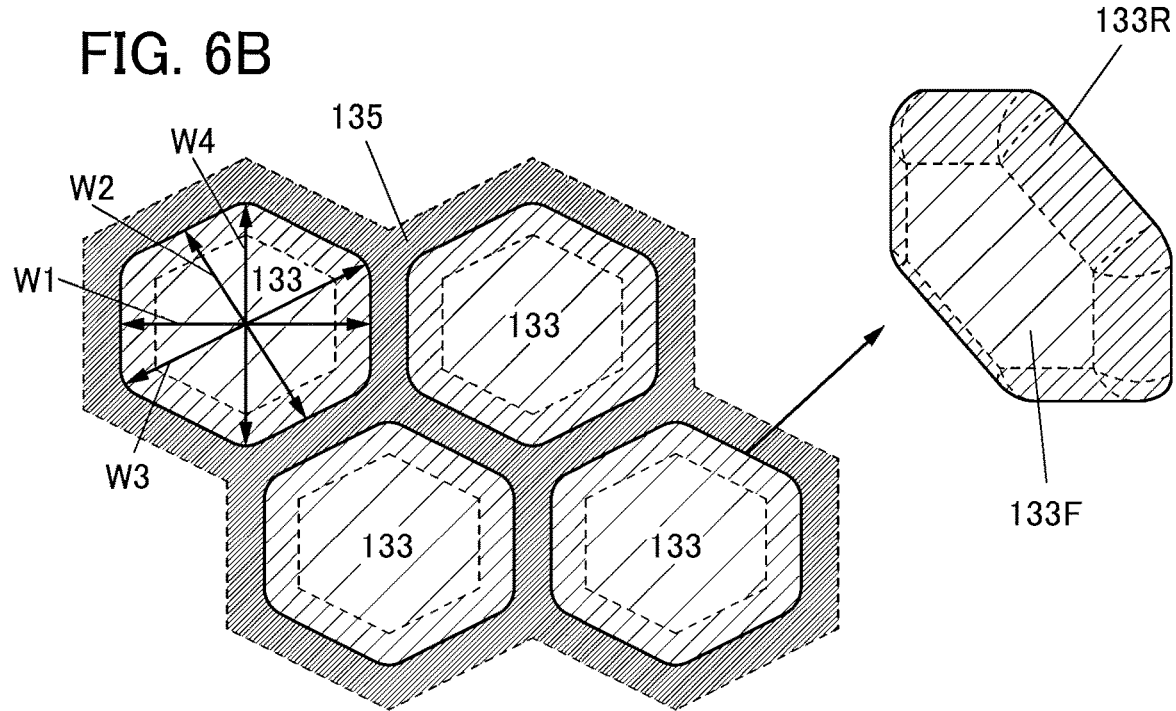

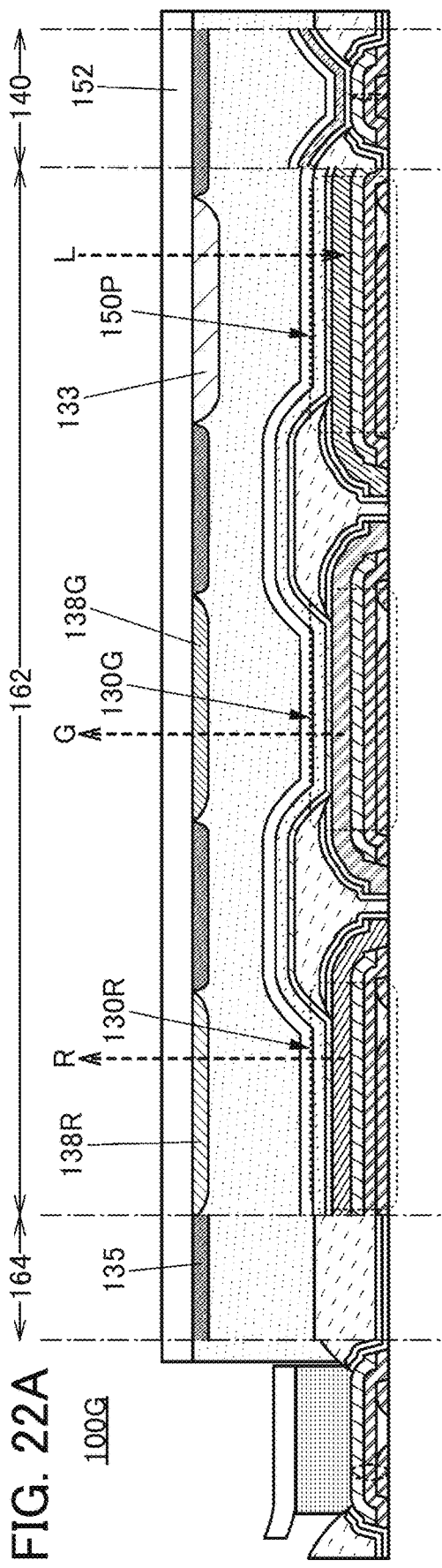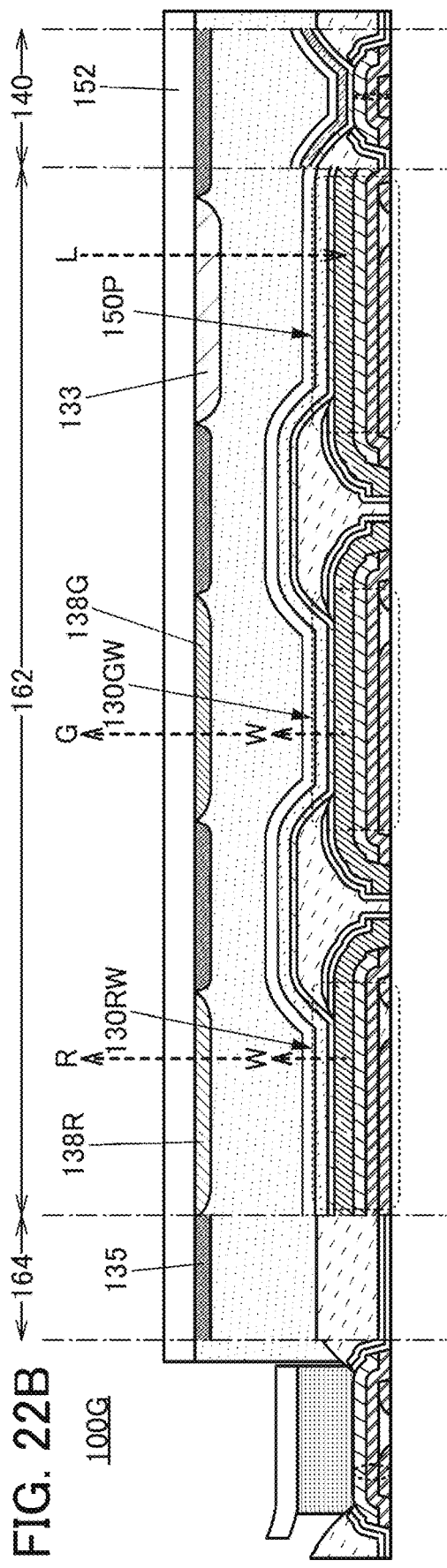

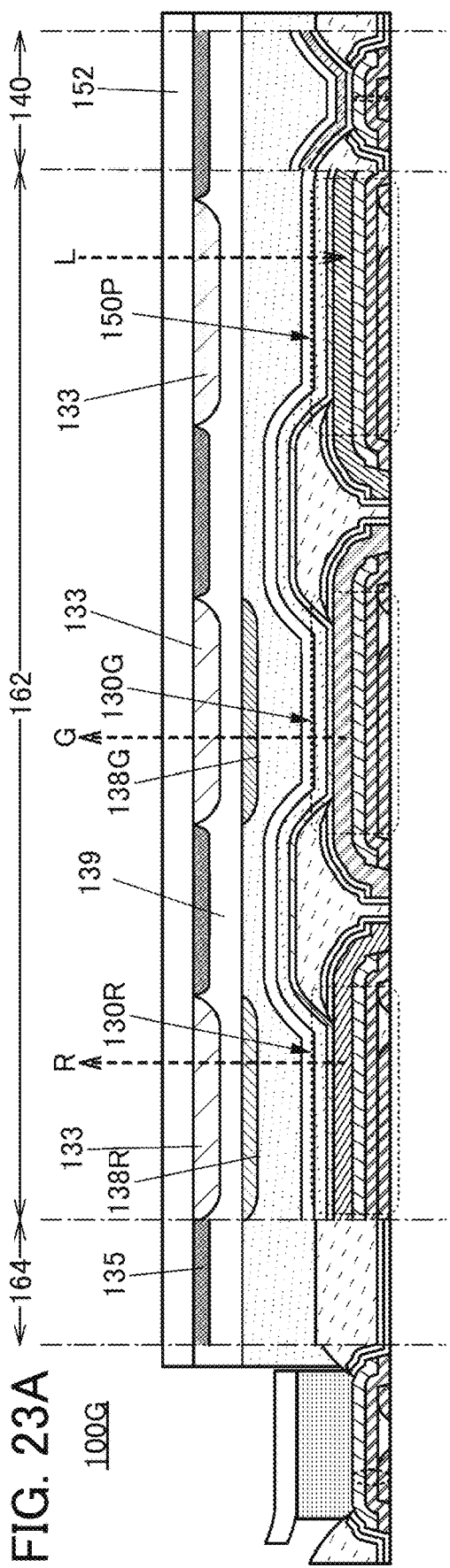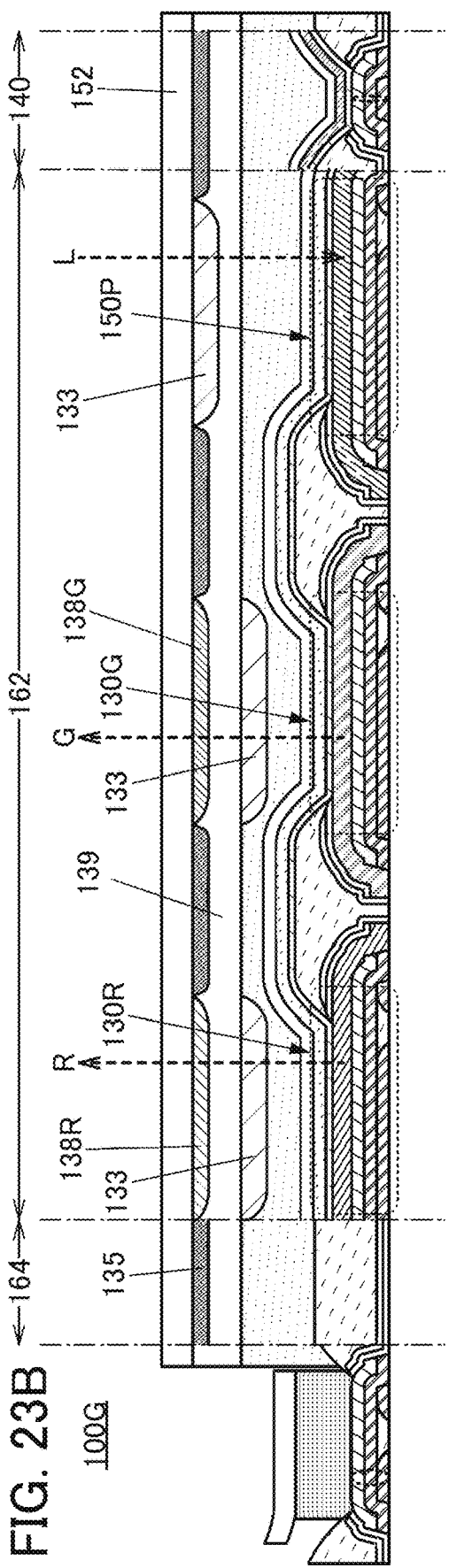

DISPLAY DEVICE AND ELECTRONIC DEVICE

TECHNICAL FIELD

One embodiment of the present invention relates to a display device.

Note that one embodiment of the present invention is not limited to the above technical field. Examples of the technical field of one embodiment of the present invention include a semiconductor device, a display device, a light-emitting apparatus, a power storage device, a memory device, an electronic device, a lighting device, an input device (e.g., a touch sensor), an input/output device (e.g., a touch panel), a method for driving any of them, and a method for fabricating any of them.

BACKGROUND ART

In recent years, display devices have been used in various applications. Usage examples of a large display device include a television device for home use, digital signage, and a PID (Public Information Display). In addition, many display devices have been used for, for example, smartphones and tablet terminals each including a touch panel.

Furthermore, higher-resolution display devices have been required. For example, devices for virtual reality (VR), augmented reality (AR), substitutional reality (SR), or mixed reality (MR) are given as devices requiring high-resolution display devices and have been required.

Light-emitting apparatuses including light-emitting devices (also referred to as light-emitting elements) have been developed as display devices, for example. Light-emitting devices (also referred to as EL devices or EL elements) utilizing electroluminescence (hereinafter referred to as EL) phenomenon have features such as ease of reduction in thickness and weight, high-speed response to input signals, and driving with a constant DC voltage power source.

Patent Document 1 discloses a display device using an organic EL device (also referred to as organic EL element) for VR.

To improve light extraction efficiency, a display device employs a structure in which light emitted from a light-emitting device is extracted through a microlens. Patent Document 2 discloses a method for forming a microlens using a radiation-sensitive resin composite.

REFERENCE

Patent Document

[Patent Document 1] PCT International Publication No. 2018/087625

[Patent Document 2] Japanese Published Patent Application No. 2020-101659

SUMMARY OF THE INVENTION

Problems to be Solved by the Invention

A display device in which a light-receiving device is formed in a pixel can have an image capturing function. For example, image capturing is performed with a finger or a palm in contact with a panel surface, whereby an image of a fingerprint, a palm print, or the like can be obtained. The images of the fingerprint, the palm print, or the like can be used for personal authentication.

Here, since the distance between the panel surface and the light-receiving device is short, providing a lens gathering rays of light to form an image is difficult. Thus, a structure is preferably employed in which a pinhole is formed over the light-receiving device to cut rays of light and then form an image. In the case of employing the structure, it is desired that light passing through a pinhole be effectively received to improve the light-receiving sensitivity.

Accordingly, an object of one embodiment of the present invention is to provide a display device having an image capturing function. Another object is to provide a display device with a structure for improving the sensitivity of a light-receiving device. Another object is to provide a display device having an authentication function. Another object is to provide a high-resolution display device. Another object is to provide a high-definition display device. Another object is to provide a high-luminance display device. Another object is to provide a highly reliable display device.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a display device including a first pixel and a second pixel. The first pixel includes a light-emitting device. The second pixel includes a light-receiving device and a lens. The light-emitting device and the light-receiving device share an electrode. The lens and the light-receiving device include a region overlapping with each other. A width of the lens is greater than a width of a light-receiving portion of the light-receiving device. A cross section of the lens in a thickness direction including an optical axis has a substantially trapezoidal shape. A surface including a leg of the substantially trapezoidal shape has a convex shape. A surface including an upper base of the substantially trapezoidal shape and the light-receiving portion are provided to face each other. The first pixel and the second pixel are provided to be adjacent to each other.

A light-blocking layer is preferably formed around the above lens.

In the above lens, the surface including the upper base of the substantially trapezoidal shape can include a convex surface.

The lens and the light-receiving device are preferably separately provided in such a manner that a center of the lens and a center of the light-receiving device overlap with each other.

Another embodiment of the present invention is a display device including a first pixel and a second pixel. The first pixel includes a light-emitting device and a first lens. The second pixel includes a light-receiving device and a second lens. The light-emitting device and light-receiving device share an electrode. The first lens and the light-emitting device include a region overlapping with each other. The second lens and the light-receiving device include a region overlapping with each other. A width of the first lens is greater than a width of a light-emitting portion of the light-emitting device. A width of the second lens is greater than a width of a light-receiving portion of the light-receiving device. Cross sections of the first lens and the second lens in a thickness direction including optical axes each have a substantially trapezoidal shape. A surface including a leg of the substantially trapezoidal shape has a convex shape. A surface of the first lens including an upper base of the substantially trapezoidal shape and the light-emitting portion are provided to face each other. A surface of the second lens including an upper base of the substantially trapezoidal shape and the light-receiving portion are provided to face each other. The first pixel and the second pixel are provided to be adjacent to each other.

A light-blocking layer can be formed around the first lens and the second lens. Alternatively, a light-blocking layer can be formed only around the second lens.

The surfaces of the first lens and the second lens including the upper bases of the substantially trapezoidal shapes can each include a convex surface.

The first lens and the light-emitting device are preferably separately provided in such a manner that a center of the first lens and a center of the light-emitting device overlap with each other and the second lens and the light-receiving device are preferably separately provided in such a manner that a center of the second lens and a center of the light-receiving device overlap with each other.

The light-emitting device may have a tandem structure. The tandem light-emitting device preferably includes a plurality of light-emitting units and the plurality of light-emitting units preferably emit light of the same color.

Another embodiment of the present invention is an electronic device including the display device in which an image of a fingerprint is obtained using the light-receiving device to perform fingerprint authentication.

Effect of the Invention

According to one embodiment of the present invention, a display device having an image capturing function can be provided. A display device with a structure for improving the sensitivity of the light-receiving device can be provided. A display device having an authentication function can be provided. A high-resolution display device can be provided. A high-definition display device can be provided. A high-luminance display device can be provided. A highly reliable display device can be provided.

Note that the description of these effects does not preclude the existence of other effects. One embodiment of the present invention does not necessarily have all of these effects. Other effects can be derived from the description of the specification, the drawings, and the claims.

BRIEF DESCRIPTION OF THE DRAWINGS

FIG. 6A and FIG. 6B are a top view and a perspective view illustrating components of a display device.

FIG. 22A and FIG. 22B are cross-sectional views illustrating examples of a display device.

FIG. 23A and FIG. 23B are cross-sectional views illustrating examples of a display device.

MODE FOR CARRYING OUT THE INVENTION

Figure 1A:
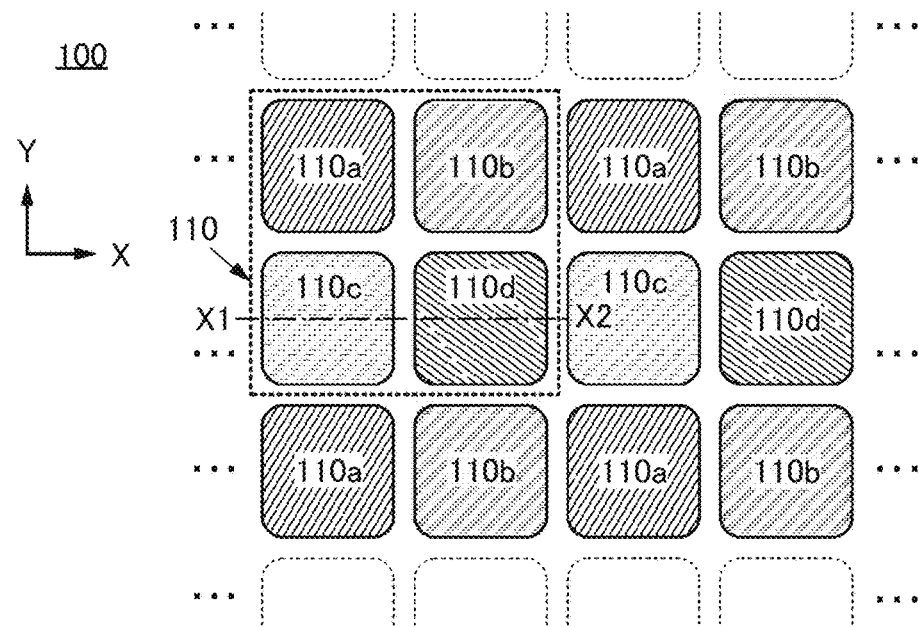
FIG. 1A is a top view illustrating an example of a display device.

Embodiments will be described in detail with reference to the drawings. Note that the present invention is not limited to the following description, and it will be readily understood by those skilled in the art that modes and the details of the present invention can be modified in various ways without departing from the spirit and scope of the present invention. Therefore, the present invention should not be construed as being limited to the description of embodiments below.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

The position, size, range, or the like of each component illustrated in drawings does not represent the actual position, size, range, or the like in some cases for easy understanding.

Therefore, the disclosed invention is not necessarily limited to the position, size, range, or the like disclosed in the drawings.

Note that the term "film" and the term "layer" can be interchanged with each other depending on the case or the circumstances. For example, the term "conductive layer" can be replaced with the term "conductive film". As another example, the term "insulating film" can be replaced with the term "insulating layer".

In this specification and the like, a device fabricated using a metal mask or an FMM (fine metal mask) is sometimes referred to as a device having an MM (metal mask) structure. In addition, in this specification and the like, a device fabricated without using a metal mask or an FMM is sometimes referred to as a device having an MML (metal maskless) structure.

In this specification and the like, a hole or an electron is sometimes referred to as a "carrier". Specifically, a hole-injection layer or an electron-injection layer may be referred to as a "carrier-injection layer", a hole-transport layer or an electron-transport layer may be referred to as a "carrier-transport layer", and a hole-blocking layer or an electron-blocking layer may be referred to as a "carrier-blocking layer". Note that the above-described carrier-injection layer, carrier-transport layer, and carrier-blocking layer cannot be distinguished from each other on the basis of the cross-sectional shape or properties in some cases. Furthermore, one layer may have two or three functions of the carrier-injection layer, the carrier-transport layer, and the carrier-blocking layer in some cases.

In this specification and the like, a light-emitting device (also referred to as a light-emitting element) includes an EL layer between a pair of electrodes. The EL layer includes at least a light-emitting layer. Examples of the layers (also referred to as functional layers) in the EL layer include a light-emitting layer, carrier-injection layers (a hole-injection layer and an electron-injection layer), carrier-transport layers (a hole-transport layer and an electron-transport layer), and carrier-blocking layers (a hole-blocking layer and an electron-blocking layer). In this specification and the like, a light-receiving device (also referred to as a light-receiving element) includes at least an active layer that functions as a photoelectric conversion layer between a pair of electrodes. In this specification and the like, one of the pair of electrodes may be referred to as a common electrode and the other may be referred to as a pixel electrode.

In this specification and the like, a tapered shape indicates a shape in which at least part of the side surface of a structure is inclined to a substrate surface. For example, a tapered shape preferably includes a region where the angle between the inclined side surface and the substrate surface (such an angle is also referred to as a taper angle) is less than 90°. Note that the side surface of the component and the substrate surface are not necessarily completely flat and may be substantially flat with a slight curvature or substantially flat with slight unevenness.

Note that in this specification and the like, a mask layer is positioned above at least a light-emitting layer (specifically, a layer processed into an island shape among layers included in an EL layer) or an active layer and has a function of protecting the light-emitting layer or the active layer in the fabrication process. The mask layer may be removed in the fabrication process or at least part of the mask layer may remain.

Embodiment 1

In this embodiment, a display device of one embodiment of the present invention is described with reference to the drawings.

One embodiment of the present invention is a display device including a light-emitting device and a light-receiving device that are separately formed for each emission color and capable of performing full-color display and image capturing operation. Note that the light-emitting device may have a tandem structure. With the use of a tandem light-emitting device, a display device capable of high-luminance display and having high reliability can be obtained.

In this specification or the like, a structure where at least light-emitting layers in light-emitting devices of different colors (e.g., blue (B), green (G), and red (R)) are separately formed or separately patterned is sometimes referred to as an SBS (Side By Side) structure. In the SBS structure, the material and the structure of each light-emitting device can be optimized, whereby the luminance and reliability of the display device can be improved.

In the case of fabricating a display device including a plurality of light-emitting devices emitting light of different colors, light-emitting layers emitting light of different colors each are formed into an island shape. Also in the light-receiving device, an active layer (a layer having a photoelectric conversion function) is formed into an island shape.

Note that in this specification and the like, the term "island shape" refers to a state where two or more layers formed using the same material in the same step are physically separated from each other. For example, "island-shaped light-emitting layer" means a state where the light-emitting layer and its adjacent light-emitting layer are physically separated from each other.

The island-shaped light-emitting layer and the island-shaped active layer can be formed by a vacuum evaporation method using a metal mask. However, this method causes a deviation from the designed shape and position of the island-shaped light-emitting layer due to the influence of the positional deviation between the metal mask and the substrate, a warp of the metal mask, entry of an evaporation substance, and the like in some cases. Thus, the formation method using a metal mask is unsuitable for achieving higher resolution and a higher aperture ratio of the display device. In the case of fabricating a display device with a large size and high resolution, the manufacturing yield might be reduced because of low dimensional accuracy of the metal mask, deformation due to, for example, heat, or the like.

Thus, in the fabrication of the display device of one embodiment of the present invention, the light-emitting layer and the active layer are processed into a minute pattern through a lithography process and an etching process. Specifically, a film to be the light-emitting layer or the active layer is formed over a plurality of pixel electrodes that have been formed for respective subpixels. After that, the film is processed through a lithography process and an etching process, so that one island-shaped light-emitting layer or one island-shaped active layer is formed for one pixel electrode. Thus, an island-shaped light-emitting layer or an island-shaped active layer can be formed for each subpixel. Note that in this specification and the like, a subpixel is simply referred to as a pixel in some cases.

A functional layer is preferably provided between the pixel electrode and the light-emitting layer or the active layer. The functional layer is preferably processed into an island shape with the same pattern as that of the light-emitting layer or the active layer. Here, the functional layer refers to, for example, a carrier-injection layer, a carrier-transport layer, or a carrier-blocking layer, specifically, a hole-injection layer, a hole-transport layer, an electron-blocking layer, or the like.

In the case where the functional layer described above is used as a layer shared by adjacent subpixels, a lateral leakage current due to the functional layer might be caused. Meanwhile, in the display device of one embodiment of the present invention, the functional layer is processed into an island shape with the same pattern as the light-emitting layer; hence, the lateral leakage current between adjacent subpixels is not substantially generated or a lateral leakage current can be extremely small.

In the light-emitting devices emitting light of different colors and the light-receiving device, some layers can be formed in the same process. In the method for fabricating the display device of one embodiment of the present invention, some layers included in the EL layers included in the light-emitting devices are formed into an island shape for each emission color. The active layer included in the light-receiving device is formed into an island shape. After that, the other layers included in the light-emitting devices and the light-receiving device (sometimes referred to as a common layer) and a common electrode shared by the light-emitting devices and the light-receiving device (also referred to as an upper electrode) are formed.

Here, the common layer is a layer having relatively high conductivity. Thus, when the common layer is in contact with side surfaces of some layer in the EL layer formed into an island shape, a side surface of the active layer, or a side surface of the pixel electrode, an upper layer and a lower layer in the light-emitting device and the light-receiving device might be short-circuited. Note that even when an island-shaped common layer is provided and the common electrode is formed to be shared by the light-emitting elements of different colors, the common electrode might cause a short circuit.

Thus, the display device of one embodiment of the present invention includes an insulating layer covering at least the side surfaces of the island-shaped light-emitting layer and the island-shaped active layer. The insulating layer preferably covers part of each of the top surfaces of the island-shaped light-emitting layer and the island-shaped active layer.

This can inhibit some layers of the island-shaped EL layers, the island-shaped active layers, and the island-shaped pixel electrodes from being in contact with the common layer or the common electrode. Thus, a short circuit between an upper layer and a lower layer in the light-emitting device and the light-receiving device can be inhibited and the yield of the light-emitting devices and the light-receiving devices can be increased.

In a cross-sectional view, an end portion of the insulating layer preferably has a tapered shape with a taper angle less than 90°. In this case, step disconnection of the common layer and the common electrode provided over the insulating layer can be prevented. Consequently, it is possible to inhibit a connection defect due to step disconnection. Alternatively, an increase in electrical resistance caused by local thinning of the common electrode due to step difference can be inhibited.

Note that in this specification and the like, step disconnection refers to a phenomenon in which a layer, a film, or an electrode is disconnected because of the shape of the formation surface (e.g., a step difference).

Thus, the island-shaped light-emitting layer and the island-shaped active layer fabricated by the method for fabricating the display device of one embodiment of the present invention are formed by processing a film deposited over a surface. Accordingly, a high-resolution display device or a display device with a high aperture ratio, which has been difficult to achieve, can be fabricated. Moreover, light-emitting layers of the light-emitting device can be formed separately for the respective colors, enabling the display device to perform extremely clear display with high contrast, high luminance, and high display quality. In the light-receiving device, a high-resolution image can be captured.

Furthermore, the display device of one embodiment of the present invention has a convex lens-shaped structure over the light-receiving device and the light-emitting device. When the structure is provided over the light-receiving device and the light-emitting device, the light-receiving sensitivity of the light-receiving device and the extraction efficiency of light emitted from the light-emitting device to the outside can be increased.

The structure provided over the light-receiving device and having a larger width than the width of a light-receiving portion can improve light condensing capability, and accordingly the light-receiving device can have improved light sensitivity.

The convex lens-shaped structure preferably has a substantially trapezoidal shape. When a lens-shaped structure in which the cross section has a hemispherical shape is used, the width of the lens is proportional to the thickness of the lens; thus, the lens-shaped structure cannot be placed depending on a pixel size in some cases. Furthermore, part of light that is reflected in the structure tends to have large incident angle. Thus, the light tends to reflect totally, and the light cannot efficiently enter the light-receiving device in some cases.

When a structure in which the cross section has a substantially trapezoidal shape is used, the vicinity of the end portion has a lens shape, and a region near the center has a flat plate shape. Thus, light entering the vicinity of an end portion of an opening portion can be refracted and enter the light-receiving device. Since light that is reflected in the structure has relatively small incident angle, the light is less likely to reflect totally and thus can enter the light-receiving device effectively. Hence, the light sensitivity of the light-receiving device can be improved.

Part of light emitted from the light-emitting device is blocked by the vicinity of the end portion of the opening portion and is not extracted to the outside in some cases. When the convex lens-shaped structure is provided in the optical path of the light, the light can be refracted and extracted to the outside. Hence, the light extraction efficiency can be improved.

Note that the convex lens-shaped structure can be provided over both of the light-receiving device and the light-emitting device, but may be provided over one of the light-receiving device and the light-emitting device.

Note that in this specification, the above-described convex lens-shaped structure in which the cross section has a substantially trapezoidal shape may be simply referred to as a lens, a trapezoidal lens, or a microlens. In some cases, the lenses arranged regularly are referred to as a microlens array (MLA).

In this embodiment, a cross-sectional structure example of the display device of one embodiment of the present invention will be mainly described.

FIG. 1A is a top view of a display device 100 including light-emitting devices and light-receiving devices. The display device 100 includes a display portion where a plurality of pixels 110 are arranged. FIG. 1A illustrates some subpixels to show an example where the pixel 110 is formed with a plurality of subpixels arranged at a regular interval (the subpixels 110*a*, 110*b*, 110*c*, and 110*d*).

Note that in this specification and the like, the row direction is sometimes referred to as X direction and the column direction is referred to as Y direction. The X direction and the Y direction intersect with each other and are, for example, orthogonal or substantially orthogonal to each other (see FIG. 1A).

The top surface shape of the subpixel illustrated in FIG. 1A corresponds to the top surface shape of a light-emitting region or a light-receiving region. The top surface shape of the subpixel may be polygons such as a triangle, a tetragon (including a rectangle and a square), and a pentagon; polygons with rounded corners; an ellipse; a circle; or the like.

The range of the circuit layout included in the subpixel is not limited to the range of the subpixel illustrated in FIG. 1A and may be placed outside the subpixel. For example, transistors included in the subpixel 110a may be positioned within the range of the subpixel 110b, or some or all of the transistors may be positioned outside the range of the subpixel 110a.

The aperture ratio of each of the subpixels 110a, 110b, 110c, and 110d can be determined as appropriate. The subpixels 110a, 110b, 110c, and 110d may have different aperture ratios, or two or more of them may have the same or substantially the same aperture ratio.

The display device of one embodiment of the present invention includes the light-receiving device in a pixel. Three of the four subpixels included in the pixel 110 in FIG. 1A can include the light-emitting devices and the other one can include the light-receiving device, for example.

The three subpixels can include light-emitting devices emitting light of different colors. As the example of the three subpixels, subpixels of three colors of red (R), green (G), and blue (B), subpixels of three colors of yellow (Y), cyan (C), and magenta (M), and the like can be given.

Note that in the following description, as an example, the subpixels 110a, 110b, and 110c each include a light-emitting device and the subpixel 110d includes a light-receiving device 150. As components of a light-emitting device, components of a light-emitting device 130c of the subpixel 110c will be described and common components can also be applied to light-emitting devices of the subpixels 110a and 110b.

Figure 1B:
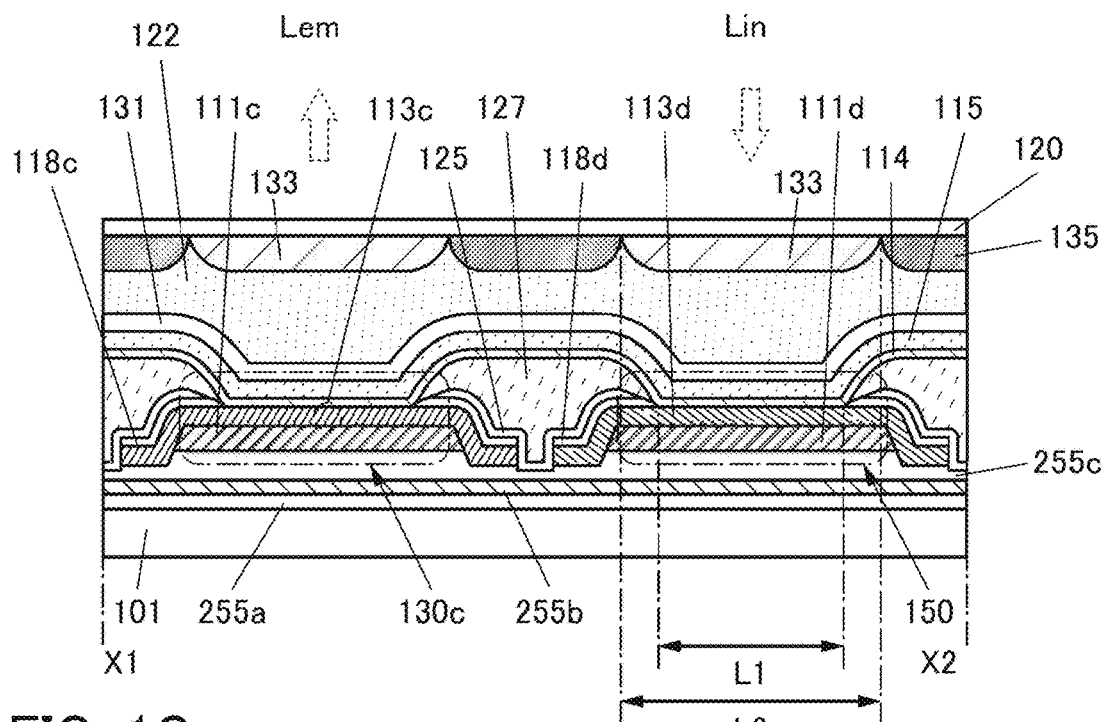
FIG. 1B is a cross-sectional view illustrating an example of the display device.

FIG. 1B is a cross-sectional view along dashed-dotted line X1-X2 in FIG. 1A. As illustrated in FIG. 1B, an insulating layer is provided over a layer 101 including transistors and the light-emitting device 130c and the light-receiving device 150 are provided over the insulating layer. A protective layer 131 is provided to cover the light-emitting device 130c and the light-receiving device 150.

Over the protective layer 131, a lens 133 and a light-blocking layer 135 provided over a substrate 120 are bonded to each other with an adhesive layer 122. Here, the lens 133 is provided for each subpixel and includes a region overlapping with the light-emitting device 130c or the light-receiving device 150. The light-blocking layer 135 is provided between adjacent lenses 133.

FIG. 1B illustrates an example in which light Lem emitted from the light-emitting device 130c is emitted to the substrate 120 side through the lens 133 and light Lin entering from the substrate 120 side enters the light-receiving device 150 through the lens 133.

In a region between the light-emitting device and the light-receiving device 150 adjacent to each other, an insulating layer 125 and an insulating layer 127 over the insulating layer 125 are provided. Although not illustrated in FIG. 1B, the insulating layer 125 and the insulating layer 127 are provided also in a region between adjacent light-emitting devices.

First, the light-emitting device will be described. The display device of one embodiment of the present invention has a top-emission structure in which light is emitted in a direction opposite to the substrate where the light-emitting device is formed.

The layer 101 including transistors can employ a stacked-layer structure where a plurality of transistors are provided over a substrate and an insulating layer is provided to cover these transistors, for example. The insulating layer over the transistors may have a single-layer structure or a stacked-layer structure. In FIG. 1B, an insulating layer 255a, an insulating layer 255b over the insulating layer 255a, and an insulating layer 255c over the insulating layer 255b are illustrated as the insulating layer over the transistors.

As each of the insulating layer 255a, the insulating layer 255b, and the insulating layer 255c, a variety of inorganic insulating films such as an oxide insulating film, a nitride insulating film, an oxynitride insulating film, and a nitride oxide insulating film can be suitably used. As each of the insulating layer 255a and the insulating layer 255c, an oxide insulating film or an oxynitride insulating film, such as a silicon oxide film, a silicon oxynitride film, or an aluminum oxide film, is preferably used. As the insulating layer 255b, a nitride insulating film or a nitride oxide insulating film, such as a silicon nitride film or a silicon nitride oxide film, is preferably used. Specifically, it is preferable that a silicon oxide film be used as the insulating layer 255a and the insulating layer 255c and a silicon nitride film be used as the insulating layer 255b. The insulating layer 255b preferably has a function of an etching protective film.

Note that in this specification and the like, oxynitride refers to a material that contains more oxygen than nitrogen in its composition, and nitride oxide refers to a material that contains more nitrogen than oxygen in its composition. For example, in the case where silicon oxynitride is described, it refers to a material that contains more oxygen than nitrogen in its composition; in the case where silicon nitride oxide is described, it refers to a material that contains more nitrogen than oxygen in its composition.

The light-emitting device can emit infrared, red, green, blue, cyan, magenta, yellow, or white light, for example. Furthermore, the color purity can be further increased when the light-emitting device has a microcavity structure. The light-emitting device 130c can emit light of any one of three colors of red (R), green (G), and blue (B), for example.

As the light-emitting device, an OLED (Organic Light Emitting Diode) or a QLED (Quantum-dot Light Emitting Diode) is preferably used. As a light-emitting substance included in the light-emitting device, a substance emitting fluorescent light (a fluorescent material), a substance emitting phosphorescent light (a phosphorescent material), a substance exhibiting thermally activated delayed fluorescence (a thermally activated delayed fluorescent (TADF) material), an inorganic compound (e.g., a quantum dot material), or the like can be used.

One of a pair of electrodes of the light-emitting device functions as a cathode and the other electrode functions as an anode. The case where the pixel electrode functions as an anode and the common electrode functions as a cathode is described below as an example in some cases.

The light-emitting device 130c includes a pixel electrode 111c over the insulating layer 255c, an island-shaped layer 113c over the pixel electrode 111c, a common layer 114 over the layer 113c, and a common electrode 115 over the common layer 114. In the light-emitting device 130c, the layer 113c and the common layer 114 can be collectively referred to as an EL layer.

When the EL layer is provided into an island shape for each light-emitting device, a leakage current between adjacent light-emitting devices can be inhibited. This can prevent crosstalk due to unintended light emission, so that a display device with extremely high contrast can be achieved. Specifically, a display device having high current efficiency at low luminance can be achieved.

The light-emitting device of this embodiment may have either a single structure (a structure including only one light-emitting unit) or a tandem structure (a structure including a plurality of light-emitting units). The light-emitting unit includes at least one light-emitting layer.

In the case of using a light-emitting device having a single structure, the layer 113c can include a light-emitting layer emitting red, green, or blue light.

In the case of using a light-emitting device having a tandem structure, the layer 113c can include a plurality of light-emitting units emitting red, green, or blue light. Furthermore, to emit white light, a tandem structure in which light-emitting units emitting light of different colors are combined can be employed.

In addition, the layer 113c may include one or more of a hole-injection layer, a hole-transport layer, a hole-blocking layer, a charge-generation layer, an electron-blocking layer, an electron-transport layer, and an electron-injection layer.

For example, the layer 113c can include a hole-injection layer, a hole-transport layer, a light-emitting layer, and an electron-transport layer in this order. In addition, an electron-blocking layer may be provided between the hole-transport layer and the light-emitting layer. In addition, a hole-blocking layer may be provided between the electron-transport layer and the light-emitting layer. Furthermore, an electron-injection layer may be provided over the electron-transport layer.

Alternatively, the layer 113c can include an electron-injection layer, an electron-transport layer, a light-emitting layer, and a hole-transport layer in this order. In addition, a hole-blocking layer may be provided between the electron-transport layer and the light-emitting layer. In addition, an electron-blocking layer may be provided between the hole-transport layer and the light-emitting layer. Furthermore, a hole-injection layer may be provided over the hole-transport layer.

A light-emitting device having a tandem structure includes two or more light-emitting units in the layer 113c, and each light-emitting unit can include one or more light-emitting layers. Each of the light-emitting unit may include one or more of a hole-injection layer, a hole-transport layer, a hole-blocking layer, an electron-blocking layer, an electron-transport layer, and an electron-injection layer. A charge-generation layer (also referred to as an intermediate layer) is preferably provided between the light-emitting units. The charge-generation layer includes at least a charge-generation region.

Figure 1C:
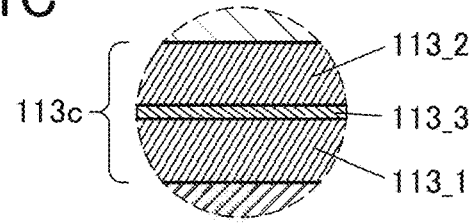
FIG. 1C is a diagram illustrating a stacked-layer structure of a light-emitting unit.

For example, the layer 113c can have a stacked-layer structure of a light-emitting unit 113_1, a charge-generation layer 1133, and a light-emitting unit 1132 (see an enlarged view of the layer 113c in FIG. 1C). Note that in the drawing used in this embodiment, the charge-generation layer is indicated by a dashed line in some cases.

In the case of using a light-emitting device having a tandem structure, the layer 113c can include a plurality of light-emitting units emitting light of the same color. For example, in the structure illustrated in FIG. 1C, the light-emitting unit 113_1 and the light-emitting unit 113_2 can include the same kind of light-emitting units emitting red, green, or blue light.

Furthermore, to emit white light, a tandem structure in which light-emitting units emitting light of different colors are combined can be employed. To obtain white light emission, the structure is made such that light emitted from a plurality of light-emitting units can be combined to be white light. For example, in the structure illustrated in FIG. 1C, one of the light-emitting units 113_1 and 113_2 may emit blue light and the other may emit yellow light. Alternatively, a light-emitting unit emitting red light and a light-emitting unit emitting cyan light may be combined. Alternatively, a light-emitting unit emitting green light and a light-emitting unit emitting magenta light may be combined.

Alternatively, three light-emitting units may be combined. For example, three light-emitting units, a light-emitting unit emitting red light, a light-emitting unit emitting green light, and a light-emitting unit emitting blue light may be combined. Alternatively, three light-emitting units, a light-emitting unit emitting blue light, a light-emitting unit emitting yellow or yellowish-green light, and a light-emitting unit emitting blue light, may be combined. Alternatively, three light-emitting units, a light-emitting unit emitting blue light, a light-emitting unit emitting red and yellow, yellowish-green, or green light, and a light-emitting unit emitting blue light may be combined.

Examples of the number of stacked light-emitting units and the order of colors from an anode side include a two-unit structure of B and Y; a two-unit structure of B and a light-emitting unit X; a three-unit structure of B, Y, and B; and a three-unit structure of B, X, and B. Examples of the number of light-emitting layers stacked in the light-emitting unit X and the order of colors from the anode side include a two-layer structure of R and Y; a two-layer structure of R and G; a two-layer structure of G and R; a three-layer structure of G, R, and G; and a three-layer structure of R, G, and R. Another layer may be provided between two light-emitting layers.

A light-emitting device having a tandem structure emitting light from a plurality of light-emitting units requires a relatively high voltage for light emission but requires a small amount of current for obtaining the emission intensity at the same level as that from a light-emitting device having a single structure (including one light-emitting unit). Thus, with the tandem structure, current stress on each light-emitting unit can be reduced and the element lifetime can be extended. That is, with a light-emitting device having a tandem structure, a highly reliable display device can be formed.

It is preferable that the light-emitting unit 113_2 include a light-emitting layer and a carrier-transport layer (an electron-transport layer or a hole-transport layer) over the light-emitting layer in the structure illustrated in FIG. 1C. Alternatively, the light-emitting unit 113_2 preferably includes a light-emitting layer and a carrier-blocking layer (a hole-blocking layer or an electron-blocking layer) over the light-emitting layer. Alternatively, the light-emitting unit 113_2 preferably includes a light-emitting layer, a carrier-blocking layer over the light-emitting layer, and a carrier-transport layer over the carrier-blocking layer. Since the surface of the light-emitting unit 113_2 is exposed in the fabrication process of the display device, providing one or both of the carrier-transport layer and the carrier-blocking layer over the light-emitting layer inhibits the light-emitting layer from being exposed on the outermost surface, so that damage to the light-emitting layer can be reduced. Thus, the reliability of the light-emitting device can be increased. Note that in the case where three or more light-emitting units are provided, the uppermost light-emitting unit preferably includes a light-emitting layer and one or both of a carrier-transport layer (an electron-transport layer or a hole-transport layer) and a carrier-blocking layer over the light-emitting layer.

The structure and the material of the light-emitting device having a tandem structure are described in detail in another embodiment.

The common layer 114 can include an electron-injection layer or a hole-injection layer. Alternatively, the common layer 114 may include a stack of an electron-transport layer and an electron-injection layer, and may include a stack of a hole-transport layer and a hole-injection layer. The common layer 114 and the common electrode 115 are shared by the light-emitting devices included in the subpixels.

In FIG. 1B, the layer 113c is formed to cover an end portion of the pixel electrode 111c. A mask layer 118c is positioned over the layer 113c included in the light-emitting device 130c. The mask layer 118c is a remaining part of a mask layer provided in contact with the top surface of the layer 113c at the time of processing the first layer 113c.

In FIG. 1B, one end portion of the mask layer 118c is aligned or substantially aligned with an end portion of the layer 113c, and the other end portion of the mask layer 118c is positioned over the layer 113c. Here, the other end portion of the mask layer 118c preferably overlaps with the layer 113c and the pixel electrode 111c.

A side surface of the layer 113c is covered with the insulating layer 125. The insulating layer 127 overlaps with the side surface of the layer 113c with the insulating layer 125 therebetween.

Part of the top surface of the layer 113c is covered with the mask layer 118c. The insulating layer 125 and the insulating layer 127 overlap with part of the top surface of the layer 113c with the mask layer 118c therebetween. Note that the top surface of the layer 113c is not limited to the top surface of a flat portion overlapping with the top surface of the pixel electrode, and can include the top surfaces of the inclined portion and the flat portion which are positioned on the outer side of the top surface of the pixel electrode.

The side surface and part of the top surface of the layer 113c are covered with at least one of the insulating layer 125, the insulating layer 127, and the mask layer 118c, so that the common layer 114 (or the common electrode 115) can be inhibited from being in contact with the side surfaces of the pixel electrode 111c and the layer 113c. Thus, a short circuit between an upper layer and a lower layer included in the light-emitting device can be inhibited.

The insulating layer 127 is provided over the insulating layer 125 so as to fill a depressed portion in which the insulating layer 125 is formed. The insulating layer 127 can overlap with at least the side surface and part of the top surface of the layer 113c with the insulating layer 125 therebetween. The insulating layer 127 preferably covers at least part of a side surface of the insulating layer 125.

The insulating layer 125 and the insulating layer 127 can fill a gap between adjacent island-shaped layers, whereby extreme unevenness of the formation surface of the layers (e.g., the carrier-injection layer and the common electrode) provided over the island-shaped layers can be reduced, and the formation surface can be made flatter. Consequently, the coverage of the carrier-injection layer, the common electrode, and the like can be increased.

The common layer 114 and the common electrode 115 are provided over the layer 113c, the mask layer 118c, the insulating layer 125, and the insulating layer 127. Before the insulating layer 125 and the insulating layer 127 are provided, a step difference is generated owing to a region where the pixel electrode and the island-shaped EL layer are provided and a region where neither the pixel electrode nor the island-shaped EL layer is provided (a region between the light-emitting devices).

In the display device according to one embodiment of the present invention, the step difference can be planarized by including the insulating layer 125 and the insulating layer 127, and coverage with the common layer 114 and the common electrode 115 can be improved. Consequently, it is possible to inhibit a connection defect due to step disconnection. Alternatively, an increase in electrical resistance caused by local thinning of the common electrode 115 due to step difference can be inhibited.

The top surface of the insulating layer 127 preferably has a shape with high flatness; however, it may include a projecting portion, a convex surface, a concave surface, or a depressed portion.

Figure 2A:
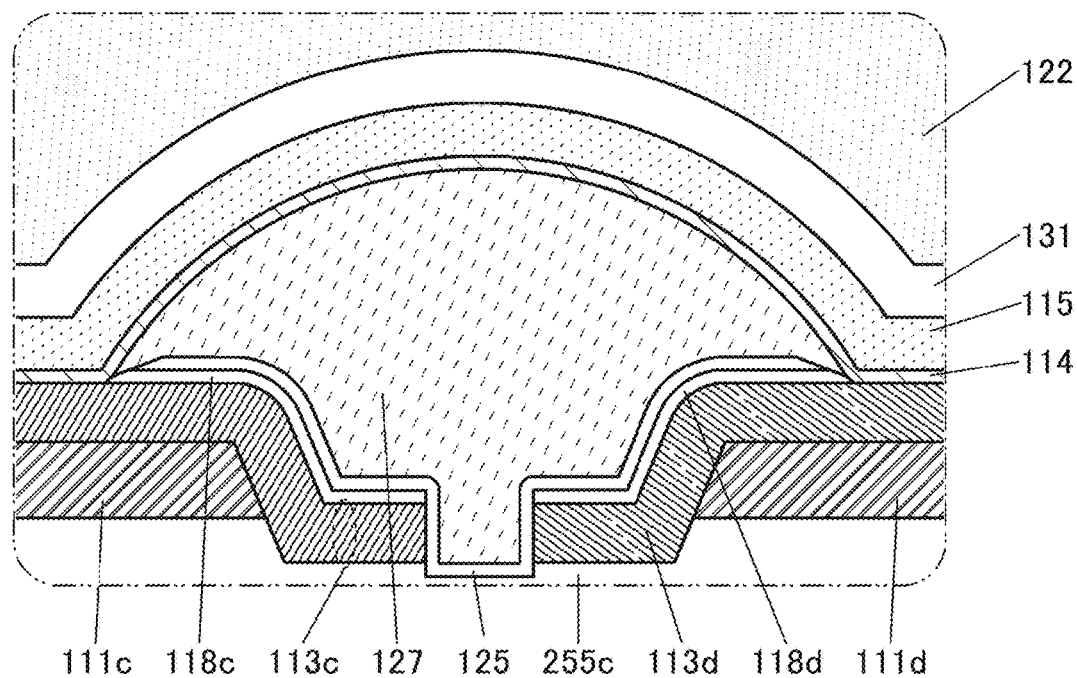
FIG. 2A and FIG. 2B are cross-sectional views illustrating components of a display device.
Figure 2B:
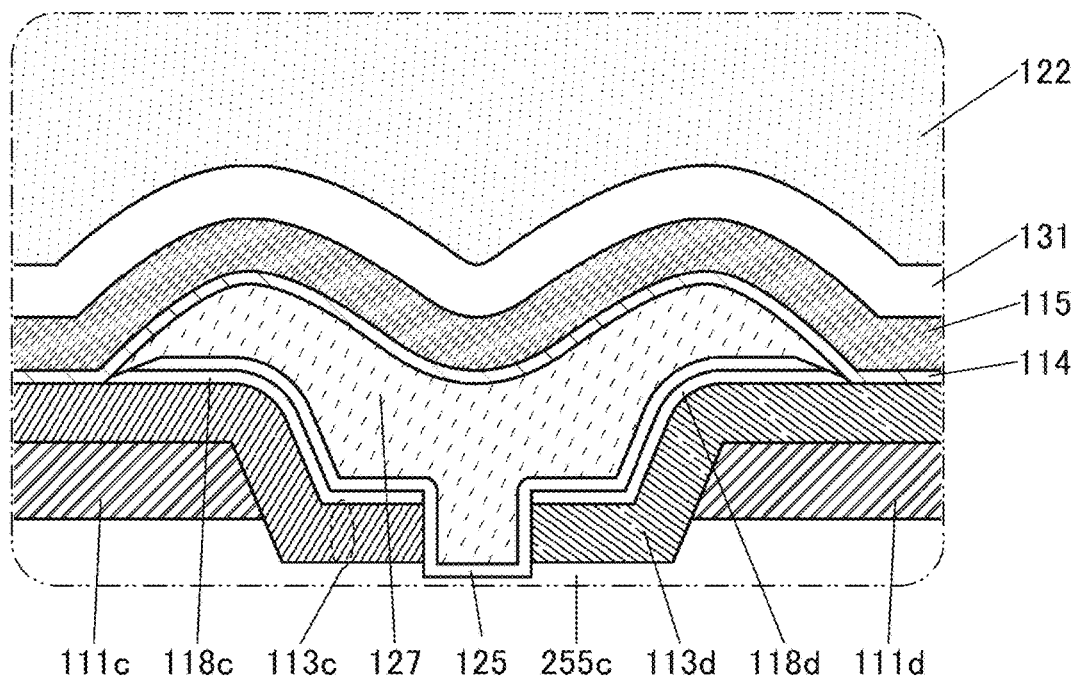

Although FIG. 1B illustrates an example in which the top surface of the insulating layer 127 includes a flat portion, the entire top surface of the insulating layer 127 may include a convex surface as illustrated in FIG. 2A. Alternatively, as illustrated in FIG. 2B, the top surface of the insulating layer 127 may include a concave surface. In FIG. 2B, the top surface of the insulating layer 127 has a shape that is gently bulged from an end portion toward the center, i.e., a convex surface, and has a shape that is depressed in the center and its vicinity, i.e., a concave surface, in the cross-sectional view. In FIG. 2B, the convex portion of the top surface of the insulating layer 127 is gently connected to the tapered portion of an end portion. Even when the insulating layer 127 has such a shape, the common layer 114 and the common electrode 115 can be formed with favorable coverage over the whole insulating layer 127.

With a structure including a concave surface in the center portion of the insulating layer 127 as illustrated in FIG. 2B, stress on the insulating layer 127 can be reduced. Specifically, with a structure including a concave surface in the center portion of the insulating layer 127, local stress generated at an end portion of the insulating layer 127 can be reduced, and one or more of film separation between the layer 113c and the mask layer 118c, film separation between the mask layer 118c and the insulating layer 125, and film separation between the insulating layer 125 and the insulating layer 127 can be inhibited.

As illustrated in FIG. 1B to FIG. 2B, the common layer 114 and the common electrode 115 can be formed with good coverage by providing the mask layer 118c, the insulating layer 125, and the insulating layer 127. It is also possible to prevent formation of a disconnected portion and a locally thinned portion in the common layer 114 and the common electrode 115.

This can inhibit the common layer 114 and the common electrode 115 between adjacent light-emitting devices from having connection defects due to the disconnected portion and an increased electric resistance due to the locally thinned portion. Accordingly, the display quality of the display device of one embodiment of the present invention can be improved.

Next, examples of materials of the insulating layer 125 and the insulating layer 127 are described.

The insulating layer 125 can be formed using an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium-gallium-zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, aluminum oxide is preferably used because it has high selectivity with respect to the EL layer in etching and has a function of protecting the EL layer when the insulating layer 127 described later is formed.

In particular, when an inorganic insulating film such as an aluminum oxide film, a hafnium oxide film, or a silicon oxide film that is formed by an atomic layer deposition (ALD) method is employed for the insulating layer 125, it is possible to form the insulating layer 125 that has few pinholes and an excellent function of protecting the EL layer. The insulating layer 125 may have a stacked-layer structure of a film formed by an ALD method and a film formed by a sputtering method. The insulating layer 125 may have a stacked-layer structure of an aluminum oxide film formed by an ALD method and a silicon nitride film formed by a sputtering method, for example.

The insulating layer 125 preferably has a function of a barrier insulating layer against at least one of water and oxygen. Alternatively, the insulating layer 125 preferably has a function of inhibiting diffusion of at least one of water and oxygen. Alternatively, the insulating layer 125 preferably has a function of capturing or fixing (also referred to as gettering) at least one of water and oxygen.

Note that in this specification and the like, a barrier insulating layer refers to an insulating layer having a barrier property. A barrier property in this specification and the like refers to a function of inhibiting diffusion of a particular substance (also referred to as having low permeability). Alternatively, a barrier property refers to a function of capturing or fixing (also referred to as gettering) a particular substance.

When the insulating layer 125 has a function of a barrier insulating layer or a gettering function, entry of impurities (typically, at least one of water and oxygen) that might diffuse into the light-emitting devices from the outside can be inhibited. With this structure, a highly reliable light-emitting device and a highly reliable display device can be provided.

Note that the insulating layer 125 and the mask layer 118c can be formed using the same material. In that case, the boundary between the mask layer 118c and the insulating layer 125 is unclear and thus the mask layer 118c and the insulating layer 125 are sometimes observed as one layer.

The insulating layer 127 provided over the insulating layer 125 has a function of filling extreme unevenness of the insulating layer 125 formed between the adjacent light-emitting devices.

As the insulating layer 127, an insulating layer containing an organic material can be suitably used. As the organic material, a photosensitive organic resin is preferably used; for example, a photosensitive resin composite containing an acrylic resin is used. Note that in this specification and the like, an acrylic resin refers to not only a polymethacrylic acid ester or a methacrylic resin, but also all the acrylic polymer in a broad sense in some cases.

For the insulating layer 127, an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like may be used, for example. Examples of organic materials used for the insulating layer 127 include polyvinyl alcohol (PVA), polyvinyl butyral, polyvinyl pyrrolidone, polyethylene glycol, polyglycerin, pullulan, water-soluble cellulose, and an alcohol-soluble polyamide resin. A photoresist may be used as the photosensitive resin. As the photosensitive organic resin, either a positive material or a negative material may be used.

The insulating layer 127 may be formed using a material absorbing visible light. When the insulating layer 127 absorbs light from the light-emitting device, leakage of light (stray light) from the light-emitting device to the adjacent light-emitting device or light-receiving device through the insulating layer 127 can be inhibited. Thus, the display quality and the image capturing performance of the display device can be improved. Since the display quality of the display device can be improved without using a polarizing plate in the display device, the weight and thickness of the display device can be reduced.

Examples of the material absorbing visible light include a material containing a pigment of black or the like, a material containing a dye, a resin material with a light-absorbing property (e.g., polyimide), and a resin material that can be used for a color filter (a color filter material). Using a resin material obtained by stacking or mixing color filter materials of two or three or more colors is particularly preferable to enhance the effect of blocking visible light. In particular, mixing color filter materials of three or more colors makes it possible to form a black or nearly black resin layer.

Next, the light-receiving device 150 will be described. Note that description of components that are the same as the components of the light-emitting device 130c and components for the same purpose as that of the components of the light-emitting device 130c are omitted.

A pn or pin photodiode can be used as the light-receiving device. The light-receiving device functions as a photoelectric conversion device (also referred to as a photoelectric conversion element) that detects light entering the light-receiving device and generates electric charge. The amount of electric charge generated from the light-receiving device depends on the amount of light entering the light-receiving device.

The light-receiving device can detect one or both of visible light and infrared light. When infrared light is detected, an object can be detected even in a dark place.

It is preferable to use an organic photodiode including a layer containing an organic compound, as the light-receiving device. An organic photodiode is easily made thin, light-weight, and large in area and has a high degree of freedom for shape and design, and thus can be employed in a variety of display devices.

In one embodiment of the present invention, an organic EL device is used as the light-emitting device, and an organic photodiode is used as the light-receiving device. The organic EL device and the organic photodiode can be formed over the same substrate. Thus, the organic photodiode can be incorporated in the display device using the organic EL device.

When the light-receiving device is driven by application of reverse bias between the pixel electrode and the common electrode, light entering the light-receiving device can be detected and electric charge can be generated and extracted as current.

A fabrication method similar to that of the light-emitting device can be employed for the light-receiving device. An island-shaped active layer (also referred to as a photoelectric conversion layer) included in the light-receiving device is formed by processing a film that is to be the active layer and formed over a surface, not by using a fine metal mask; thus, the island-shaped active layer can be formed to have a uniform thickness. In addition, a mask layer provided over the active layer can reduce damage to the active layer in the fabrication process of the display device, increasing the reliability of the light-receiving device.

The light-receiving device 150 includes a pixel electrode 111d over the insulating layer 255c, a layer 113d over the pixel electrode 111d, the common layer 114 over the layer 113d, and the common electrode 115 over the common layer 114.

Here, the layer 113d includes at least an active layer, preferably includes a plurality of functional layers. Examples of the functional layer include carrier-transport layers (a hole-transport layer and an electron-transport layer) and carrier-blocking layers (a hole-blocking layer and an electron-blocking layer). One or more layers are preferably included over the active layer. A layer between the active layer and the mask layer can inhibit the active layer from being exposed on the outermost surface during the fabrication process of the display device and can reduce damage to the active layer. Thus, the reliability of the light-receiving device 150 can be increased. Thus, the layer 113d preferably includes an active layer and a carrier-blocking layer (a hole-blocking layer or an electron-blocking layer) or a carrier-transport layer (an electron-transport layer or a hole-transport layer) over the active layer.

The layer 113d is provided in the light-receiving device 150, and not provided in the light-emitting device 130c. Note that the functional layer other than the active layer included in the layer 113d may include the same material as the functional layer other than the light-emitting layer included in the layer 113c. Meanwhile, the common layer 114 is a continuous layer shared by the light-receiving device 150 and the light-emitting device 130c.

Here, a layer used in common to the light-receiving device and the light-emitting device might have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer used in common to the light-receiving device and the light-emitting device may have the same function in both the light-emitting device and the light-receiving device. For example, the hole-transport layer functions as a hole-transport layer in both the light-emitting device and the light-receiving device, and the electron-transport layer functions as an electron-transport layer in both the light-emitting device and the light-receiving device.

The structure and the material of the light-receiving device are described in detail in another embodiment.

The mask layer 118c is positioned between the layer 113c and the insulating layer 125, and the mask layer 118d is positioned between the layer 113d and the insulating layer 125. The mask layer 118c is a remaining portion of the mask layer provided over the layer 113c when the layer 113c is processed. The mask layer 118d is a remaining portion of a mask layer provided in contact with the top surface of the layer 113d at the time of processing the layer 113d, which is a layer including the active layer. The mask layer 118c and the mask layer 118d may contain the same material or different materials.

The subpixel 110d may have a higher aperture ratio than at least one of the subpixels 110a, 110b, and 110c. The wide light-receiving area of the subpixel 110d can make it easy to detect an object in some cases. For example, in some cases, the aperture ratio of the subpixel 110d is higher than that of the other subpixels depending on the resolution of the display device, the circuit structure of the subpixel, and the like.

The subpixel 110d may have a lower aperture ratio than at least one of the subpixels 110a, 110b, and 110c. The low aperture ratio of the subpixel 110d can enhance a pinhole effect and a clearer image can be obtained.

As described above, the detection wavelength, resolution, and aperture ratio of the subpixel 110d are preferably changed depending on the usage.

The protective layer 131 provided over the light-emitting device 130c and the light-receiving device 150 may have a single-layer structure or a stacked-layer structure of two or more layers. Providing the protective layer 131 can enhance the reliability of the light-emitting device 130c and the light-receiving device 150.

There is no limitation on the conductivity of the protective layer 131. As the protective layer 131, at least one type of an insulating film, a semiconductor film, and a conductive film can be used.

The protective layer 131 including an inorganic film can inhibit deterioration of the light-emitting device and the light-receiving device by preventing oxidation of the common electrode 115 and inhibiting entry of impurities (e.g., moisture and oxygen) into the light-emitting device and the light-receiving device, for example; thus, the reliability of the display device can be improved.

As the protective layer 131, an inorganic insulating film such as an oxide insulating film, a nitride insulating film, an oxynitride insulating film, or a nitride oxide insulating film can be used, for example. Specific examples of these inorganic insulating films are as listed in the description of the insulating layer 125. In particular, the protective layer 131 preferably includes a nitride insulating film or a nitride oxide insulating film, and further preferably includes a nitride insulating film.

As the protective layer 131, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

The protective layer 131 preferably has a high visible-light-transmitting property. For example, ITO, IGZO, and aluminum oxide are preferable because they are each an inorganic material having a high visible-light-transmitting property.

The protective layer 131 can employ, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (such as water and oxygen) to the EL layer side.

Furthermore, the protective layer 131 may include an organic film. For example, the protective layer 131 may include both an organic film and an inorganic film. Examples of an organic material that can be used for the protective layer 131 include organic insulating materials that can be used for the insulating layer 127.

The protective layer 131 may have a stacked-layer structure of two layers which are formed by different deposition methods. Specifically, the first layer of the protective layer 131 may be formed by an ALD method, and the second layer of the protective layer 131 may be formed by a sputtering method.

Over the protective layer 131, the lens 133 and the light-blocking layer 135 provided on the substrate 120 are bonded to each other with the adhesive layer 122. Here, the lens 133 is provided for each subpixel, and the light-emitting device 130c and the light-receiving device 150 each include a region overlapping with the lens 133. The light-blocking layer 135 is provided between adjacent lenses 133. The light-blocking layer 135 includes a region overlapping with the insulating layer 127.

The lens 133 can be formed using a material similar to that for the insulating layer 127. The light-blocking layer 135 can be formed using a metal material, a resin material containing a material absorbing visible light, or the like.

A width (L2) of the lens 133 provided over the light-receiving device 150 is preferably larger than a width (L1) of a light-receiving portion of the light-receiving device 150. With this structure, light incident on a region (an opening portion) that is wider than the light-receiving portion can be condensed and incident on the light-receiving portion, so that the light sensitivity can be increased. Note that the light-receiving portion is a region where the layer 113d and the common layer 114 are in contact with each other. In the case where the common layer 114 is not provided, the light-receiving portion is a region where the layer 113d and the common electrode 115 are in contact with each other.

Here, the width of each of the lens and the light-receiving portion corresponds to any of the diameter of the inscribed circle, the diameter of the circumscribed circle, the diameter, the length between opposite sides, or the length between opposite corners (in the case where the corner is rounded, the length corresponds to the length between opposite corners) of the shape in a top view. Note that the definition of the width is also applied to a pinhole (an opening portion) described later. Specific examples of the width of the lens will be described later with reference to FIG. 5A, FIG. 6A, and FIG. 6B.

Next, a lens provided over the light-receiving device 150 is described with reference to the cross-sectional views in FIG. 3A to FIG. 5B. Note that the lens and the light-receiving device 150 are separately provided so that the centers of the lens and the light-receiving device 150 overlap with each other.

In the case where an image of an object being in contact with the surface of the substrate 120 is captured, a component for forming the image of the object on the light-receiving device is preferably provided. Although a lens is generally considered as the component, it is difficult to ensure a sufficient region for providing a lens between the surface of the substrate 120 and the light-receiving device. Thus, providing a lens for collecting the rays of light to form an image is difficult.

Accordingly, a structure is preferably employed in which a pinhole is formed over the light-receiving device to cut the rays of light and then form an image. In one embodiment of the present invention, the pinhole is formed by providing an opening portion in the light-blocking layer 135.

The pinhole is provided to cut the rays of light; meanwhile, it is a cause of a reduction in light sensitivity due to deficiency in a light amount. To improve the light sensitivity, it is preferable to make the pinhole as large as possible in a design range and make light entering the pinhole efficiently enter the light-receiving portion.

Figure 3A:
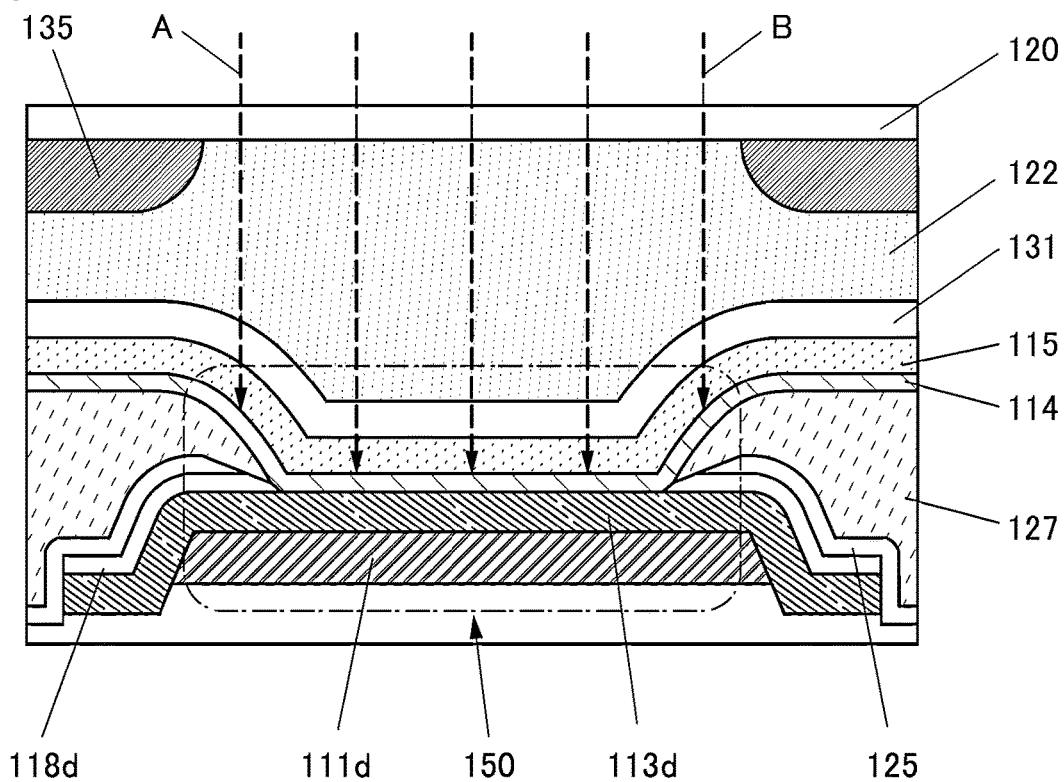
FIG. 3A and FIG. 3B are cross-sectional views illustrating components of a display device.

FIG. 3A is a comparative example in which a lens is not provided, and is a simple diagram illustrating rays of light entering the light-receiving device. Note that minute reflection and the like in the boundary between layers are not illustrated.

Most light incident from the oblique direction with respect to the substrate 120 is blocked by the light-blocking layer 135. Thus, most light incident on the light-receiving device 150 are rays of light going straight or rays of light going substantially straight. However, in the case where the width of the pinhole (the opening portion) is larger than the width of the light-receiving portion, some light is not incident on the light-receiving portion in some cases as illustrated by rays of light A and B in FIG. 3A.

Figure 3B:
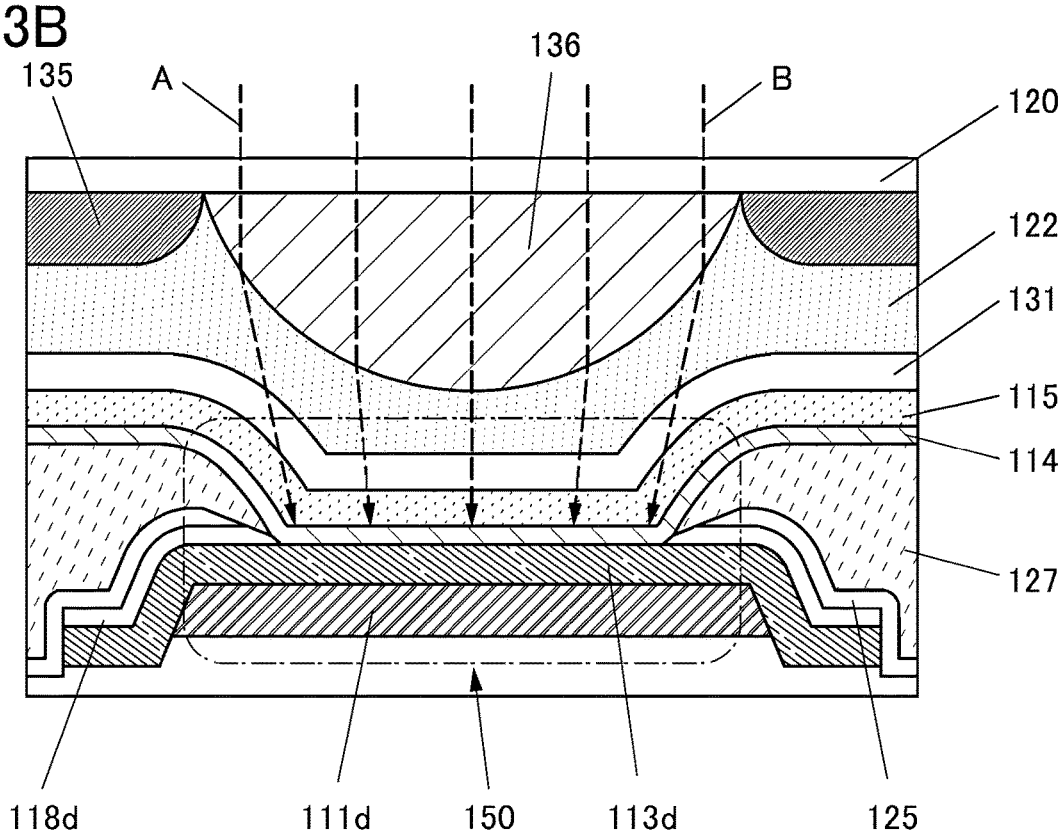

Accordingly, as illustrated in FIG. 3B, a lens 136 is preferably provided in the pinhole (the opening portion), in which case rays of light A and B are refracted and incident on the light-receiving portion. However, a hemispherical lens or a lens close to the hemisphere (hereinafter simply referred to as a hemispherical lens) requires the height of approximately half of the width of the subpixel; thus, there is a limitation on the applicable size of the subpixel.

The distance between the protective layer 131 and the substrate 120 (the thickness of the adhesive layer 122) is about several micrometers regardless of the size of the display device. Thus, the width of the subpixel in which a hemispherical lens can be used without much difficulty is approximately twice the thickness of the adhesive layer 122 at a maximum (less than or equal to ten-odd micrometers). That is, applying a hemispherical lens to a display device including subpixels having larger width is difficult. Although the lens can be formed by application of a photosensitive resin or the like, it is also difficult to apply the photosensitive resin to a thickness of ten-odd micrometers or more. For example, in a display device with a larger size than that of a smartphone, the width of the subpixel is greater than or equal to ten-odd micrometers even with high resolution, and thus using a hemispherical lens therein is difficult.

Figure 4A:
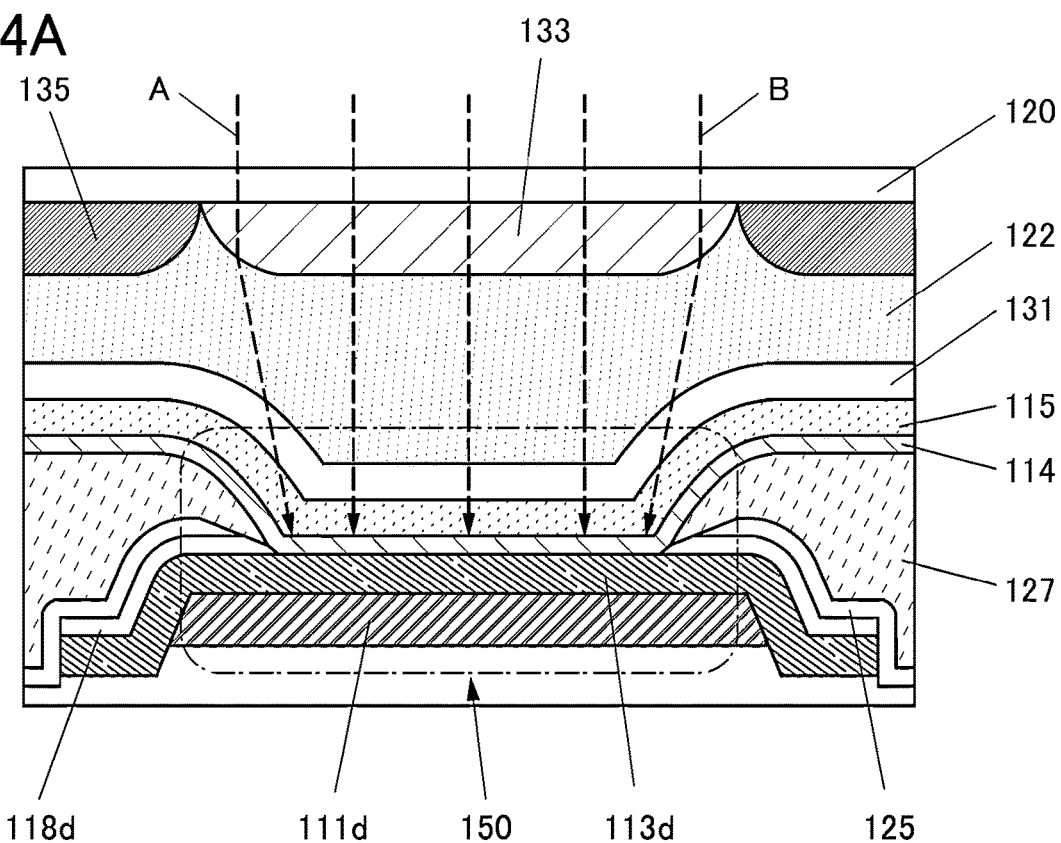
FIG. 4A and FIG. 4B are cross-sectional views illustrating components of a display device.

Thus, in one embodiment of the present invention, the substantially trapezoidal lens 133 illustrated in FIG. 4A is used. Here, the substantially trapezoidal lens is a lens in which the cross section in the thickness direction including the center of the lens has a substantially trapezoidal shape or the cross section including the central axis (the optical axis) of the lens has a substantially trapezoidal shape. In addition, the substantially trapezoidal lens includes a convex surface in a surface including a portion corresponding to a leg of the trapezoid or includes a convex surface from a surface including a portion corresponding to the leg to a surface including a portion corresponding to the upper base. Furthermore, in the substantially trapezoidal lens, a surface including a portion corresponding to the upper base of the trapezoid and a surface including a portion corresponding to the lower base of the trapezoid each include a flat surface. Furthermore, these two surfaces may parallel to each other.

Alternatively, the substantially trapezoidal lens can be referred to as a lens having a substantially frustum shape and having the lower base surface, the upper base surface, and a lateral surface, in which the lateral surface has a convex surface or the lateral surface to the upper base surface has a convex surface.

That is, the substantially trapezoidal lens functions as a convex lens in a region in the vicinity of an end portion of the lens 133 and refracts light going straight and entering the region so as to change the traveling direction. Furthermore, light going straight and entering the other region (a planar portion) of the lens 133 goes straight without changing its traveling direction.

Thus, as in the hemispherical lens 136 illustrated in FIG. 3B, rays of light A and B can be refracted to be incident on the light-receiving portion also in the lens 133. Light going straight and incident on the center and the vicinity thereof of the lens 133 can go straight and enter the light-receiving portion.

Accordingly, an effect similar to that of the hemispherical lens 136 can be obtained also in the substantially trapezoidal lens 133. Since the substantially trapezoidal lens can have small height and can be thin, the substantially trapezoidal lens can be applied to a subpixel having width of ten-odd micrometers or more to which the hemispherical lens is difficult to apply. Note that the substantially trapezoidal lens 133 can also be referred to as a kind of a plano-convex lens.

Figure 5A:
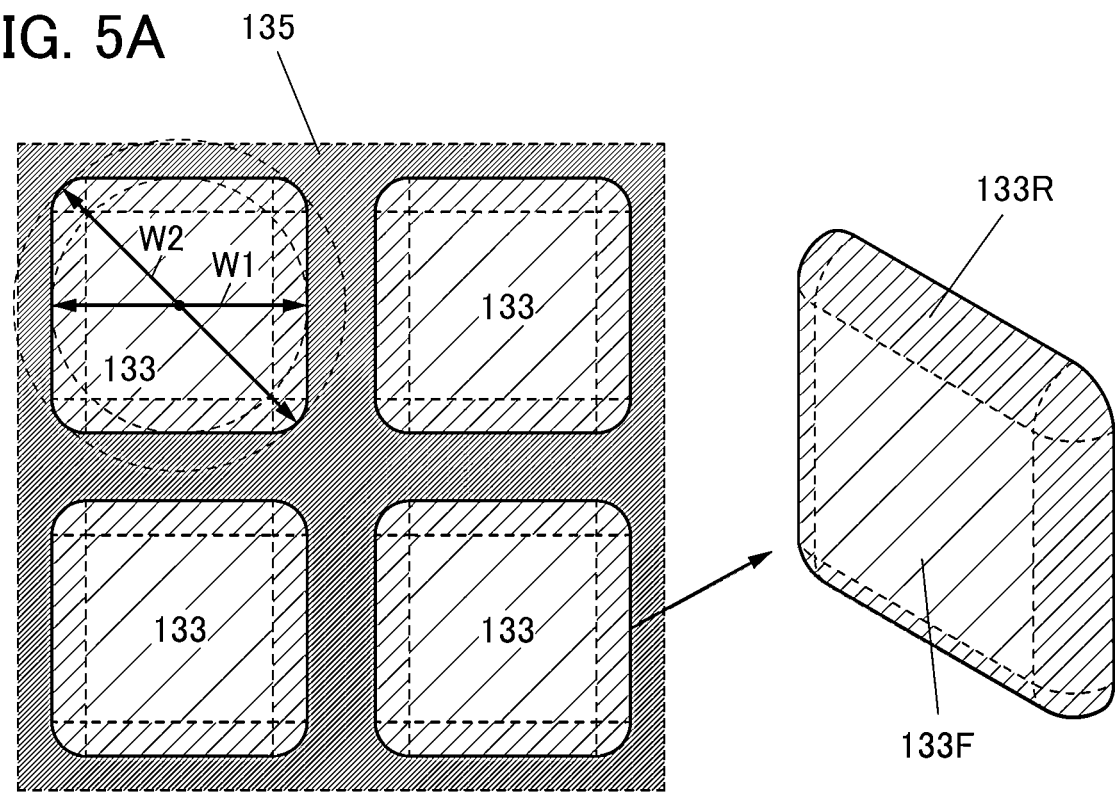
FIG. 5A is a top view and a perspective view illustrating components of a display device.

FIG. 5A exemplifies a plan view and a perspective view of the lens 133. FIG. 5A illustrates a lens shape corresponding to the pixel arrangement illustrated in FIG. 1A and having a substantially quadrangular shape in a top view. Here, the width of the lens can be defined as the diameter W1 of the inscribed circle, or the diameter W2 of the circumscribed circle illustrated in FIG. 5A. Furthermore, the lens 133 includes a convex surface region 133R in the vicinity of the end portion and a planar region 133F in the center and the vicinity thereof. As described above, the convex surface region 133R functions as a lens.

FIG. 6A is a plan view and a perspective view illustrating an example of a lens having a circular shape in a top view. In the case where a lens has a circular shape in a top view, the diameter W1 of the circle can be defined as the width of the lens.

FIG. 6B is a plan view and a perspective view illustrating an example of a lens which can be used in a delta arrangement and has a substantially hexagonal shape in a top view. In the case where a lens has a substantially hexagonal shape in a top view, the length (W1, W2) between opposite sides or the length (W3, W4) corresponding to the length between opposite corners can be defined as the width of the lens.

Figure 5B:
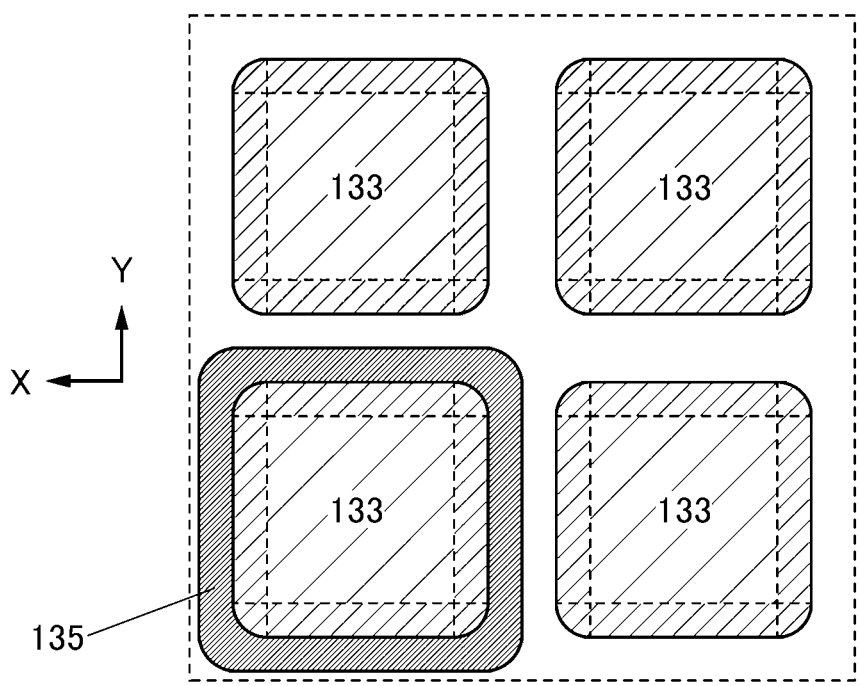
FIG. 5B is a top view illustrating components of a display device.

Although FIG. 5A illustrates an example in which the light-blocking layer 135 is provided around the lenses provided in all the subpixels, the light-blocking layer 135 may be provided around only some of the subpixels. For example, as illustrated in FIG. 5B, the light-blocking layer 135 can be provided around only a subpixel including a light-receiving device (corresponding to the subpixel 110d in FIG. 1). Note that the structure illustrated in FIG. 5B can also be employed for those in FIG. 6A and FIG. 6B.

Although a region corresponding to the upper base surface of the trapezoid is illustrated as a plane in FIG. 4A, a slightly convex surface may be included.

Figure 4B:
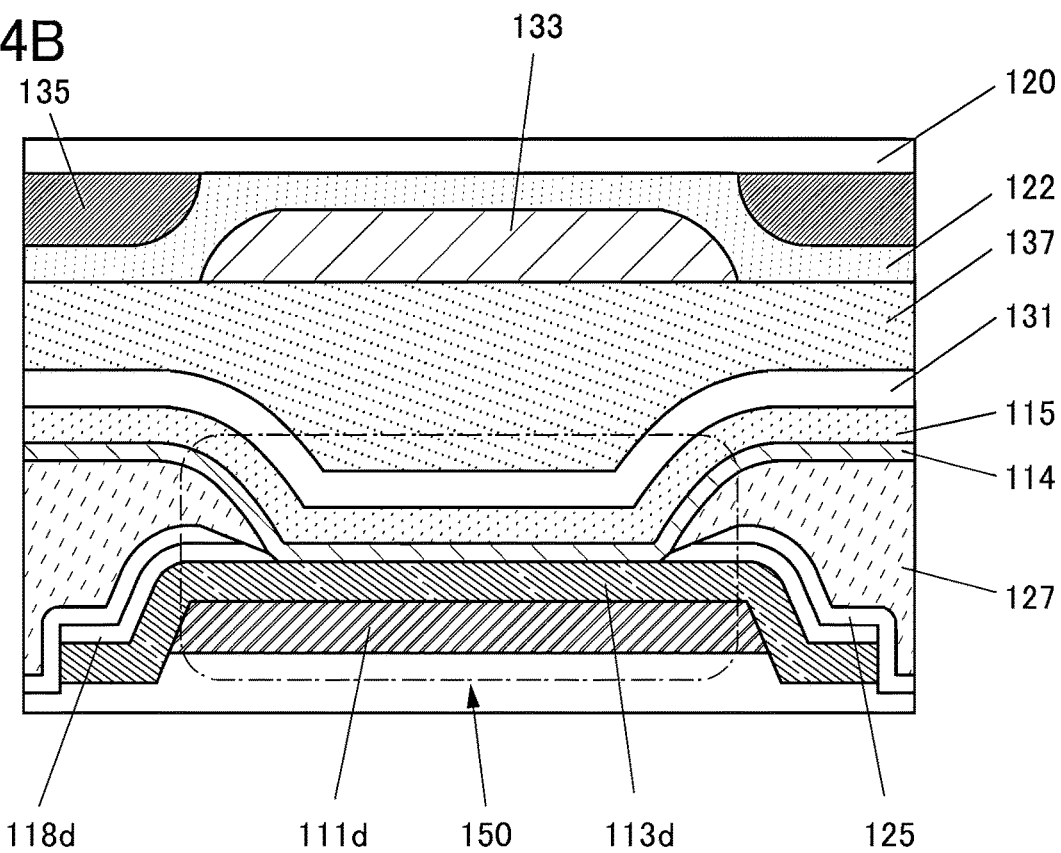

Although an example in which the upper base surface of the lens 133 is formed to face the light-receiving device is illustrated in FIG. 4A, the lower base surface of the lens 133 may be formed to face the light-receiving device as illustrated in FIG. 4B. In that case, a planarization film 137 is formed over the protective layer 131, and the lens 133 is formed over the planarization film 137. Then, the substrate 120 where the light-blocking layer 135 is formed is bonded to the lens 133 over the planarization film 137 with the adhesive layer 122.

Figure 7A:
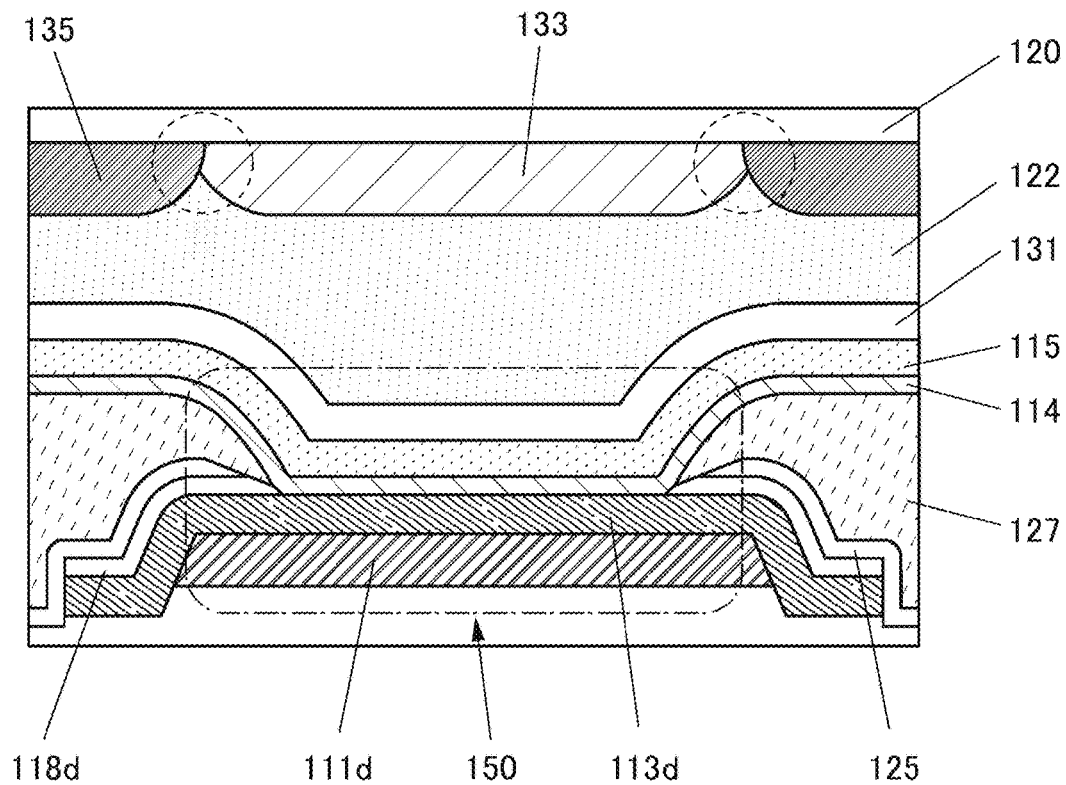
FIG. 7A and FIG. 7B are cross-sectional views illustrating components of a display device.
Figure 7B:
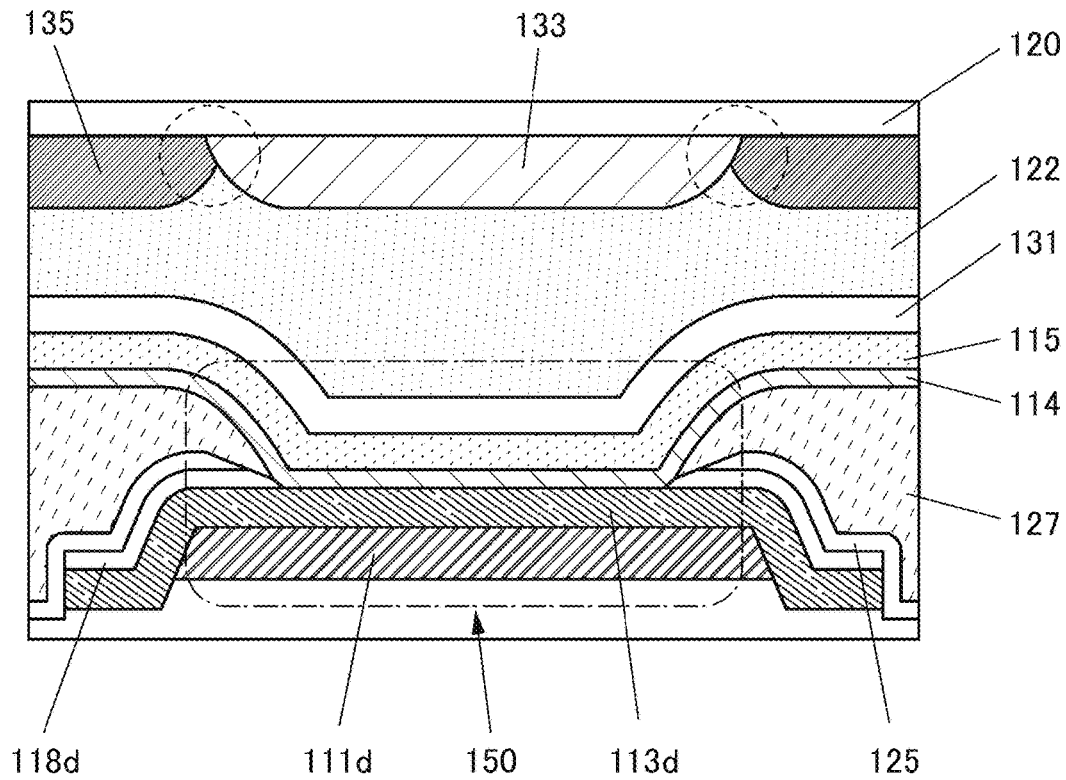

Although the light-blocking layer 135 and the lens 133 do not overlap with each other in FIG. 4A, a region where the lens 133 overlaps an end portion of the light-blocking layer may be included as illustrated in dashed circles in FIG. 7A. Alternatively, a region where the light-blocking layer 135 overlaps the end portion of the lens 133 may be included as illustrated in dashed circles in FIG. 7B.

It is found in an optical simulation that better amount of light is received by the light-receiving portion in the case where the substantially trapezoidal lens 133 is used than in the case where the hemispherical lens 136 is used.

Figure 8A:
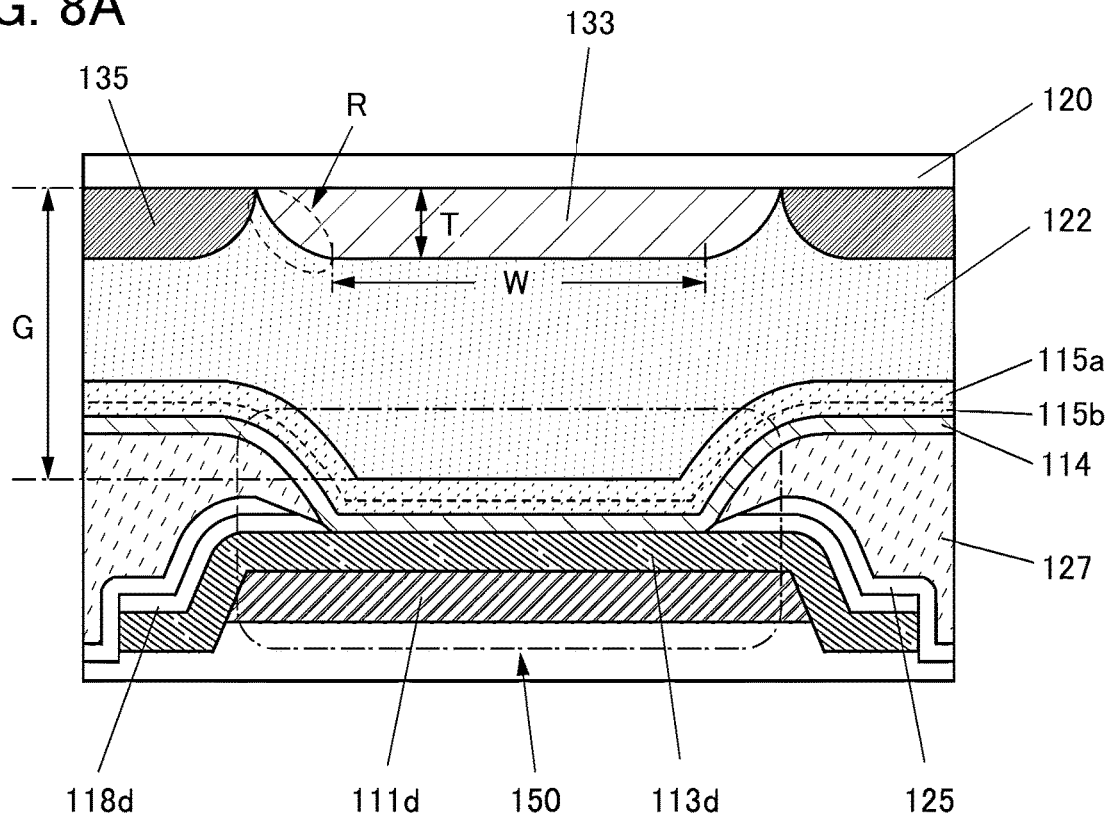
FIG. 8A to FIG. 8E are diagrams illustrating simulation models.

FIG. 8A illustrates a typical structure of a light-receiving device and peripheral components used for the simulation. Note that in the models of this simulation, the protective layer 131 is omitted. The common electrode has two layers of a light-transmitting conductive film 115a and a semi-reflective electrode 115b. A thickness T of the lens is 2 μm, a width W of the vicinity of the center of the lens (the planar region 133F in FIG. 5A) is 10 μm, a radius of curvature R of the vicinity of an end portion of the lens (corresponding to the convex surface region 133R in FIG. 5A) is 4 μm, and a cell gap G (a distance from the light-transmitting conductive film 115a to the substrate 120) is 10 μm. The light source is placed over the top surface of the substrate 120 (300 μm thick). Table 1 shows the material, the refractive index, the reflectance, and the absorptance of other components used for the simulation.

TABLE 1

|  | Material | Refractive index n (Wavelength 550 nm) | Reflectance (Wavelength 550 nm) | Absorptance (Wavelength 550 nm) |
| --- | --- | --- | --- | --- |
| Substrate 120 | Glass | 1.52 | — | — |
| Lens 133, 136 | Organic resin | 1.56 | — | — |
| Adhesive layer 122 | Organic resin | 1.4 | — | — |
| Light-transmitting conductive film 155a | Inorganic film | 2.14 | — | — |
| Layer 113d | Organic film | 1.6 | — | — |
| Insulating layer 127 | Inorganic film | 1.6 | — | — |
| Insulating layer 125 | Inorganic film | 1.63 | — | — |
| Semi-reflective electrode 155b | Metal film | — | 47.50% | — |
| Pixel electrode 111d | Metal film | — | 80% | — |
| Light-blocking layer 135 | Organic resin | — | — | 100% |

The models used for the simulation is a structure including a planar region in the lens 133 illustrated in FIG. 8A, a structure without a lens illustrated in FIG. 3A, a structure including the hemispherical lens 136 illustrated in FIG. 3B, and structures in each of which a convex surface is added to a planar region of the lens 133 illustrated in FIG. 8B to FIG. 8E. In FIG. 8B to FIG. 8E, the heights of the convex surfaces each added to the planar region of the lens 133 are 0.5 µm, 1 µm, 2 µm, and 3 µm. The ratios of the heights of the convex surfaces to the width of the reference plane region (hereinafter, aspect ratios) are 5%, 10%, 20%, and 30%.

Figure 9:
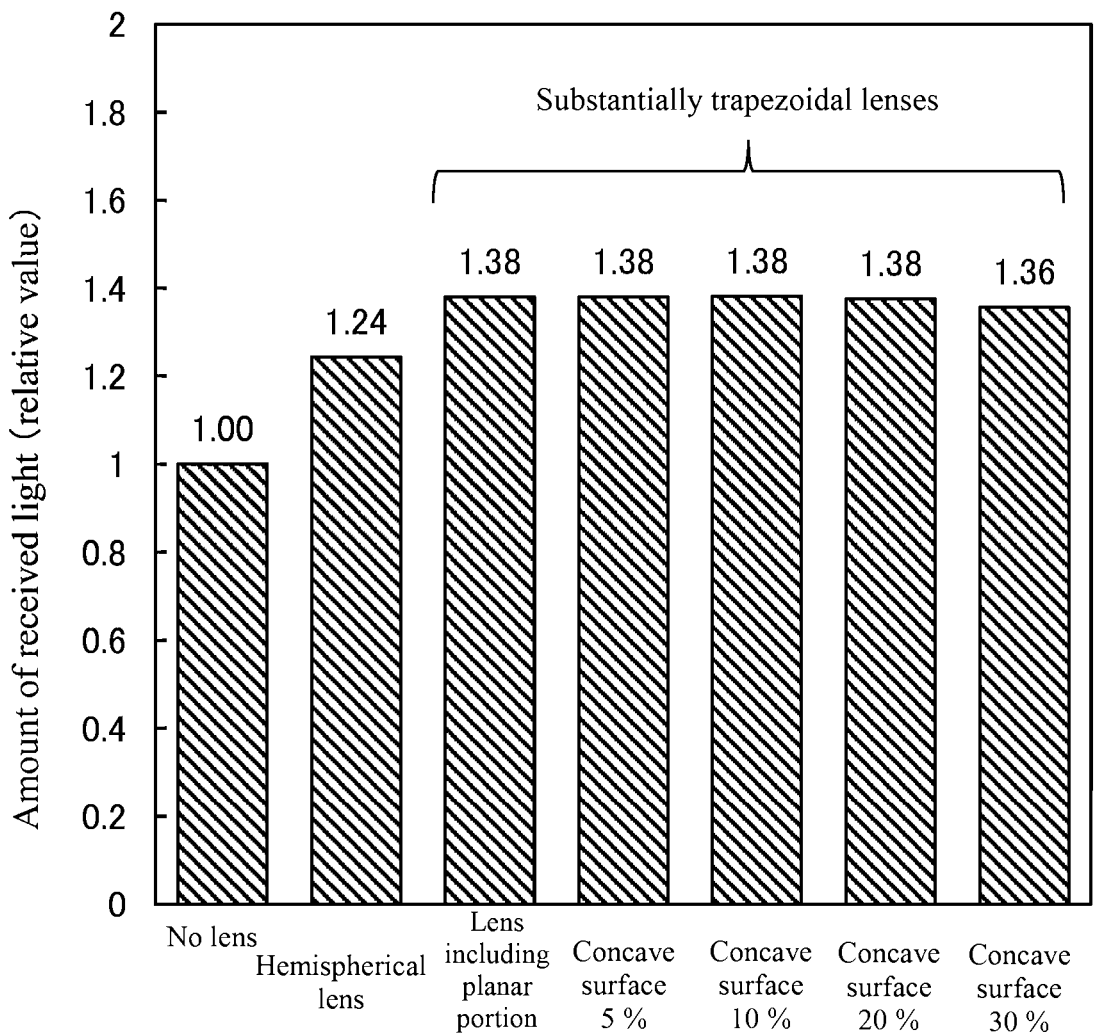
FIG. 9 is a diagram showing simulation results.

FIG. 9 shows simulation results of the amount of light received by the light-receiving portion where these models are used and show respective amounts of received light by relative values with the case without a lens taken as 1. Note that Lighting Simulator CAD produced by BESTMEDIA is used as simulation software.

The simulation results show that the amount of light received by the light-emitting device in which a substantially trapezoidal lens 133 is used is the largest. Note that in the case of the substantially trapezoidal lens, the amount of light received by the structure including a planar region (FIG. 5A) and the amounts of light received by the structures in which the aspect ratios are 5% to 20% (FIG. 8B to FIG. 8D) are substantially the same and the amount of received light tends to decrease in the structure in which the aspect ratio is 30% or more.

Figure 8B:
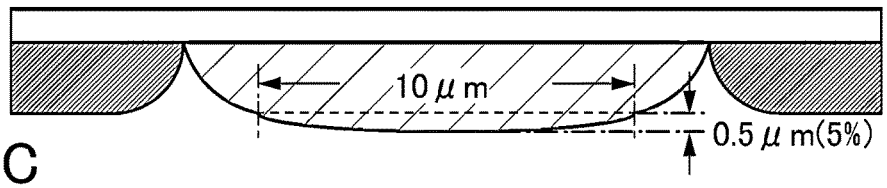
Figure 8C:
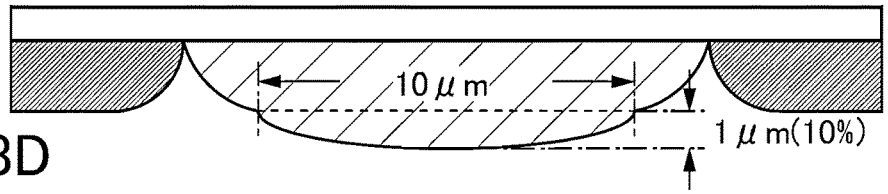
Figure 8D:
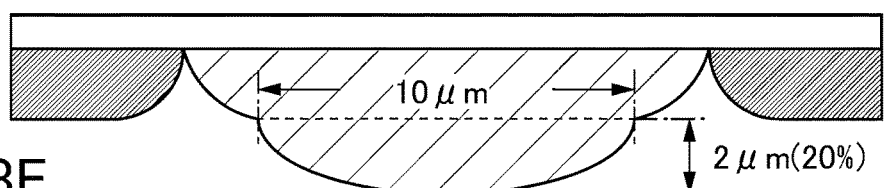
Figure 8E:
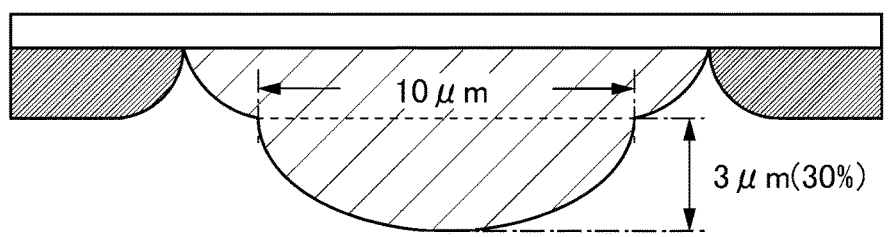
Figure 10A:
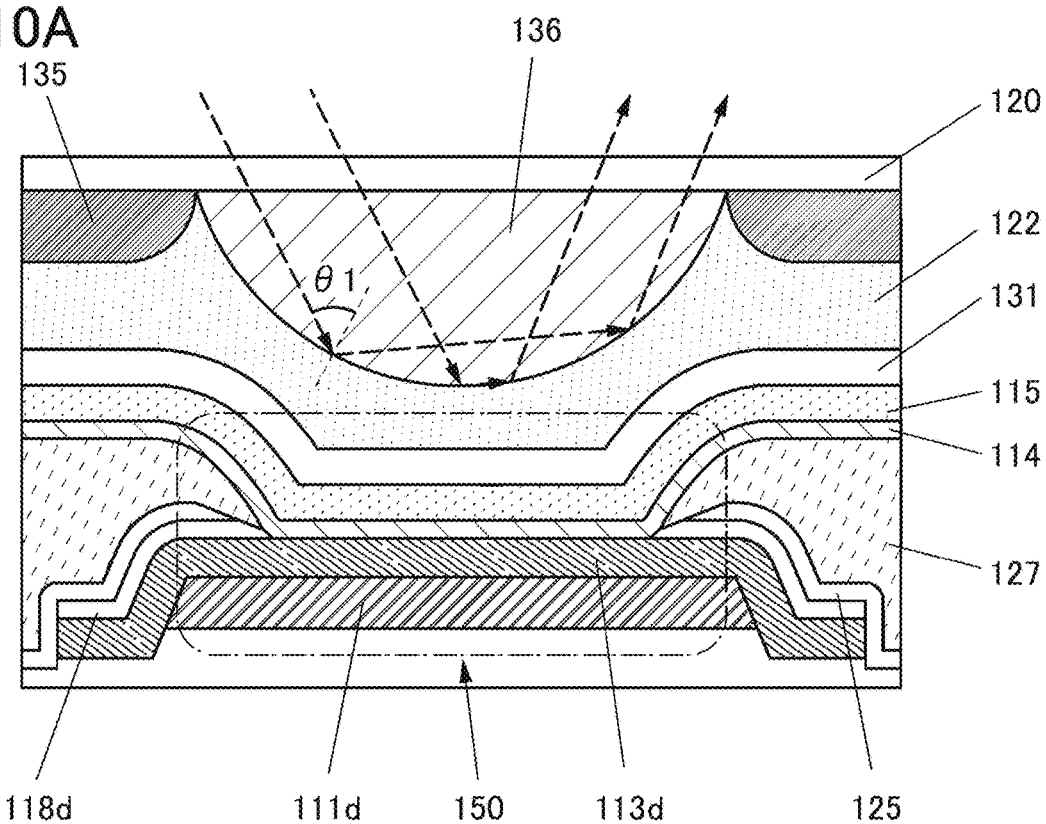
FIG. 10A and FIG. 10B are cross-sectional views illustrating components of a display device.

This is because the interface between the hemispherical lens 136 and the adhesive layer 122 is spherical as illustrated in FIG. 10A, so that incident angles θ1 of part of light incident on the lens 136 with respect to the interface are relatively large. Light having a large incident angle with respect to the interface is totally reflected repeatedly and travels in a direction different from that toward the light-receiving portion. In the case where the lens of which the aspect ratio is 30% is used as illustrated in FIG. 8E, for example, it is considered that the same phenomenon is likely to occur.

Figure 10B:
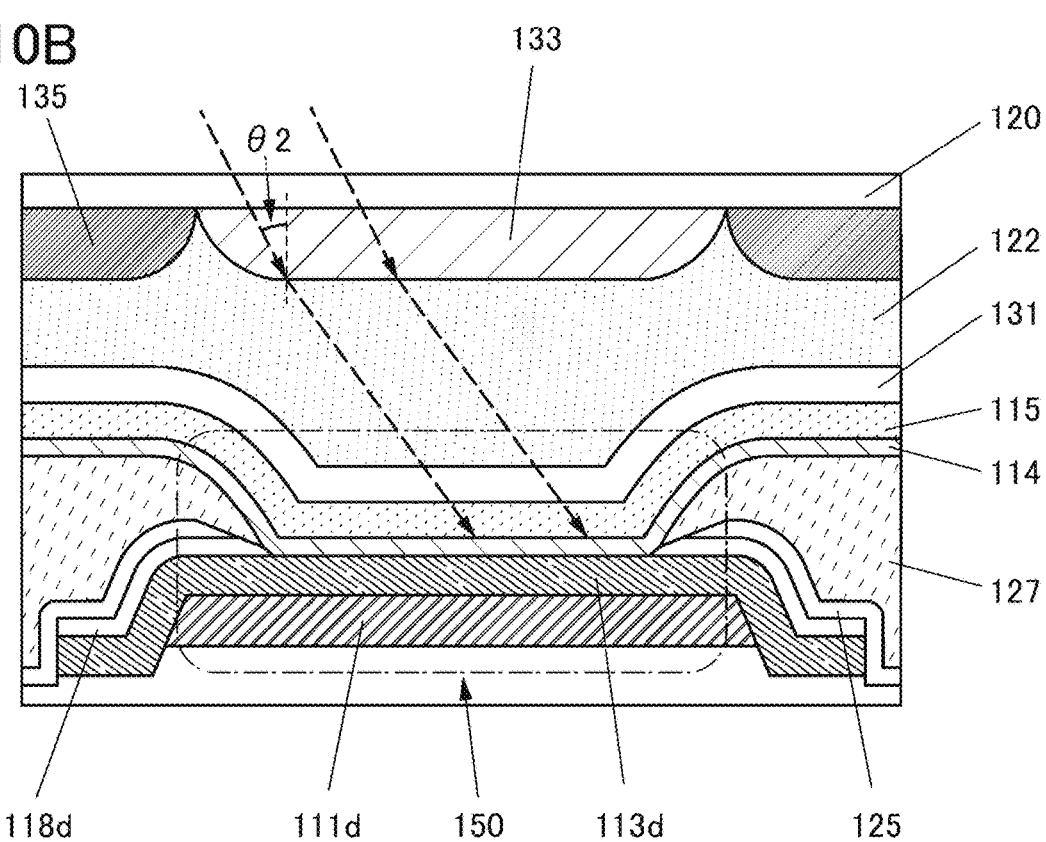

On the other hand, in the trapezoidal lens 133, much part of the interface between the lens 136 and the adhesive layer 122 is plane as illustrated in FIG. 10B. Thus, incident angles θ2 of most of light entering the lens 133 with respect to the interface are not large. Thus, light travels toward the light-receiving portion without being totally reflected. Also in the case where the lenses included in the structures in which the aspect ratios are 5% to 20% are used as illustrated in FIG. 8B to FIG. 8D, for example, it is considered that the incident angles θ2 is less likely to be large.

Thus, the amount of light received by the light-receiving portion is larger when the substantially trapezoidal lens 133 is used than when the hemispherical lens 136 is used. It can be said that using the substantially trapezoidal lens is effective regardless of the size of the subpixel. In addition, since an excellent amount of light can be received even with the lens having an aspect ratio of up to approximately 20%, it can be said that the substantially trapezoidal lens has an excellent effect in improving the amount of received light even in the case where the planar portion is incompletely formed and has a slightly convex surface.

The substantially trapezoidal lens 133 has an effect of improving the light extraction efficiency when provided over the light-emitting device 130c. Note that the lens 133 and the light-emitting device 130c are separately provided so that the centers overlap with each other.

A width of the lens 133 provided over the light-emitting device 130c is preferably larger than a width of a light-emitting portion of the light-emitting device 130c. Note that the light-emitting portion is a region where the layer 113c and the common layer 114 are in contact with each other. In the case where the common layer 114 is not provided, the light-emitting portion is a region where the layer 113c and the common electrode 115 are in contact with each other.

Here, the width of the lens is similar to the widths of the lenses illustrated in FIG. 5A, FIG. 6A, and FIG. 6B.

Figure 11A:
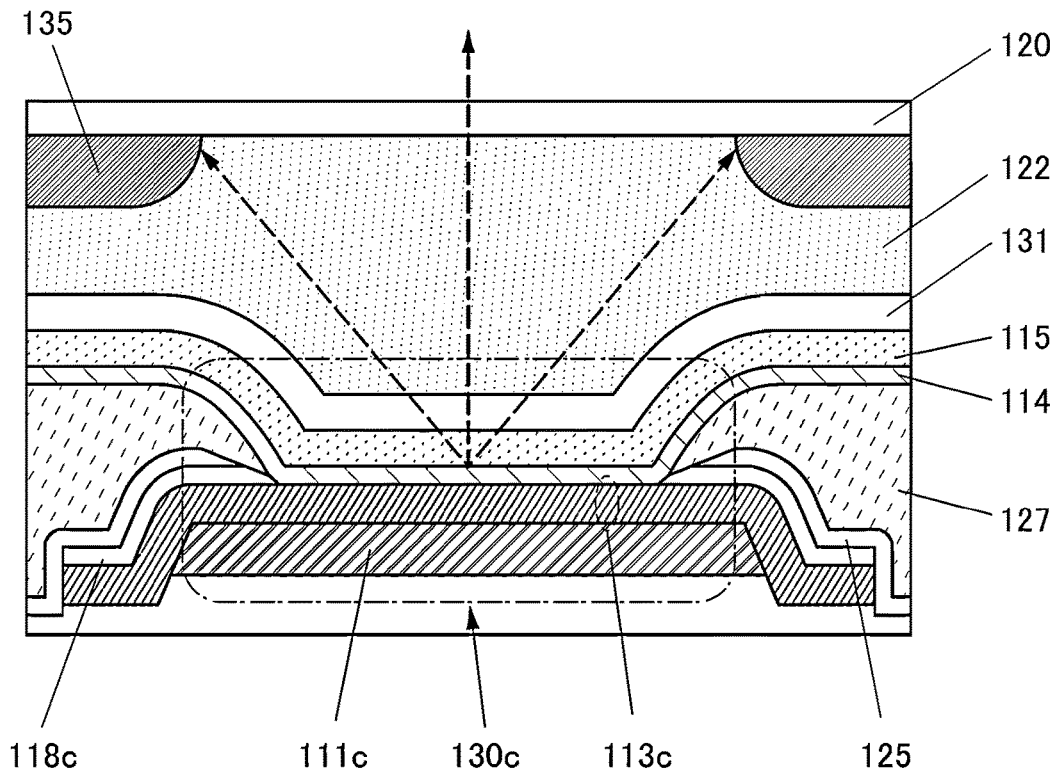
FIG. 11A and FIG. 11B are cross-sectional views illustrating components of a display device.
Figure 11B:
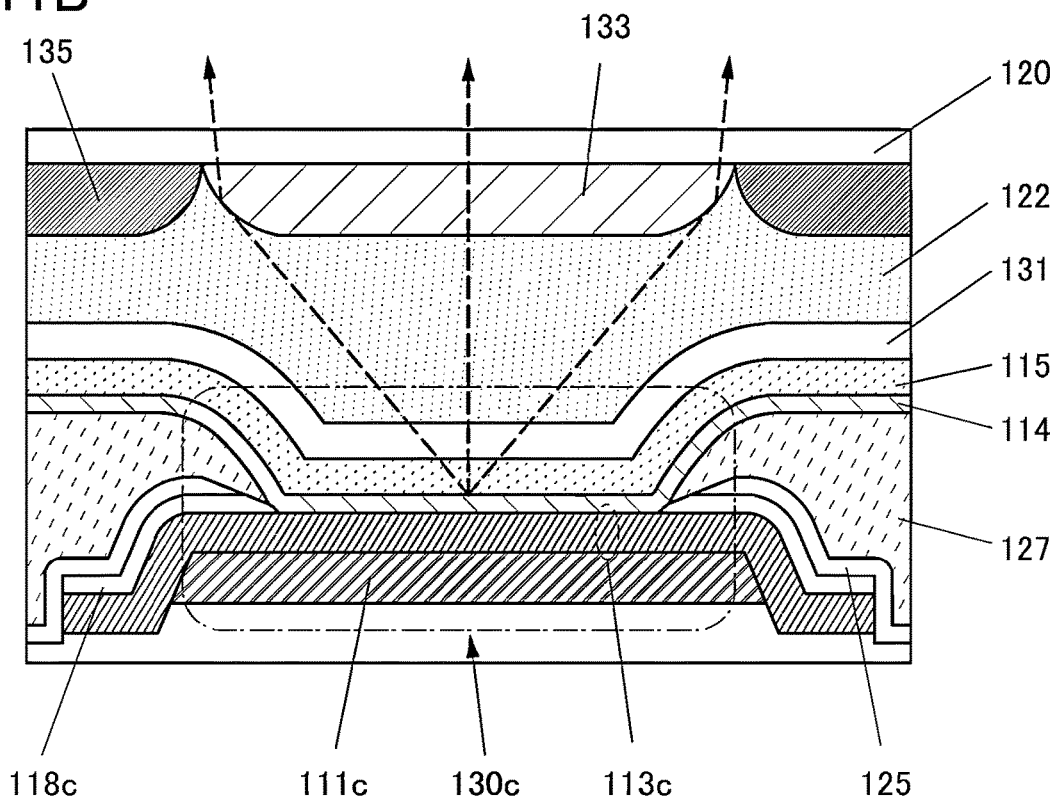

FIG. 11A and FIG. 11B are diagrams illustrating some of rays of light emitted from the light-emitting device 130c. FIG. 11A is a comparative example in which a lens is not provided, and FIG. 11B is an example in which the lens 133 is provided. Note that the substantially trapezoidal lens 133 provided over the light-emitting device 130c can have a structure similar to that of the above-described substantially trapezoidal lens 133 provided over the light-receiving device 150.

In the case where the light-blocking layer 135 is provided, part of light emitted from the light-emitting device 130c in an oblique direction is blocked by the light-blocking layer 135 and cannot be emitted to outside. In contrast, when the lens 133 is provided, light being blocked in FIG. 11A can also be emitted to outside by refraction in the end portion of the lens 133. Thus, providing the substantially trapezoidal lens 133 can improve the light extraction efficiency. Accordingly, a high-luminance display device can be formed.

A variety of optical members can be arranged on the outer surface of the substrate 120. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be placed as a surface protective layer on the outer surface of the substrate 120.

For example, a glass layer or a silica layer ($SiO_x$ layer) is preferably provided as the surface protective layer to inhibit the surface contamination and generation of a scratch. The surface protective layer may be formed using DLC (diamond like carbon), aluminum oxide ($AlO_x$), a polyester-based material, a polycarbonate-based material, or the like. Note that for the surface protective layer, a material having high visible light transmittance is preferably used. The surface protective layer is preferably formed using a material with high hardness.

For the substrate 120, glass, quartz, ceramic, sapphire, a resin, a metal, an alloy, a semiconductor, or the like can be used. The substrate on the side from which light from the light-emitting device is extracted is formed using a material that transmits the light. When the substrate 120 is formed using a flexible material, the flexibility of the display device can be increased. Furthermore, a polarizing plate may be used as the substrate 120.

For the substrate 120, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used as the substrate 120.

In the case where a circularly polarizing plate overlaps with the display device, a highly optically isotropic substrate is preferably used as the substrate included in the display device. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display device might be changed, e.g., creases are generated. Thus, for the substrate, a film with a low water absorption rate is preferably used. For example, a film with a water absorption rate lower than or equal to 1% is preferably used, a film with a water absorption rate lower than or equal to 0.1% is further preferably used, and a film with a water absorption rate lower than or equal to 0.01% is still further preferably used.

As the adhesive layer 122, a variety of curable adhesives such as a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferable. Alternatively, a two-liquid-mixture-type resin may be used. An adhesive sheet or the like may be used.

In the display device of one embodiment of the present invention, each light-emitting device includes an island-shaped EL layer, which can inhibit generation of a leakage current between the subpixels. This can prevent crosstalk due to unintended light emission, so that a display device with extremely high contrast can be achieved. The insulating layer having a tapered end portion and being provided between adjacent island-shaped EL layers can inhibit generation of step disconnection at the time of forming the common electrode. This can inhibit the common layer and the common electrode from having connection defects due to the disconnected portion. Hence, the display device of one embodiment of the present invention achieves both high resolution and high display quality.

A substantially trapezoidal lens is provided over the light-receiving device and the light-emitting device included in the display device of one embodiment of the present invention. When a substantially trapezoidal lens is provided, light incident on the pinhole (the opening portion) can be efficiently received by the light-receiving portion in the light-receiving device, so that the light-receiving sensitivity can be improved. In the light-emitting device, light emitted toward the end portion of the light-blocking layer is refracted by the lens and emitted to the outside, so that the light extraction efficiency can be improved.

This embodiment can be combined with the other embodiments as appropriate. In this specification, in the case where a plurality of structure examples are described in one embodiment, the structure examples can be combined as appropriate.

Embodiment 2

In this embodiment, a method for fabricating the lens included in the display device of one embodiment of the present invention will be described. Note that Embodiment 1 can be referred to for the description of a constituent material of each component.

FIG. 12A to FIG. 12F are diagrams illustrating a fabrication process of the lens 133 formed over the substrate 120. Although the process of forming the lens 133 after the formation of the light-blocking layer 135 is described in this embodiment, the light-blocking layer 135 may be formed after the formation of the lens 133.

Figure 12A:
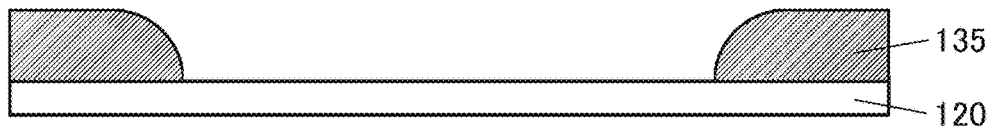
FIG. 12A to FIG. 12F are cross-sectional views illustrating an example of a method for fabricating a lens.

First, the light-blocking layer 135 is formed over the substrate 120 (see FIG. 12A). For example, a metal film having a thickness sufficient to have a light-blocking property is formed over the substrate 120, and a resist mask is formed over the metal film by a photolithography process. Then, the metal film is etched, whereby the light-blocking layer 135 with a desired shape can be formed. Alternatively, the light-blocking layer 135 may be formed by application of a photosensitive resin, then performing light exposure on part of the photosensitive resin, and performing a development process.

Figure 12B:
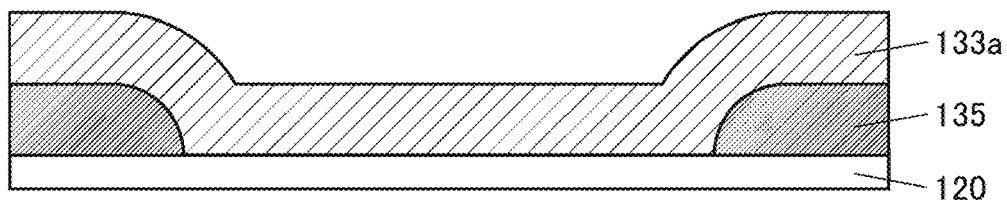

Next, a photosensitive resin is applied onto the substrate 120 and the light-blocking layer 135 and pre-baking is performed to form the resin layer 133a (see FIG. 12B). As the photosensitive resin, for example, a material for forming the insulating layer 127 described in Embodiment 1 can be used. Although an example in which a positive photosensitive resin is used is described here, a negative photosensitive resin may be used.

Figure 12C:
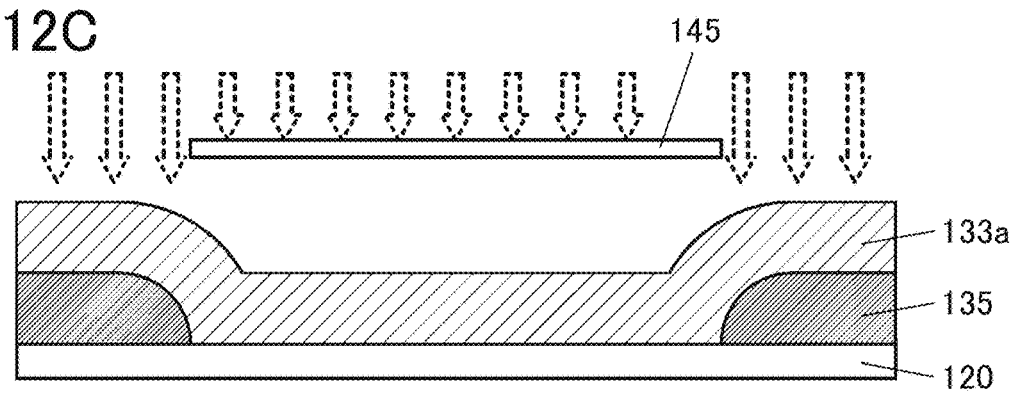

Next, the photomask 145 is used to shield a region where the lens 133 is to be formed from light and perform light exposure on the resin layer 133a (see FIG. 12C). In the case where a negative photosensitive resin is used, a photomask that shield a region where the lens 133 is not to be formed from light is used.

Figure 12D:
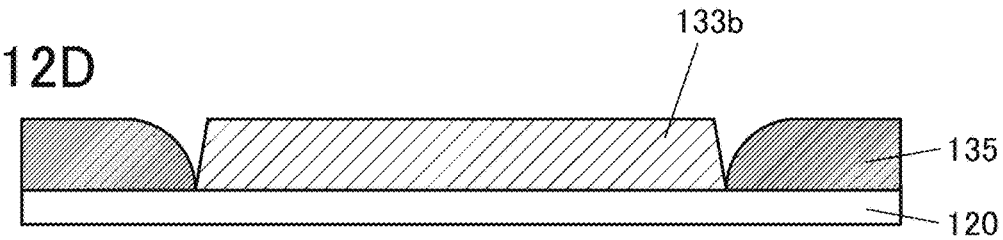

Then, an unnecessary region of the resin layer 133a is removed by a development process, so that the resin layer 133b is formed (see FIG. 12D). Here, since the resin layer 133b is not exposed to light, an unreacted component remains in the resin layer 133b, and the resin layer 133b is colored in some cases. The lens 133 to be formed preferably has a high visible-light transmittance; thus, in the case where the resin layer 133b is colored, the resin layer 133b is exposed to light to promote a reaction.

Figure 12E:
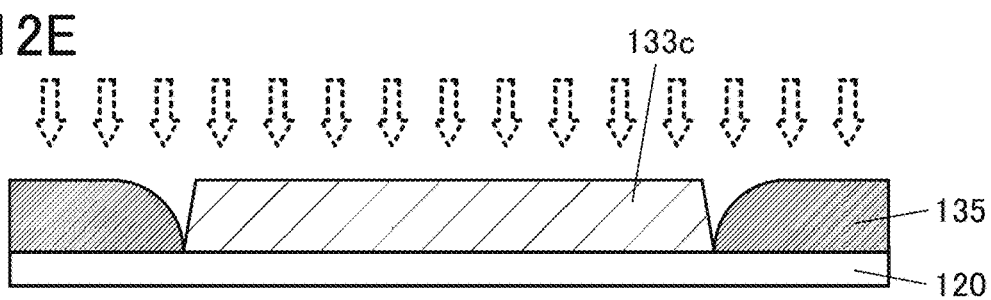

By promoting the reaction, the resin layer 133c having an improved transmittance can be formed (see FIG. 12E). Performing such light exposure after the development process can decrease post-baking temperature of the resin layer 133c in a later process in some cases. Note that in the case where the resin layer 133b is not colored, the light exposure after the development process may be omitted.

Figure 12F:
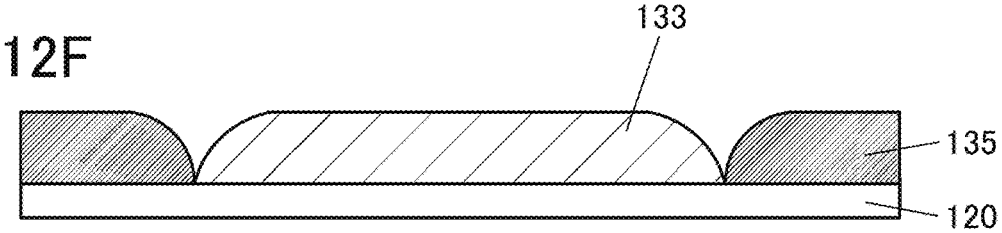

Then, post-baking is performed to reflow and harden the resin layer 133c, so that the lens 133 is formed (FIG. 12F).

Figure 13A:
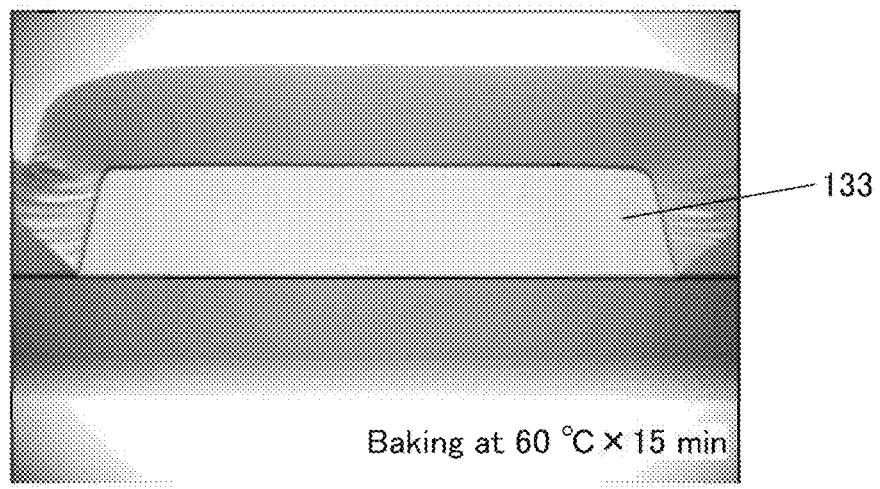
FIG. 13A to FIG. 13C are cross-sectional SEM images illustrating lenses.
Figure 13B:
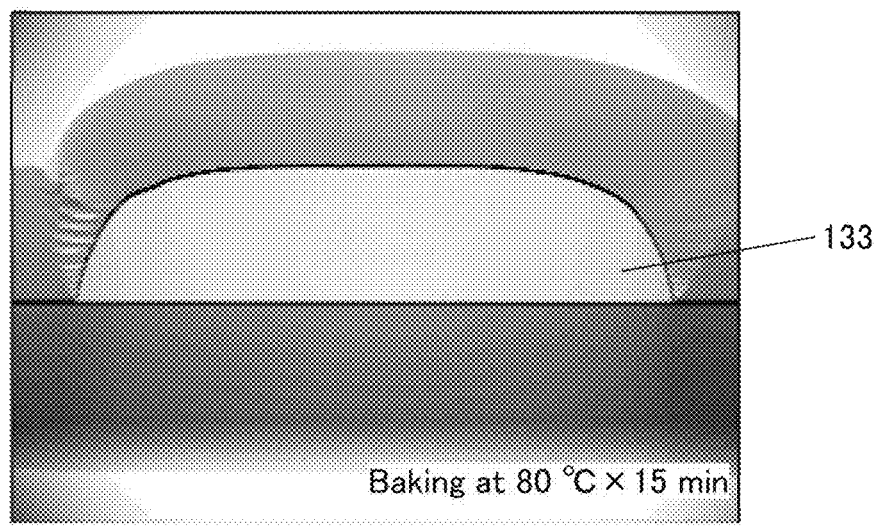
Figure 13C:
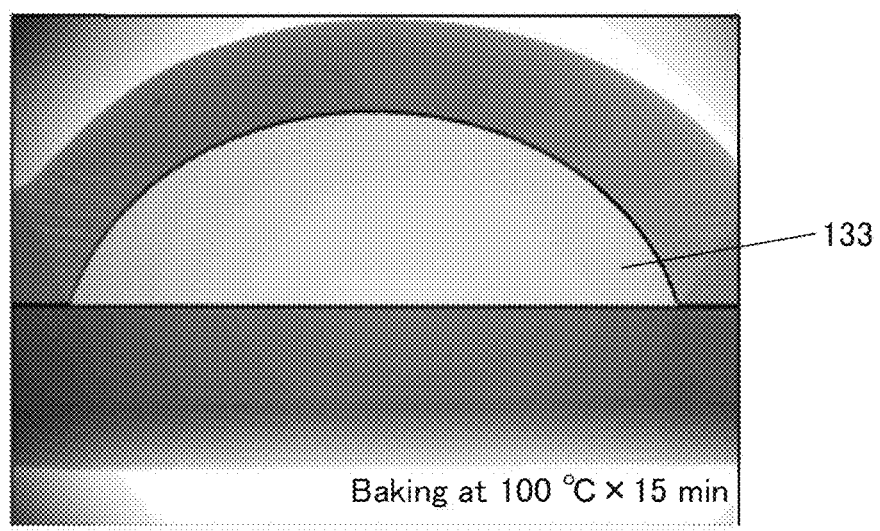

Here, the degree of change in the shape of the resin layer 133c can be changed depending on the post-baking temperature. FIG. 13A to FIG. 13C are SEM images showing the cross-sectional shapes of the lenses 133 formed with different post-baking temperatures.

When the post-baking temperature is low (60° C.×15 minutes, see FIG. 13A), reflowing cannot be sufficiently performed; thus, the shape of the vicinity of an end portion of the resin layer 133c is not changed to have a curved surface, and a lens shape is not obtained. In the case where the post-baking temperature is appropriate (80° C.×15 minutes, see FIG. 13B), the shape of the resin layer 133c is changed to be substantially flat in the center portion of the resin layer 133c and to be curved in the vicinity of an end portion thereof; and thus the lens 133 in a desired shape is obtained. In the case where the post-baking temperature is high (100° C.×15 minutes, see FIG. 13C), the shape of the resin layer 133c is excessively changed and has a hemispherical shape, not a trapezoidal shape. Therefore, post-baking is preferably performed at an appropriate temperature.

Note that depending on the photosensitive resin used, the shape of the lens 133 may be completed in a process of FIG. 12D without a property of reflowing in post-baking. In that case, post-baking may be performed in the next process and the lens 133 may be completed.

This embodiment can be combined with the other embodiments as appropriate.

Embodiment 3

In this embodiment, pixel layouts applicable to the display device of embodiments of the present invention are described.

[Pixel Layout]

There is no particular limitation on the arrangement of subpixels, and any of a variety of methods can be employed. Examples of the arrangement of subpixels include stripe arrangement, S-stripe arrangement, matrix arrangement, delta arrangement, Bayer arrangement, and PenTile arrangement.

The top surface shape of the subpixel illustrated in a diagram in this embodiment corresponds to the top surface shape of a light-emitting region (or a light-receiving region).

Examples of the top surface shape of the subpixel include polygons such as a triangle, a tetragon (including a rectangle and a square), and a pentagon; polygons with rounded corners; an ellipse; and a circle.

The range of the circuit layout for forming the subpixels is not limited to the range of the subpixels illustrated in a diagram and may be placed outside the subpixels.

Figure 14A:
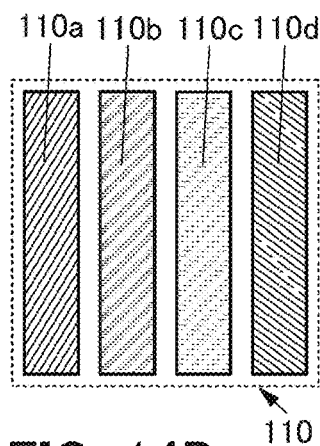
FIG. 14A to FIG. 14K are diagrams illustrating examples of a pixel.
Figure 14B:
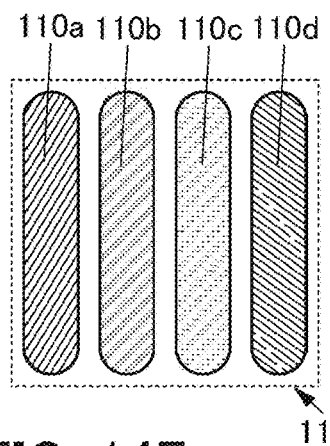
Figure 14C:
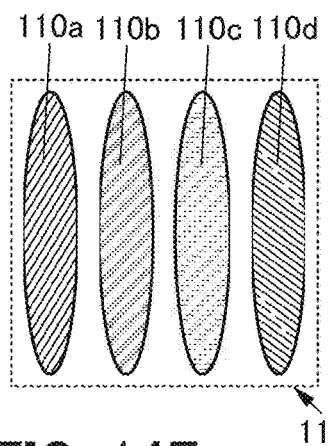

The pixels 110 illustrated in FIG. 14A to FIG. 14C employ stripe arrangement.

FIG. 14A illustrates an example where each subpixel has a rectangular top surface shape, FIG. 14B illustrates an example where each subpixel has a top surface shape formed by combining two half circles and a rectangle, and FIG. 14C illustrates an example where each subpixel has an elliptical top surface shape.

Figure 14D:
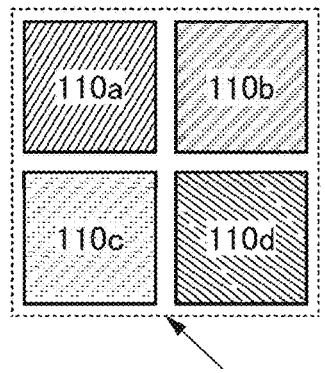
Figure 14E:
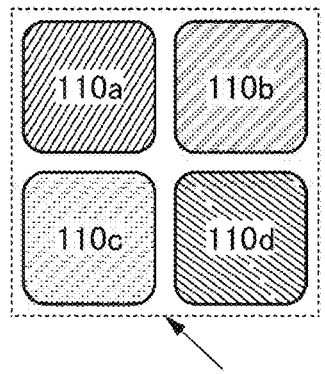
Figure 14F:
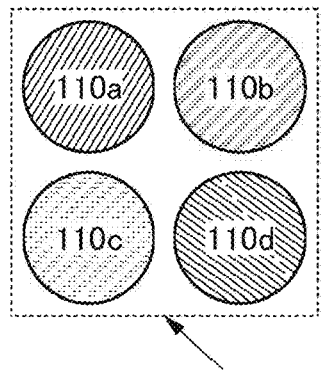

The pixels 110 illustrated in FIG. 14D to FIG. 14F employ matrix arrangement.

FIG. 14D illustrates an example where each subpixel has a square top surface shape, FIG. 14E illustrates an example where each subpixel has a rough square top surface shape with rounded corners, and FIG. 14F illustrates an example where each subpixel has a circular top surface shape.

Figure 14G:
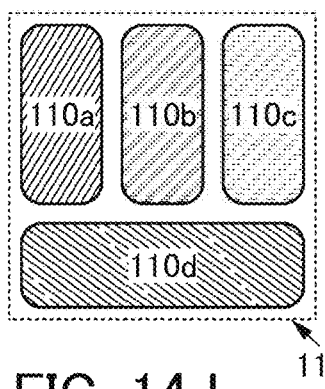
Figure 14H:
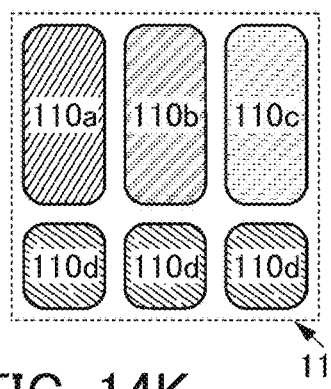

FIG. 14G and FIG. 14H each illustrate an example where one pixel 110 is composed of two rows and three columns.

The pixel 110 illustrated in FIG. 14G includes three subpixels (the subpixels 110a, 110b, and 110c) in the upper row (first row) and one subpixel (the subpixel 110d) in the lower row (second row). In other words, the pixel 110 includes the subpixel 110a in the left column (first column), the subpixel 110b in the center column (second column), the subpixel 110c in the right column (third column), and the subpixel 110d across these three columns.

The pixel 110 illustrated in FIG. 14H includes three subpixels (the subpixels 110a, 110b, and 110c) in the upper row (first row) and three of the subpixels 110d in the lower row (second row). In other words, the pixel 110 includes the subpixel 110a and the subpixel 110d in the left column (first column), the subpixel 110b and the subpixel 110d in the center column (second column), and the subpixel 110c and the subpixel 110d in the right column (third column). Matching the positions of the subpixels in the upper row and the lower row as illustrated in FIG. 14H enables efficient removal of dust and the like that would be produced in the manufacturing process. Thus, a display device with high display quality can be provided.

Figure 14I:
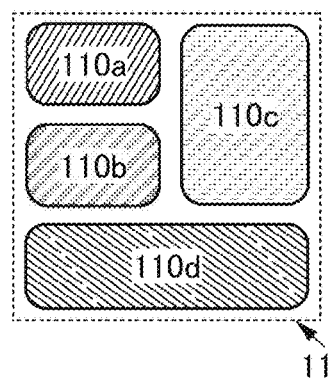

FIG. 14I illustrates an example where one pixel 110 is composed of three rows and two columns.

The pixel 110 illustrated in FIG. 14I includes the subpixel 110a in the upper row (first row), the subpixel 110b in the center row (second row), the subpixel 110c across the first and second rows, and one subpixel (the subpixel 110d) in the lower row (third row). In other words, the pixel 110 includes the subpixels 110a and 110b in the left column (first column), the subpixel 110c in the right column (second column), and the subpixel 110d across these two columns.

The pixels 110 illustrated in FIG. 14A to FIG. 14I are each composed of four subpixels: the subpixels 110a, 110b, 110c, and 110d. For example, any one of the subpixel 110a to the subpixel 110d can include a light-receiving device and the other three subpixels can include light-emitting devices.

In the pixels 110 illustrated in FIG. 14A to FIG. 14I, for example, it is preferable that the subpixel 110a be the subpixel R emitting red light, the subpixel 110b be the subpixel G emitting green light, the subpixel 110c be the subpixel B emitting blue light, and the subpixel 110d be a subpixel S including a light-receiving device. In the case of such a structure, stripe arrangement is employed as the layout of R, G, and B in the pixels 110 illustrated in FIG. 14G and FIG. 14H, leading to higher display quality. In addition, what is called S-stripe arrangement is employed as the layout of R, G, and B in the pixel 110 illustrated in FIG. 14I, leading to higher display quality.

There is no particular limitation on the wavelength of light detected by the subpixel S including a light-receiving device. The subpixel S can have a structure capable of detecting one or both of visible light and infrared light.

Note that in the case where the light-emitting device is not provided, the subpixels 110a, 110b, 110c, and 110d can be subpixels of four colors of R, G, B, and white (W), subpixels of four colors of R, G, B, and Y, or subpixels of R, G, B, and infrared light (IR), for example.

Figure 14J:
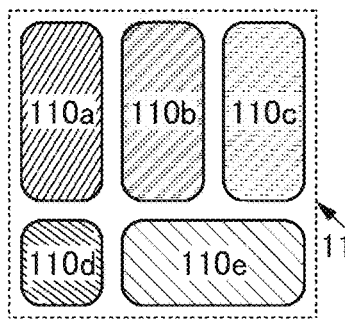
Figure 14K:
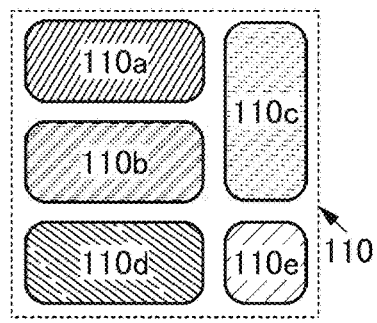

As illustrated in FIG. 14J and FIG. 14K, the pixel can include five types of subpixels.

FIG. 14J illustrates an example where one pixel 110 is composed of two rows and three columns.

The pixel 110 illustrated in FIG. 14J includes three subpixels (the subpixels 110a, 110b, and 110c) in the upper row (first row) and two subpixels (the subpixels 110d and 110e) in the lower row (second row). In other words, the pixel 110 includes the subpixels 110a and 110d in the left column (first column), the subpixel 110b in the center column (second column), the subpixel 110c in the right column (third column), and the subpixel 110e across the second and third columns.

FIG. 14K illustrates an example where one pixel 110 is composed of three rows and two columns.

The pixel 110 illustrated in FIG. 14K includes the subpixel 110a in the upper row (first row), the subpixel 110b in the center row (second row), the subpixel 110c across the first and second rows, and two subpixels (the subpixels 110d and 110e) in the lower row (third row). In other words, the pixel 110 includes the subpixels 110a, 110b, and 110d in the left column (first column), and the subpixels 110c and 110e in the right column (second column).

In the pixels 110 illustrated in FIG. 14J and FIG. 14K, for example, it is preferable that the subpixel 110a be the subpixel R emitting red light, the subpixel 110b be the subpixel G emitting green light, and the subpixel 110c be the subpixel B emitting blue light. In the case of such a structure, stripe arrangement is employed as the layout of R, G, and B in the pixel 110 illustrated in FIG. 14J, leading to higher display quality. In addition, what is called S-stripe arrangement is employed as the layout of R, G, and B in the pixel 110 illustrated in FIG. 14K, leading to higher display quality.

In the pixels 110 illustrated in FIG. 14J and FIG. 14K, for example, it is preferable to use the subpixel S including a light-receiving device as at least one of the subpixel 110d and the subpixel 110e. In the case where light-receiving devices are used in both the subpixel 110d and the subpixel 110e, the light-receiving devices may have different structures. For example, the wavelength ranges of detected light may be different at least partly. Specifically, one of the subpixel 110d and the subpixel 110e may include a light-receiving device mainly detecting visible light and the other may include a light-receiving device mainly detecting infrared light.

In a preferred mode of the pixels 110 illustrated in FIG. 14J and FIG. 14K, for example, the subpixel S including a light-receiving device is used as one of the subpixel 110d and the subpixel 110e and a subpixel including a light-emitting device that can be used as a light source is used as the other. For example, it is preferable that one of the subpixel 110d and the subpixel 110e be the subpixel IR emitting infrared light and the other be the subpixel S including a light-receiving device detecting infrared light.

In a pixel including the subpixels R, G, B, IR, and S, while an image is displayed using the subpixels R, G, and B, reflected light of infrared light emitted by the subpixel IR that is used as a light source can be detected by the subpixel S.

As described above, the pixel composed of the subpixels each including the light-emitting device can employ any of a variety of layouts in the display device of one embodiment of the present invention. The display device of one embodiment of the present invention can have a structure where the pixel includes both a light-emitting device and a light-receiving device. Also in this case, any of a variety of layouts can be employed.

This embodiment can be combined with any of the other embodiments as appropriate.

Embodiment 4

In this embodiment, display devices of embodiments of the present invention are described.

The display device of this embodiment can be a high-resolution display device. Accordingly, the display device in this embodiment can be used for display portions of information terminals (wearable devices) such as watch-type and bracelet-type information terminals and display portions of wearable devices capable of being worn on a head, such as a VR device like a head-mounted display (HMD) and a glasses-type AR device.

The display device of this embodiment can be a high-definition display device or a large-sized display device. Accordingly, the display device of this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, a desktop or notebook personal computer, a monitor of a computer and the like, digital signage, and a large game machine such as a pachinko machine.

[Display Module]

Figure 15A:
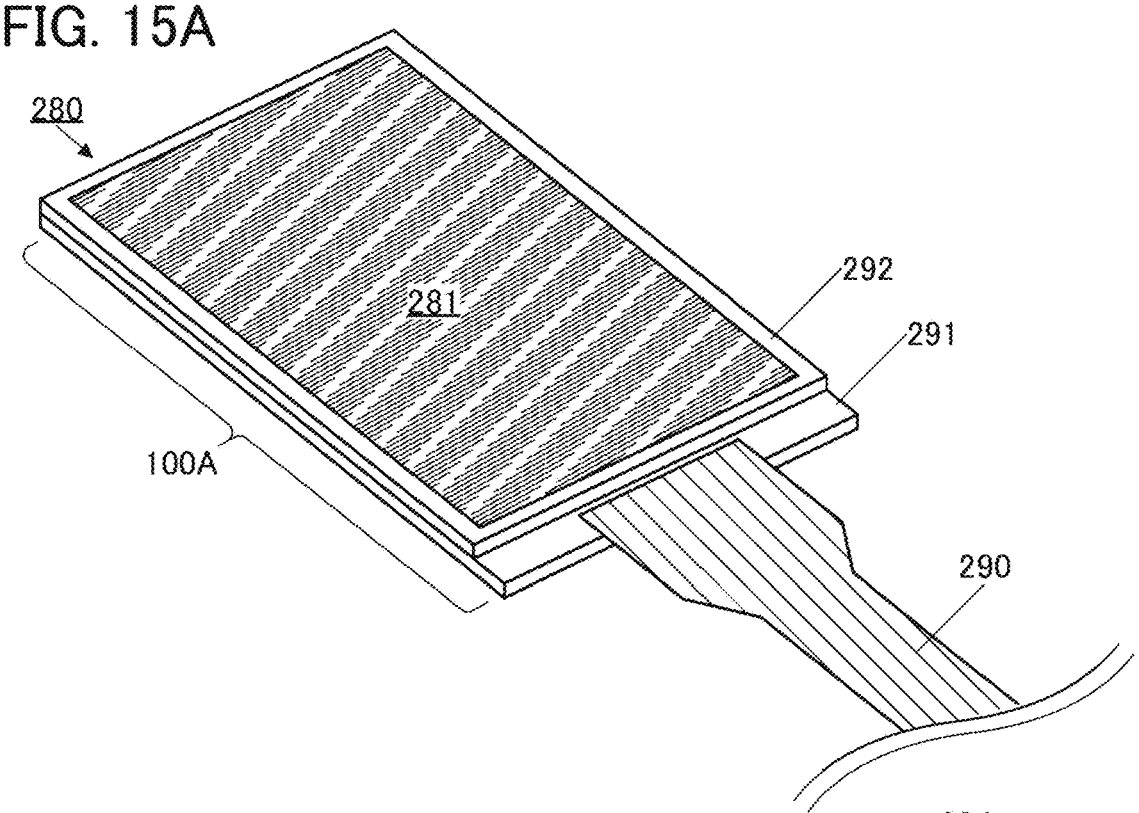
FIG. 15A and FIG. 15B are perspective views illustrating an example of a display device.

FIG. 15A is a perspective view of a display module 280. The display module 280 includes a display device 100A and an FPC 290.

The display module 280 includes a substrate 291 and a substrate 292. The display module 280 includes a display portion 281. The display portion 281 is a region of the display module 280 where an image is displayed, and is a region where light from pixels provided in a pixel portion 284 described later can be seen.

Figure 15B:
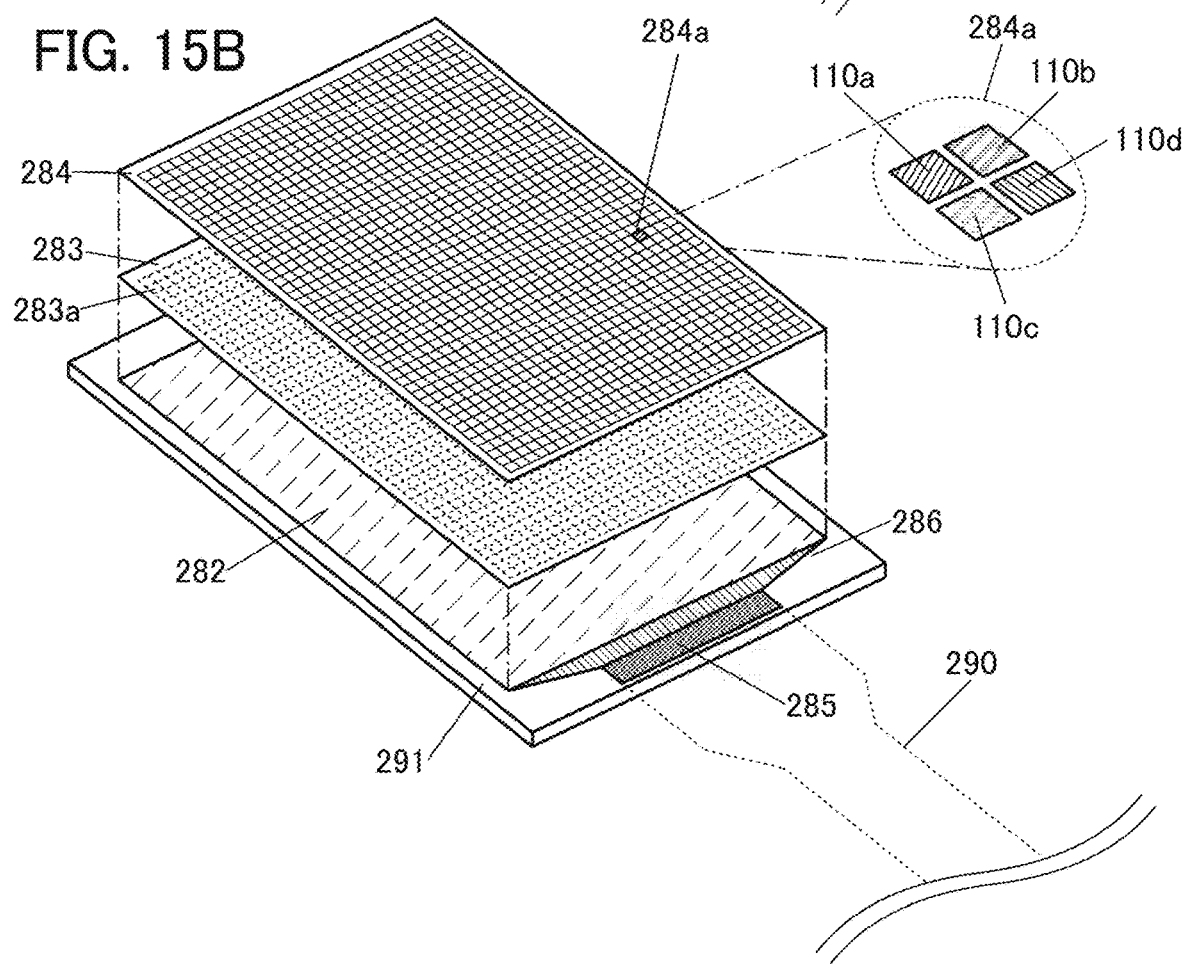

FIG. 15B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284a arranged periodically. An enlarged view of one pixel 284a is illustrated on the right side of FIG. 15B. The pixel 284a can employ any of the pixels described in the above embodiments. FIG. 15B illustrates an example where a structure similar to that of the pixel 110 illustrated in FIG. 1A is employed.

The pixel circuit portion 283 includes a plurality of pixel circuits 283a arranged periodically.

One pixel circuit 283a is a circuit that controls driving of a plurality of elements included in one pixel 284a. One pixel circuit 283a can be provided with a circuit controlling image capturing operation of one light-emitting device or one light-receiving device.

The circuit portion 282 includes a circuit for driving the pixel circuits 283a in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; thus, the aperture ratio (the effective display area ratio) of the display portion 281 can be significantly high. For example, the aperture ratio of the display portion 281 can be higher than or equal to 40% and lower than 100%, preferably higher than or equal to 50% and lower than or equal to 95%, further preferably higher than or equal to 60% and lower than or equal to 95%. Furthermore, the structure can shorten the length of wirings connecting the circuit portion 282 and the pixel circuit portion 283 and thus the influence of the wiring resistance and the wiring capacitance can be reduced, enabling a high-speed operation with low power consumption.

Such a display module 280 has an extremely high resolution, and thus can be suitably used for a VR device such as an HMD or a glasses-type AR device. For example, even with a structure where the display portion of the display module 280 is seen through a lens, pixels of the extremely-high-resolution display portion 281 included in the display module 280 are prevented from being seen when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of an electronic device, such as a smartphone or a watch.

[Display Device 100A]

Figure 16:
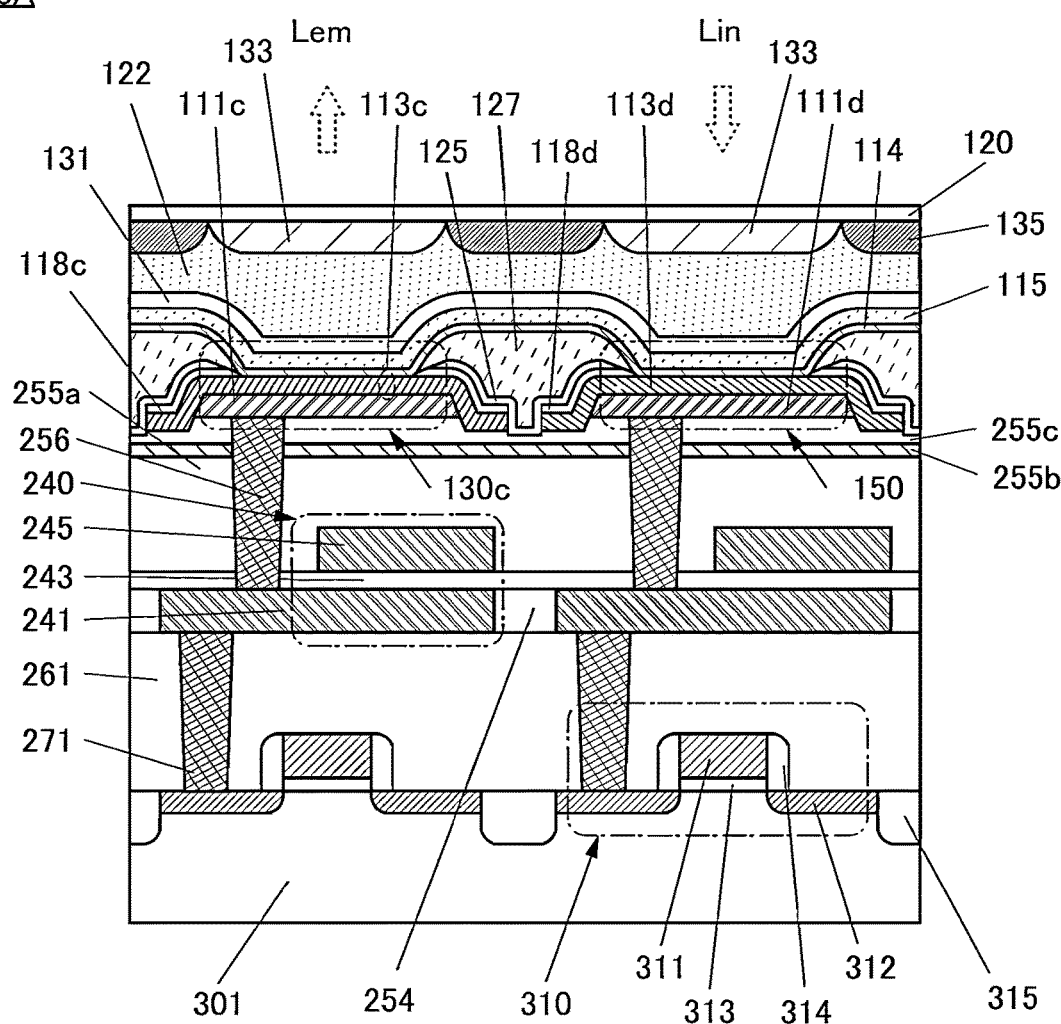
FIG. 16 is a cross-sectional view illustrating an example of a display device.

The display device 100A illustrated in FIG. 16 includes a substrate 301, a light-emitting device 130*c*, a light-receiving device 150, a capacitor 240, and a transistor 310.

The substrate 301 corresponds to the substrate 291 in FIG. 15A and FIG. 15B. A stacked-layer structure including the substrate 301 and the components thereover up to the insulating layer 255*a* corresponds to the layer 101 including transistors in Embodiment 1.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover the side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

The insulating layer 255*a* is provided to cover the capacitor 240, the insulating layer 255*b* is provided over the insulating layer 255*a*, and the insulating layer 255*c* is provided over the insulating layer 255*b*. The light-emitting device 130*c* and the light-receiving device 150 are provided over the insulating layer 255*c*. FIG. 16 illustrates an example where the light-emitting device 130*c* and the light-receiving device 150 each have a structure similar to the stacked-layer structure illustrated in FIG. 1B.

A pixel electrode 111*c* and a pixel electrode 111*d* are each electrically connected to one of the source and the drain of the transistor 310 through a plug 256 embedded in the insulating layer 243, the insulating layer 255*a*, the insulating layer 255*b*, and the insulating layer 255*c*, the conductive layer 241 embedded in the insulating layer 254, and the plug 271 embedded in the insulating layer 261. The pixel electrode can have a two-layer structure of a reflective electrode and a transparent electrode over the reflective electrode. The level of the top surface of the insulating layer 255*c* is equal to or substantially equal to the level of the top surface of the plug 256. A variety of conductive materials can be used for the plugs.

Embodiment 1 can be referred to for details of the light-emitting devices and the components thereover up to the substrate 120. The substrate 120 corresponds to the substrate 292 in FIG. 15A.

[Display Device 100D]

Figure 17:
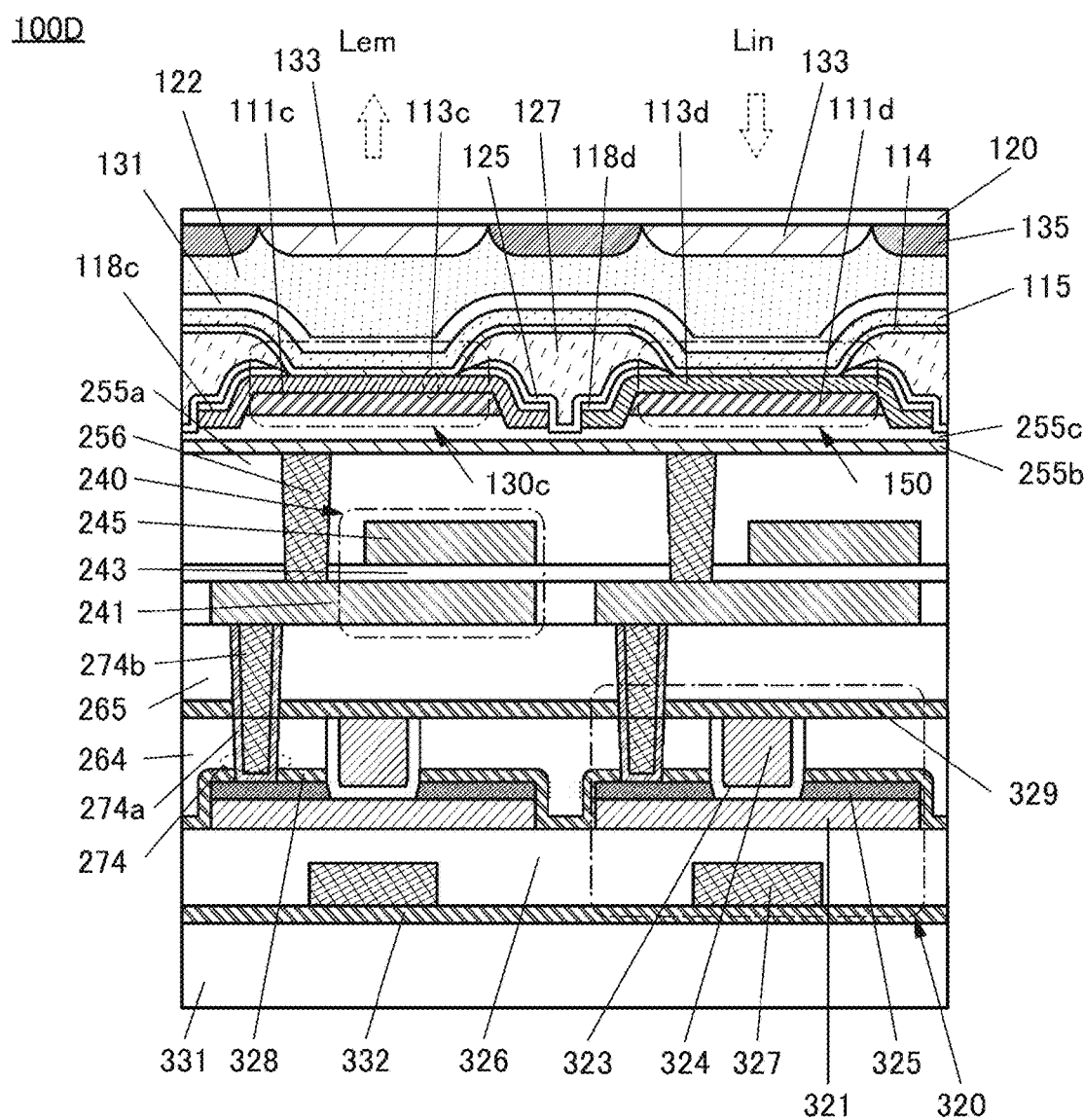
FIG. 17 is a cross-sectional view illustrating an example of a display device.

The display device 100D illustrated in FIG. 17 is different from the display device 100A mainly in a structure of a transistor. Note that in the description of the display device below, portions similar to those of the above-mentioned display device are not described in some cases.

A transistor 320 is a transistor that contains a metal oxide (also referred to as an oxide semiconductor) in a semiconductor layer where a channel is formed (i.e., an OS transistor).

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 15A and FIG. 15B. A stacked-layer structure including the substrate 331 and components thereover up to the insulating layer 255*a* corresponds to the layer 101 including transistors in Embodiment 1. As the substrate 331, an insulating substrate or a semiconductor substrate can be used.

The insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, for example, a film in which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a metal oxide (also referred to as an oxide semiconductor) film having semiconductor characteristics. The pair of conductive layers 325 are provided over and in contact with the semiconductor layer 321 and function as a source electrode and a drain electrode.

An insulating layer 328 is provided to cover the top surfaces and the side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325, and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are subjected to planarization treatment so that their levels are equal to or substantially equal to each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water and hydrogen from the insulating layer 265 and the like into the transistor 320. As the insulating layer 329, an insulating film similar to the insulating layer 328 and the insulating layer 332 can be used.

A plug 274 electrically connected to one of the pair of conductive layers 325 is provided so as to be embedded in the insulating layer 265, the insulating layer 329, and the insulating layer 264. Here, the plug 274 preferably includes a conductive layer 274a that covers the side surface of an opening in the insulating layer 265, the insulating layer 329, the insulating layer 264, and the insulating layer 328 and part of the top surface of the conductive layer 325, and a conductive layer 274b in contact with the top surface of the conductive layer 274a. In that case, a conductive material in which hydrogen and oxygen are less likely to diffuse is preferably used for the conductive layer 274a.

[Display Device 100E]

Figure 18:
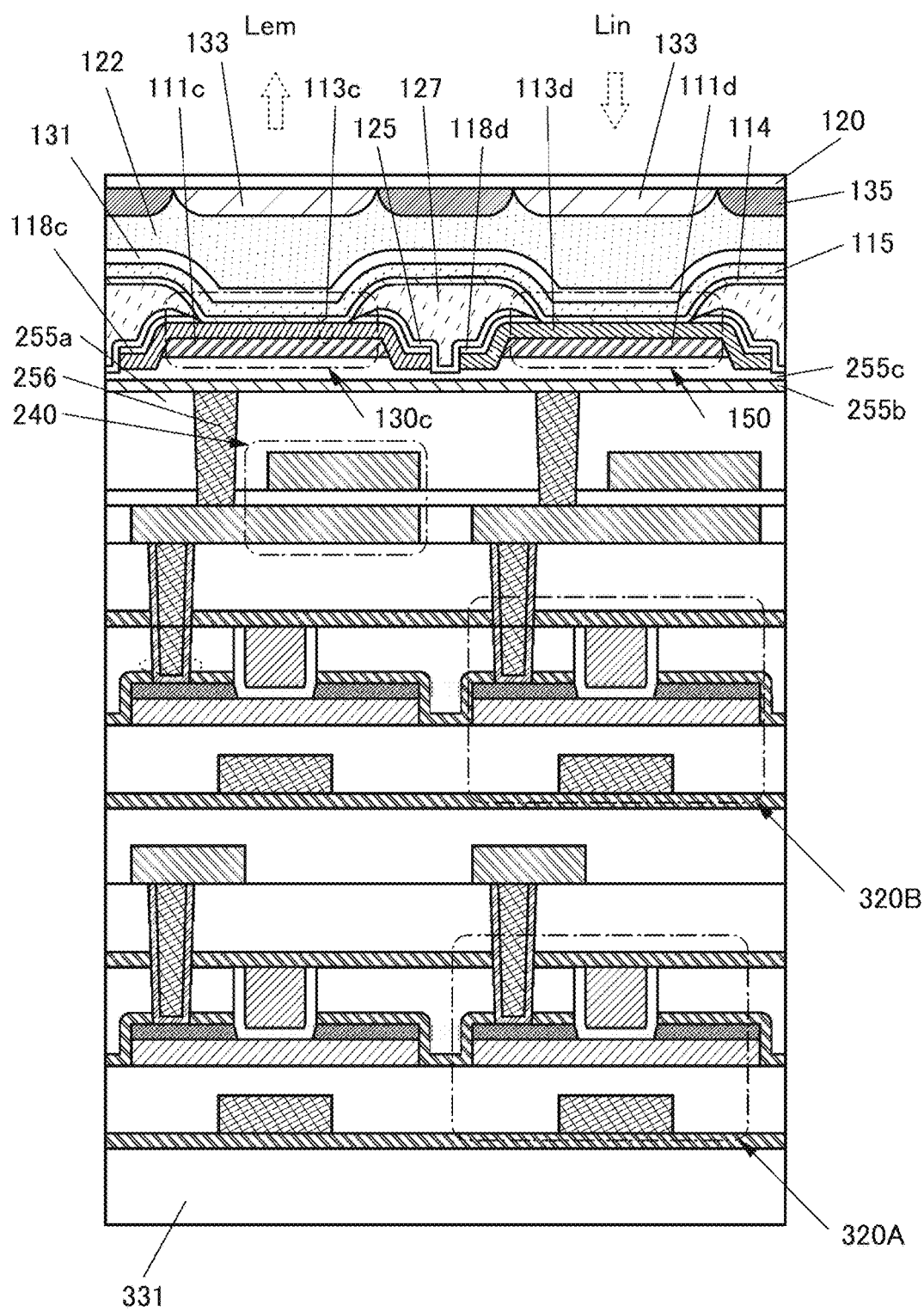
FIG. 18 is a cross-sectional view illustrating an example of a display device.

The display device 100E illustrated in FIG. 18 has a structure in which a transistor 320A and a transistor 320B each including an oxide semiconductor in a semiconductor where a channel is formed are stacked.

The description of the display device 100D can be referred to for the transistor 320A, the transistor 320B, and the components around them.

Although the structure where two transistors including an oxide semiconductor are stacked is described here, the present invention is not limited thereto. For example, three or more transistors may be stacked.

[Display Device 100F]

Figure 19:
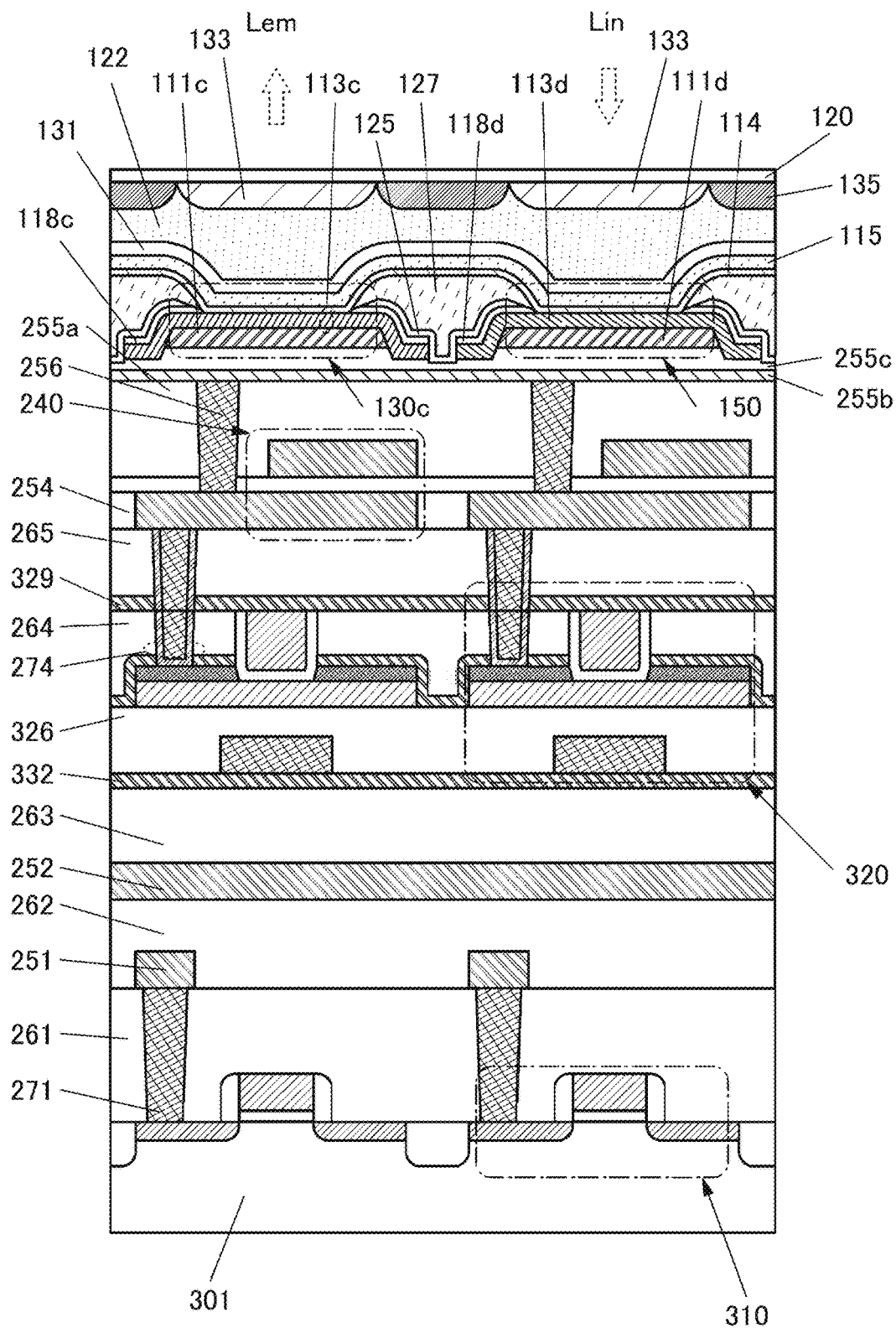
FIG. 19 is a cross-sectional view illustrating an example of a display device.

The display device 100F illustrated in FIG. 19 has a structure in which the transistor 310 whose channel is formed in the substrate 301 and the transistor 320 including a metal oxide in the semiconductor layer where the channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit (a gate line driver circuit or a source line driver circuit) for driving the pixel circuit. The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display device can be downsized as compared with the case where a driver circuit is provided around a display region.

[Display Device 100G]

Figure 20:
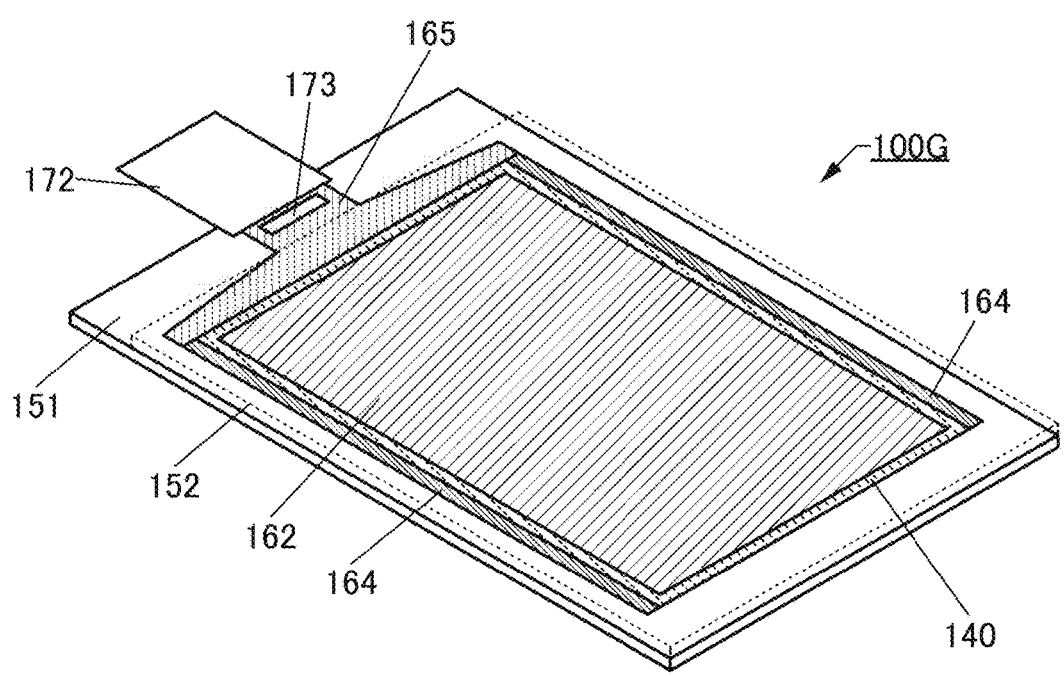
FIG. 20 is a perspective view illustrating an example of a display device.
Figure 21A:
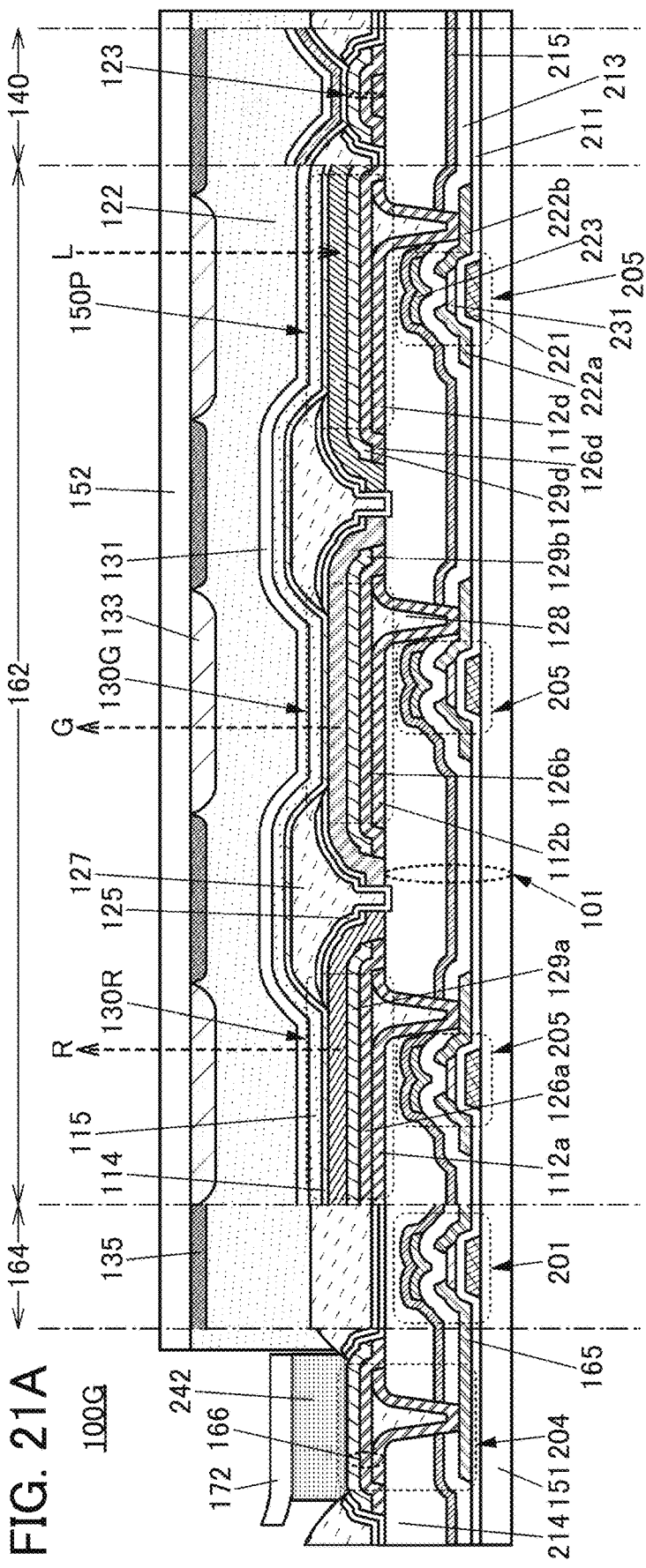
FIG. 21A is a cross-sectional view illustrating an example of a display device.

FIG. 20 is a perspective view of a display device 10G, and FIG. 21A is a cross-sectional view of the display device 100G.

In the display device 100G, a substrate 152 and a substrate 151 are bonded to each other. In FIG. 20, the substrate 152 is denoted by a dashed line.

The display device 100G includes a display portion 162, the connection portion 140, a circuit 164, a wiring 165, and the like. FIG. 20 illustrates an example where an IC 173 and an FPC 172 are mounted on the display device 100G. Thus, the structure illustrated in FIG. 20 can be regarded as a display module including the display device 100G, the IC (integrated circuit), and the FPC.

The connection portion 140 is provided outside the display portion 162. The connection portion 140 can be provided along one or more sides of the display portion 162. The number of connection portions 140 can be one or more. FIG. 20 illustrates an example where the connection portion 140 is provided to surround the four sides of the display portion. A common electrode of a light-emitting device is electrically connected to a conductive layer in the connection portion 140, so that a potential can be supplied to the common electrode.

As the circuit 164, a scan line driver circuit can be used, for example.

The wiring 165 has a function of supplying a signal and power to the display portion 162 and the circuit 164. The signal and power are input to the wiring 165 from the outside through the FPC 172 or input to the wiring 165 from the IC 173.

FIG. 20 illustrates an example where the IC 173 is provided over the substrate 151 by a COG (Chip On Glass) method, a COF (Chip on Film) method, or the like. An IC including a scan line driver circuit, a signal line driver circuit, or the like can be used as the IC 173, for example. Note that the display device 100G and the display module are not necessarily provided with an IC. The IC may be mounted on the FPC by a COF method or the like.

FIG. 21A illustrates example cross sections of part of a region including the FPC 172, part of the circuit 164, part of the display portion 162, part of the connection portion 140, and part of a region including an end portion of the display device 100G.

The display device 100G illustrated in FIG. 21A includes a transistor 201, a transistor 205, the light-emitting device 130R that emits red light, the light-receiving device 130G that emits green light, the light-receiving device 150, and the like between the substrate 151 and the substrate 152.

The light-emitting devices 130R, 130G, and the light-receiving device 150P have the same stacked-layer structure as the structures of the light-emitting device and the light-receiving device illustrated in FIG. 1B except the structure of the pixel electrode.

The light-emitting device 130R includes a conductive layer 112a, a conductive layer 126a over the conductive layer 112a, and a conductive layer 129a over the conductive layer 126a. All of the conductive layers 112a, 126a, and 129a can be referred to as pixel electrodes, or one or two of them can be referred to as pixel electrodes.

The light-emitting device 130G includes the conductive layer 112b, the conductive layer 126b over the conductive layer 112b, and the conductive layer 129b over the conductive layer 126b.

The light-receiving device 150P includes a conductive layer 112d, a conductive layer 126d over the conductive layer 112d, and a conductive layer 129d over the conductive layer 126d.

The conductive layer 112a is connected to the conductive layer 222b included in the transistor 205 through an opening provided in the insulating layer 214. An end portion of the conductive layer 126a is positioned outward from an end portion of the conductive layer 112a. The end portion of the conductive layer 126a and an end portion of the conductive layer 129a are aligned or substantially aligned with each other. For example, a conductive layer functioning as a reflective electrode can be used as the conductive layer 112a and the conductive layer 126a, and a conductive layer functioning as a transparent electrode can be used as the conductive layer 129a.

Detailed description of the conductive layers 112b, 126b, and 129b of the light-emitting device 130G and the conductive layers 112d, 126d, and 129d of the light-receiving device 150P is omitted because these conductive layers are similar to the conductive layers 112a, 126a, and 129a of the light-emitting device 130R.

The conductive layers 112a, 112b, and 112d each have a depressed portion covering the opening provided in the insulating layer 214. A layer 128 is embedded in each of the depressed portions.

The layer 128 has a planarization function for the depressed portions of the conductive layers 112a, 112b, and 112d. The conductive layers 126a, 126b, and 126d electrically connected to the conductive layers 112a, 112b, and 112d, respectively, are provided over the conductive layers 112a, 112b, and 112d and the layer 128. Thus, regions overlapping with the depressed portions of the conductive layers 112a, 112b, and 112d can also be used as the light-emitting regions or the light-receiving regions, increasing the aperture ratio of the pixels.

The layer 128 may be an insulating layer or a conductive layer. Any of a variety of inorganic insulating materials, organic insulating materials, and conductive materials can be used for the layer 128 as appropriate. Specifically, the layer 128 is preferably formed using an insulating material and is particularly preferably formed using an organic insulating material. For the layer 128, an organic insulating material that can be used for the insulating layer 127 can be used, for example.

The protective layer 131 and the lens 133 are provided over the light-emitting devices 130R, 130G, and the light-receiving device 150P. The protective layer 131 and the substrate 152 are bonded to each other with an adhesive layer 122. The substrate 152 is provided with a light-blocking layer 135. A solid sealing structure, a hollow sealing structure, or the like can be employed to seal the light-emitting devices. In FIG. 21A, a solid sealing structure is employed in which a space between the substrate 152 and the substrate 151 is filled with the adhesive layer 122. Alternatively, a hollow sealing structure in which the space is filled with an inert gas (e.g., nitrogen or argon) may be employed. Here, the adhesive layer 122 may be provided not to overlap with the light-emitting devices. The space may be filled with a resin different from that of the frame-shaped adhesive layer 122.

The conductive layer 123 is provided over the insulating layer 214 in the connection portion 140. An example is described in which the conductive layer 123 has a stacked-layer structure of a conductive film obtained by processing the same conductive film as the conductive layers 112a, 112b, and 112d; a conductive film obtained by processing the same conductive film as the conductive layers 126a, 126b, and 126d; and a conductive film obtained by processing the same conductive film as the conductive layers 129a, 129b, and 129d. The common layer 114 is provided over the conductive layer 123, and the common electrode 115 is provided over the common layer 114. The conductive layer 123 and the common electrode 115 are electrically connected to each other through the common layer 114. Note that the common layer 114 is not necessarily formed in the connection portion 140. In this case, the conductive layer 123 and the common electrode 115 are in direct contact with each other to be electrically connected to each other.

The display device 100G has a top-emission structure. Light emitted by the light-emitting device is emitted toward the substrate 152 side. For the substrate 152, a material having a high visible-light-transmitting property is preferably used. The pixel electrode contains a material that reflects visible light, and a counter electrode (the common electrode 115) contains a material that transmits visible light.

For example, a stacked-layer structure including the substrate 151 and the components thereover up to the insulating layer 214 corresponds to the layer 101 including transistors in Embodiment 1.

The transistor 201 and the transistor 205 are formed over the substrate 151. These transistors can be fabricated using the same material in the same process.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material in which impurities such as water and hydrogen do not easily diffuse is preferably used for at least one of the insulating layers covering the transistors. In that case, the insulating layer can function as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating layer is suitable as the insulating layer 214 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. The insulating layer 214 may have a stacked-layer structure of an organic insulating layer and an inorganic insulating layer. The outermost layer of the insulating layer 214 preferably has a function of an etching protective layer. In that case, a depressed portion can be inhibited from being formed in the insulating layer 214 at the time of processing the conductive layer 112a, the conductive layer 126a, the conductive layer 129a, or the like. Alternatively, a depressed portion may be formed in the insulating layer 214 at the time of processing the conductive layer 112a, the conductive layer 126a, the conductive layer 129a, or the like.

Each of the transistor 201 and the transistor 205 includes a conductive layer 221 functioning as a gate, the insulating layer 211 functioning as a gate insulating layer, a conductive layer 222a and the conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, an inverted staggered transistor, or the like can be used. A top-gate transistor structure or a bottom-gate transistor structure may be employed. Alternatively, gates may be provided above and below the semiconductor layer where a channel is formed.

The structure where the semiconductor layer where a channel is formed is held between two gates is used for the transistor 201 and the transistor 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and any of an amorphous semiconductor, and a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case degradation of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display device of this embodiment.

As examples of the oxide semiconductor having crystallinity, a CAAC (c-axis aligned crystalline)-OS, an nc (nanocrystalline)-OS, and the like can be given.

Alternatively, a transistor containing silicon in its channel formation region (a Si transistor) may be used. As examples of silicon, single crystal silicon, polycrystalline silicon, amorphous silicon, and the like can be given. In particular, a transistor containing low-temperature polysilicon (LTPS) in its semiconductor layer (hereinafter also referred to as an LTPS transistor) can be used. The LTPS transistor has high field-effect mobility and favorable frequency characteristics.

With the use of Si transistors such as LTPS transistors, a circuit required to be driven at a high frequency (e.g., a source driver circuit) can be formed on the same substrate as a display portion. Thus, external circuits mounted on the display device can be simplified, and parts costs and mounting costs can be reduced.

An OS transistor has much higher field-effect mobility than a transistor containing amorphous silicon. In addition, the OS transistor has an extremely low leakage current between a source and a drain in an off state (hereinafter also referred to as off-state current), and electric charge accumulated in a capacitor that is connected in series to the transistor can be retained for a long period. Furthermore, power consumption of the display device can be reduced with the use of an OS transistor.

To increase the emission luminance of the light-emitting device included in the pixel circuit, the amount of current fed through the light-emitting device needs to be increased. For this, it is necessary to increase the source-drain voltage of a driving transistor included in the pixel circuit. Since an OS transistor has a higher breakdown voltage between the source and the drain than a Si transistor, a high voltage can be applied between the source and the drain of the OS transistor. Accordingly, when an OS transistor is used as the driving transistor included in the pixel circuit, the amount of current flowing through the light-emitting device can be increased, so that the emission luminance of the light-emitting device can be increased.

When transistors operate in a saturation region, a change in source-drain current with respect to a change in gate-source voltage can be smaller in an OS transistor than in a Si transistor. Accordingly, when an OS transistor is used as the driving transistor in the pixel circuit, the amount of current flowing between the source and the drain can be set minutely by a change in gate-source voltage; hence, the amount of current flowing through the light-emitting device can be controlled. Accordingly, the number of gray levels in the pixel circuit can be increased.

Regarding saturation characteristics of current flowing when transistors operate in a saturation region, even in the case where the source-drain voltage of an OS transistor increases gradually, a more stable current (saturation current) can be fed through the OS transistor than through a Si transistor. Thus, by using an OS transistor as the driving transistor, a stable current can be fed through light-emitting devices even when the current-voltage characteristics of the EL devices vary, for example. In other words, when the OS transistor operates in the saturation region, the source-drain current hardly changes with an increase in the source-drain voltage; hence, the emission luminance of the light-emitting device can be stable.

As described above, with the use of an OS transistor as a driving transistor included in the pixel circuit, it is possible to achieve "inhibition of black-level degradation", "increase in emission luminance", "increase in gray level", "inhibition of variation in light-emitting devices", and the like.

A semiconductor layer preferably contains indium, M (M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more selected from aluminum, gallium, yttrium, and tin.

It is particularly preferable that an oxide containing indium (In), gallium (Ga), and zinc (Zn) (also referred to as IGZO) be used for the semiconductor layer. Alternatively, it is preferable to use an oxide containing indium, tin, and zinc. Further alternatively, it is preferable to use an oxide containing indium, gallium, tin, and zinc. Alternatively, an oxide containing indium (In), aluminum (Al), and zinc (Zn) (also referred to as IAZO) is preferably used for the semiconductor layer. Alternatively, an oxide containing indium (In), aluminum (Al), gallium (Ga), and zinc (Zn) (also referred to as IAGZO) is preferably used for the semiconductor layer.

When the semiconductor layer is an In-M-Zn oxide, the atomic ratio of In is preferably higher than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or a composition in the neighborhood thereof, the case is included where Ga is greater than 0.1 and less than or equal to 2 and Zn is greater than or equal to 5 and less than or equal to 7 with In being 5. When the atomic ratio is described as In:Ga:Zn=1:1:1 or a composition in the neighborhood thereof, the case is included where Ga is greater than 0.1 and less than or equal to 2 and Zn is greater than 0.1 and less than or equal to 2 with In being 1.

The transistor included in the circuit 164 and the transistor included in the display portion 162 may have the same structure or different structures. One structure or two or more types of structures may be employed for a plurality of transistors included in the circuit 164. Similarly, one structure or two or more types of structures may be employed for a plurality of transistors included in the display portion 162.

All of the transistors included in the display portion 162 may be OS transistors or all of the transistors included in the display portion 162 may be Si transistors; alternatively, some of the transistors included in the display portion 162 may be OS transistors and the others may be Si transistors.

For example, when both an LTPS transistor and an OS transistor are used in the display portion 162, the display device can have low power consumption and high driving capability. Note that a structure where an LTPS transistor and an OS transistor are used in combination is referred to as LTPO in some cases. Note that as a further suitable example, a structure can be given where an OS transistor is used as, for example, a transistor functioning as a switch for controlling conduction and non-conduction between wirings and an LTPS transistor is used as, for example, a transistor for controlling current.

For example, one of the transistors included in the display portion 162 functions as a transistor for controlling current flowing through the light-emitting device and can be referred to as a driving transistor. One of a source and a drain of the driving transistor is electrically connected to the pixel electrode of the light-emitting device. An LTPS transistor is preferably used as the driving transistor. In that case, the amount of current flowing through the light-emitting device can be increased in the pixel circuit.

Another transistor included in the display portion 162 functions as a switch for controlling selection and non-selection of the pixel and can be referred to as a selection transistor. A gate of the selection transistor is electrically connected to a gate line, and one of a source and a drain thereof is electrically connected to a source line (signal line). An OS transistor is preferably used as the selection transistor. In that case, the gray level of the pixel can be maintained even with an extremely low frame frequency (e.g., lower than or equal to 1 fps); thus, power consumption can be reduced by stopping the driver in displaying a still image.

As described above, the display device of one embodiment of the present invention can have all of a high aperture ratio, high resolution, high display quality, and low power consumption.

Note that the display device of one embodiment of the present invention has a structure including the OS transistor and the light-emitting device having an MML (metal maskless) structure. With this structure, the leakage current that might flow through the transistor and the leakage current that might flow between adjacent light-emitting devices (also referred to as lateral leakage current, side leakage current, or the like) can be extremely low. With the structure, a viewer can notice any one or more of the image crispness, the image sharpness, a high chroma, and a high contrast ratio in an image displayed on the display device. When the leakage current that would flow through the transistor and the lateral leakage current between the light-emitting devices are extremely low, light leakage that might occur in black display (what is called black-level degradation) or the like can be minimized.

In particular, in the case where a light-emitting device having the MML structure employs the above-described SBS structure, a layer provided between light-emitting devices (for example, also referred to as an organic layer or a common layer which is commonly used between the light-emitting devices) is disconnected; accordingly, side leakage can be prevented or be made extremely low.

Figure 21C:
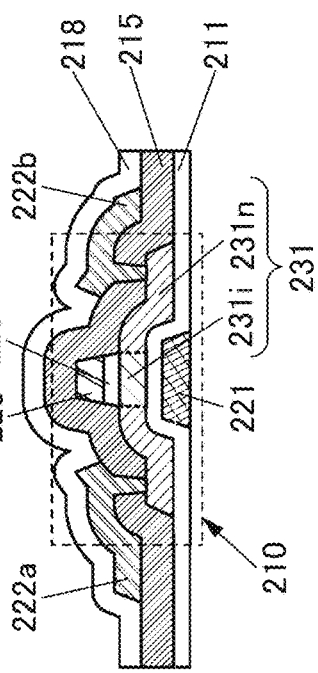
FIG. 21B and FIG. 21C are cross-sectional views illustrating examples of a transistor.
Figure 21B:
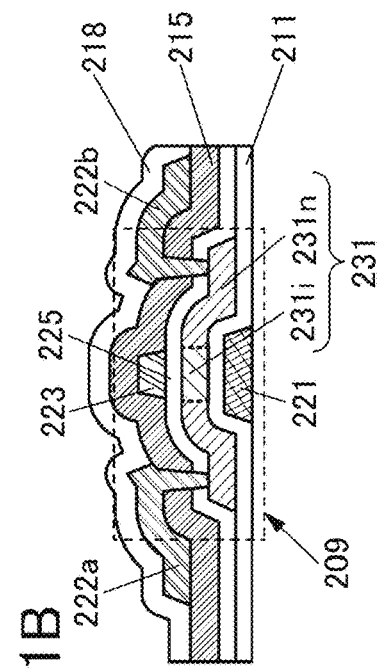

FIG. 21B and FIG. 21C illustrate other structure examples of transistors.

A transistor 209 and a transistor 210 each include the conductive layer 221 functioning as a gate, the insulating layer 211 functioning as a gate insulating layer, the semiconductor layer 231 including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned at least between the conductive layer 223 and the channel formation region 231*i*. Furthermore, an insulating layer 218 covering the transistor may be provided.

FIG. 21B illustrates an example of the transistor 209 in which the insulating layer 225 covers the top surface and the side surface of the semiconductor layer 231. The conductive layer 222*a* and the conductive layer 222*b* are connected to the low-resistance regions 231*n* through openings provided in the insulating layer 225 and the insulating layer 215. One of the conductive layer 222*a* and the conductive layer 222*b* functions as a source, and the other functions as a drain.

Meanwhile, in the transistor 210 illustrated in FIG. 21C, the insulating layer 225 overlaps with the channel formation region 231*i* of the semiconductor layer 231 and does not overlap with the low-resistance regions 231*n*. The structure illustrated in FIG. 21C can be formed by processing the insulating layer 225 with the conductive layer 223 as a mask, for example. In FIG. 21C, the insulating layer 215 is provided to cover the insulating layer 225 and the conductive layer 223, and the conductive layer 222*a* and the conductive layer 222*b* are connected to the low-resistance regions 231*n* through the openings in the insulating layer 215.

A connection portion 204 is provided in a region of the substrate 151 where the substrate 152 does not overlap. In the connection portion 204, the wiring 165 is electrically connected to the FPC 172 through a conductive layer 166 and a connection layer 242. An example is described in which the conductive layer 166 has a stacked-layer structure of a conductive film obtained by processing the same conductive film as the conductive layers 112*a*, 112*b*, and 112*d*, a conductive film obtained by processing the same conductive film as the conductive layers 126*a*, 126*b*, and 126*d*, and a conductive film obtained by processing the same conductive film as the conductive layers 129*a*, 129*b*, and 129*d*. The conductive layer 166 is exposed on the top surface of the connection portion 204. Thus, the connection portion 204 and the FPC 172 can be electrically connected to each other through the connection layer 242.

A light-blocking layer 135 is preferably provided on the surface of the substrate 152 that faces the substrate 151. The light-blocking layer 135 can be provided between adjacent light-emitting devices, in the connection portion 140, and in the circuit 164, for example. A variety of optical members can be provided on the outer surface of the substrate 152.

The material that can be used for the substrate 120 can be used for each of the substrate 151 and the substrate 152.

As the connection layer 242, an anisotropic conductive film (ACF), an anisotropic conductive paste (ACP), or the like can be used.

FIG. 22A, FIG. 22B, FIG. 23A, and FIG. 23B illustrate modification examples of the display device 100G. Note that the vicinity of the transistor is not illustrated.

FIG. 22A illustrates an example in which a color filter, not a lens, is provided over the light-emitting device. A red color filter 138R is provided over the light-emitting device 130R emitting red light, and a green color filter 138G is provided over the light-emitting device 130G emitting green light. Although not illustrated, a blue color filter is provided over a light-emitting device emitting blue light. With such a structure, the color purity of light emitted from the light-emitting device to the outside of the substrate 120 can be increased. Furthermore, providing a color filter can inhibit reflection by the display surface, so that a polarizing plate for preventing reflection is not necessarily provided.

Note that in the case where a color filter is used, a white-light-emitting device may be used as illustrated in FIG. 22B. A white-light-emitting device 130RW and a red color filter 138R are provided in a pixel emitting red light. A white-light-emitting device 130GW and a green color filter 138G are provided in a pixel emitting green light. Although not illustrated, a white-light-emitting device and a blue color filter are provided in a pixel emitting blue light.

As illustrated in FIG. 23A, a lens and a color filter may be provided to overlap with each other over the light-emitting device. For example, the light-blocking layer 135 and the lens 133 are formed over the substrate 152, and the planarization film 139 is formed over the light-blocking layer 135 and the lens 133. Then, over the planarization film 139, the color filters 138R and 138G can be formed in positions overlapping with the lens 133. Note that the blue color filter can be formed in a similar manner.

Alternatively, as illustrated in FIG. 23B, the lens 133 overlapping with the light-blocking layer 135, the color filters 138R and 138G, and the light-receiving device 150P is formed over the substrate 152, and the planarization film 139 is formed over the lens 133 overlapping with the light-blocking layer 135, the color filters 138R and 138G, and the light-receiving device 150P. Then, the lens 133 can be formed at each position overlapping with the color filters 138R and 138G over the planarization film 139. Note that the lens 133 can be formed in a position overlapping with the blue color filter in a similar manner.

Although FIG. 23A and FIG. 23B illustrate an example in which the light-emitting devices emitting red light and green light are used, a light-emitting device emitting white light may be used.

This embodiment can be combined with any of the other embodiments as appropriate.

Embodiment 5

In this embodiment, structure examples of a light-emitting device and a light-receiving device that can be used in a display apparatus of one embodiment of the present invention will be described.

Figure 24A:
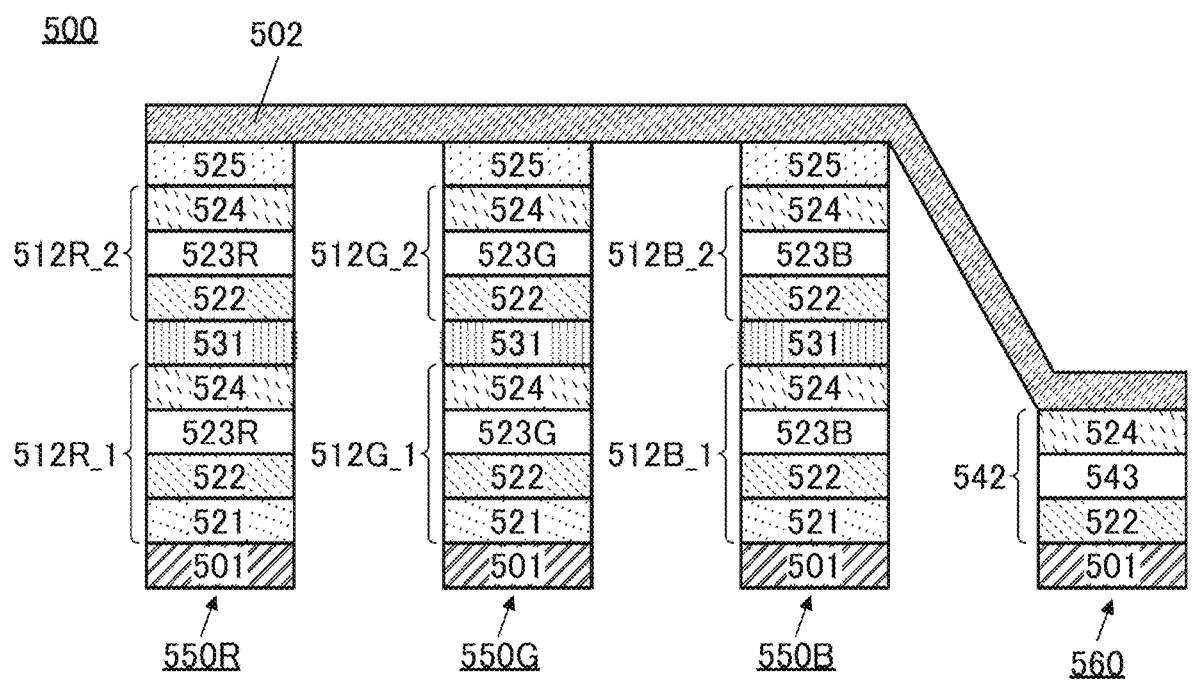
FIG. 24A and FIG. 24B are cross-sectional views illustrating examples of a display device.

FIG. 24A illustrates a schematic cross-sectional view of a display device 500. The display apparatus 500 includes a light-emitting device 550R emitting red light, a light-emitting device 550G emitting green light, a light-emitting device 550B emitting blue light, and a light-receiving device 560.

The light-emitting device 550R has a structure in which, between a pair of electrodes (an electrode 501 and an electrode 502), two light-emitting units (a light-emitting unit 512R_1 and a light-emitting unit 512R_2) are stacked with a charge-generation layer 531 therebetween. Similarly, the light-emitting device 550G includes a light-emitting unit 512G_1, the charge-generation layer 531, and a light-emitting unit 512G_2 between the pair of electrodes, and the light-emitting device 550B includes a light-emitting unit 512B_1, the charge-generation layer 531, and a light-emitting unit 512B_2 between the pair of electrodes.

The light-receiving device 560 includes one light-receiving unit 542 between the pair of electrodes (the electrode 501 and the electrode 502).

The electrode 501 functions as a pixel electrode and is provided in every light-emitting device and every light-receiving device. The electrode 502 functions as a common electrode and is shared by a plurality of light-emitting devices and a plurality of light-receiving devices.

As illustrated in FIG. 24A, the light-emitting unit 512R_1 includes a layer 521, a layer 522, a light-emitting layer 523R, and a layer 524. The light-emitting unit 512R_2 includes the layer 522, the light-emitting layer 523R, and the layer 524. The light-emitting device 550R includes a layer 525 and the like between the light-emitting unit 512R_2 and the electrode 502. Note that the layer 525 can also be regarded as part of the light-emitting unit 512R_2.

In the case where the electrode 501 functions as an anode and the electrode 502 functions as a cathode in the light-emitting device, the layer 521 includes, for example, a layer containing a substance with a high hole-injection property (a hole-injection layer). The layer 522 includes one or both of a layer containing a substance with a high hole-transport property (a hole-transport layer) and a layer containing a substance with a high electron-blocking property (an electron-blocking layer), for example. The layer 524 includes one or both of a layer containing a substance with a high electron-transport property (an electron-transport layer) and a layer containing a substance with a high hole-blocking property (a hole-blocking layer), for example. The layer 525 includes, for example, a layer containing a substance with a high electron-injection property (an electron-injection layer).

In the case where the electrode 501 functions as a cathode and the electrode 502 functions as an anode in the light-emitting device, for example, the layer 521 includes an electron-injection layer, the layer 522 includes one or both of an electron-transport layer and a hole-blocking layer, the layer 524 includes one or both of a hole-transport layer and an electron-blocking layer, and the layer 525 includes a hole-injection layer.

Note that in terms of the layer 522, the light-emitting layer 523R, and the layer 524, the light-emitting unit 512R_1 and the light-emitting unit 512R_2 may have the same structure (materials, thicknesses, and the like) or different structures.

Note that FIG. 24A explicitly illustrates the layer 521 and the layer 522 separately; however, one embodiment of the present invention is not limited thereto. For example, the layer 522 may be omitted when the layer 521 has functions of both a hole-injection layer and a hole-transport layer or the layer 521 has functions of both an electron-injection layer and an electron-transport layer.

In the case of manufacturing a light-emitting device having a tandem structure, two light-emitting units are stacked with the charge-generation layer 531 therebetween. The charge-generation layer 531 includes at least a charge-generation region. The charge-generation layer 531 has a function of injecting electrons into one of the light-emitting unit 512R_1 and the light-emitting unit 512R_2 and injecting holes into the other when voltage is applied between the electrode 501 and the electrode 502.

Note that the light-emitting layer 523R included in the light-emitting device 550R contains a light-emitting substance (also referred to as a light-emitting material) emitting red light, a light-emitting layer 523G included in the light-emitting device 550G contains a light-emitting substance emitting green light, and a light-emitting layer 523B included in the light-emitting device 550B contains a light-emitting substance emitting blue light. Note that the light-emitting device 550G and the light-emitting device 550B have a structure in which the light-emitting layer 523R included in the light-emitting device 550R is replaced with the light-emitting layer 523G and the light-emitting layer 523B, respectively, and the other components are similar to those of the light-emitting device 550R.

The structure (material, thickness, and the like) of the layer 521, the layer 522, the layer 524, and the layer 525 may be the same among the light-emitting devices of two or more or all of the colors or different from each other among the light-emitting devices of all the colors.

A structure in which a plurality of light-emitting units are connected in series with the charge-generation layer 531 therebetween as in the light-emitting device 550R, the light-emitting device 550G, and the light-emitting device 550B is referred to as a tandem structure in this specification. By contrast, a structure in which one light-emitting unit is provided between a pair of electrodes is referred to as a single structure. Note that a tandem structure may be referred to as a stack structure. The tandem structure enables a light-emitting device capable of high-luminance light emission. Furthermore, the tandem structure reduces the amount of current needed for obtaining the same luminance as compared with a single structure, and thus can improve the reliability of the light-emitting devices.

A structure where at least light-emitting layers of light-emitting devices are separately formed as in the light-emitting device 550R, the light-emitting device 550G, and the light-emitting device 550B is referred to as a side-by-side (SBS) structure in some cases. In the SBS structure, the material and the structure of each light-emitting device can be optimized and thus can extend freedom of choice of the materials and the structures, which makes it easy to improve the luminance and the reliability.

In the case where the display apparatus 500 of one embodiment of the present invention employs a light-emitting device with the tandem structure and the SBS structure, the display apparatus 500 can have both advantages of the tandem structure and the SBS structure. Note that the light-emitting device in the display device 500 illustrated in FIG. 24A has a structure in which two light-emitting units are formed in series, and this structure may be referred to as a two-unit tandem structure. In the light-emitting device 550R having a two-unit tandem structure illustrated in FIG. 24A, a second light-emitting unit including a red-light-emitting layer is stacked over a first light-emitting unit including a red-light-emitting layer. Similarly, in the light-emitting device 550G having a two-unit tandem structure illustrated in FIG. 24A, a second light-emitting unit including a green-light-emitting layer is stacked over a first light-emitting unit including a green-light-emitting layer, and in the light-emitting device 550B, a second light-emitting unit including a blue-light-emitting layer is stacked over a first light-emitting unit including a blue-light-emitting layer.

As illustrated in FIG. 12A, the light-receiving unit 542 included in the light-receiving device 560 includes the layer 522, an active layer 543, and the layer 524.

The active layer 543 functions as a photoelectric conversion layer. In the case where the electrode 501 functions as an anode and the electrode 502 functions as a cathode in the light-receiving device, for example, the layer 522 includes a hole-transport layer, and the layer 524 includes an electron-transport layer. In the case where the electrode 501 is a cathode and the electrode 502 is an anode, the above structures of the layer 522 and the layer 524 are switched.

Note that each of the layers 522 and 524 included in the light-receiving device may have the same structure (material, thickness, or the like) as the light-emitting devices of one or more or all colors or different from light-emitting devices of all colors.

Figure 24B:
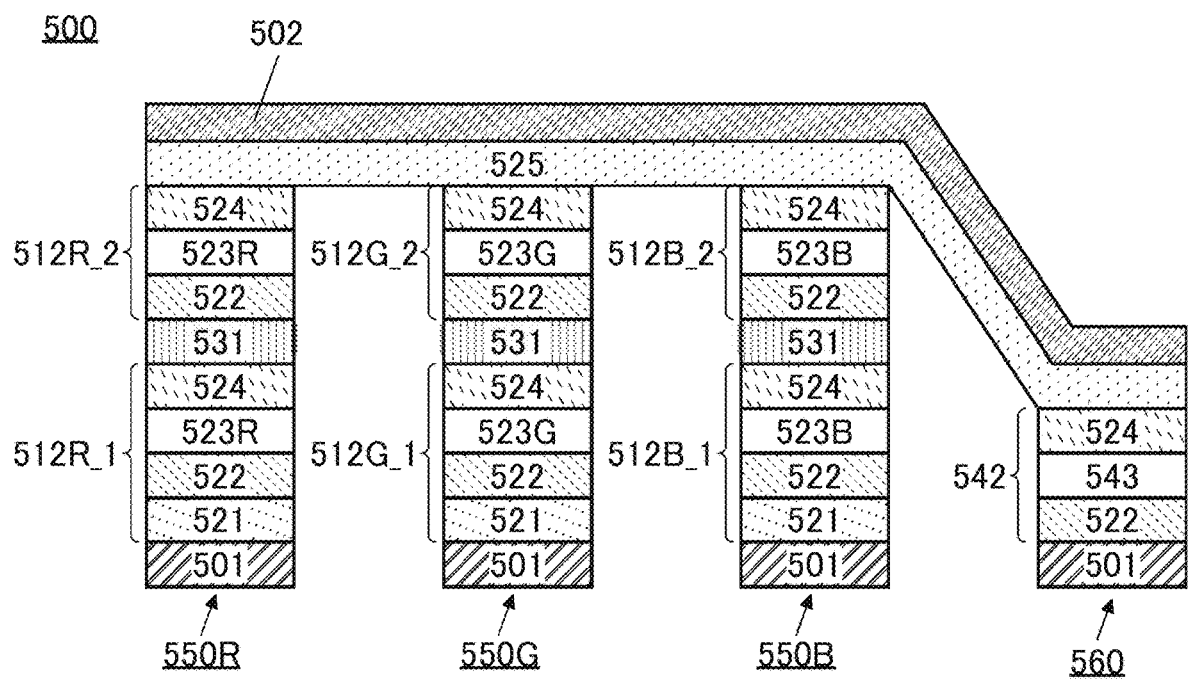

FIG. 24B is a modification example of the display device 500 illustrated in FIG. 24A. The display device 500 illustrated in FIG. 24B is an example in which, like the electrode 502, the layer 525 is shared by the plurality of light-emitting devices and the plurality of light-receiving devices. In this case, the layer 525 can be referred to as a common layer. By providing one or more common layers for the plurality of light-emitting devices and the plurality of light-receiving devices in this manner, the manufacturing process can be simplified, resulting in a reduction in manufacturing cost.

The layer 525 can function as an electron-injection layer in the light-emitting device and can function as an electron-transport layer in the light-receiving device 560, for example.

Figure 25A:
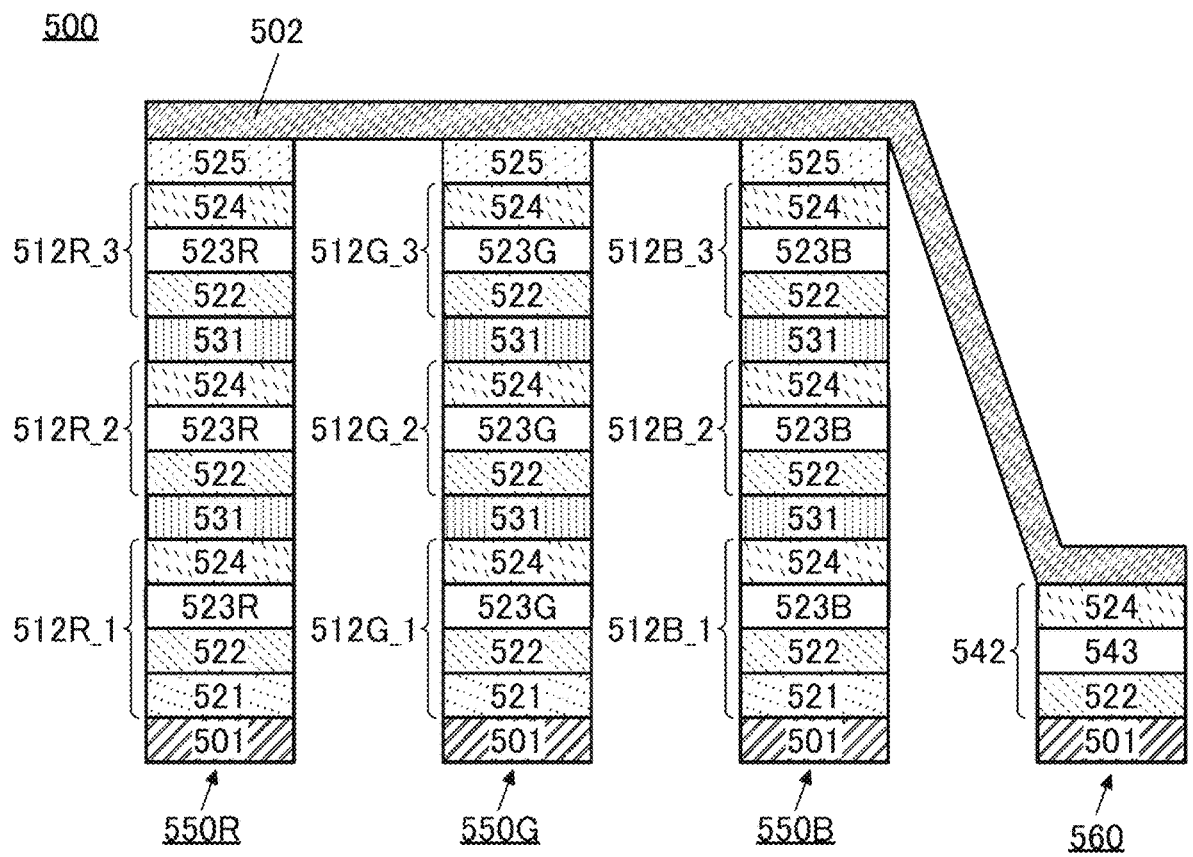
FIG. 25A and FIG. 25B are cross-sectional views illustrating examples of a display device.

The display device 500 illustrated in FIG. 25A is an example in which three light-emitting units are stacked in the light-emitting device. In the light-emitting device 550R in FIG. 25A, a light-emitting unit 512R_3 is further stacked over the light-emitting unit 512R_2 with the charge-generation layer 531 therebetween. The light-emitting unit 512R_3 has a structure similar to that of the light-emitting unit 512R_2. The same applies to a light-emitting unit 512G_3 included in the light-emitting device 550G and a light-emitting unit 512B_3 included in the light-emitting device 550B. Note that in the case where the light-emitting device includes a plurality of charge-generation layers 531, two or more or all of the plurality of charge-generation layers 531 may have the same structure (material, thickness, and the like) or may have structures that are completely different from each other.

Figure 25B:
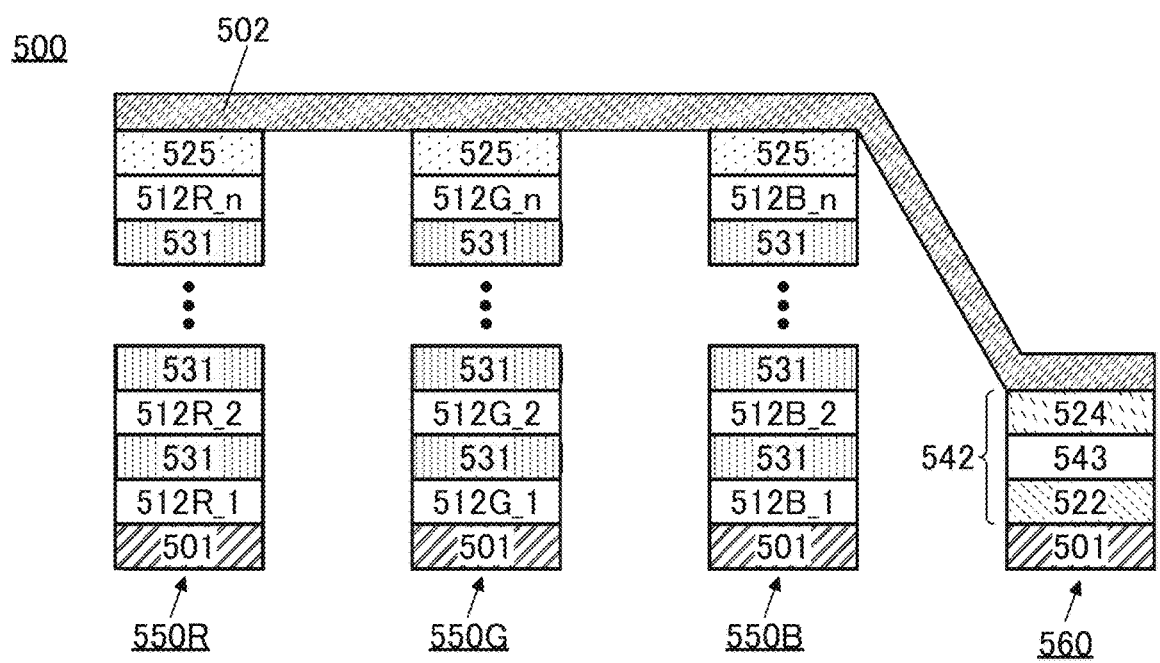

FIG. 25B illustrates an example in which n light-emitting units (n is an integer greater than or equal to 2) are stacked.

When the number of stacked light-emitting units is increased in the above manner, luminance obtained from the light-emitting device with the same amount of current can be increased in accordance with the number of stacked layers. Moreover, increasing the number of stacked light-emitting units can reduce current necessary for obtaining the same luminance; thus, power consumption of the light-emitting device can be reduced in accordance with the number of stacked layers.

Next, materials that can be used for the light-emitting device and the light-receiving device will be described.

A conductive film transmitting visible light is used for the electrode through which light from the light-emitting device is extracted, which is either the electrode 501 or the electrode 502. A conductive film that reflects visible light is preferably used as the electrode through which light is not extracted. In the case where a display apparatus includes a light-emitting device emitting infrared light, a conductive film transmitting visible light and infrared light is preferably used as the electrode through which light is extracted, and a conductive film reflecting visible light and infrared light is preferably used as the electrode through which light is not extracted.

A conductive film transmitting visible light may be used also for the electrode through which light is not extracted. In that case, the electrode is preferably placed between the reflective layer and the light-emitting unit which is the closest to the reflective layer. In other words, light emitted from the light-emitting layer may be reflected by the reflective layer and extracted from the display device.

As a material that forms the pair of electrodes of the light-emitting device and the light-receiving device, a metal, an alloy, an electrically conductive compound, a mixture thereof, and the like can be used as appropriate. Specific examples of the material include metals such as aluminum, magnesium, titanium, chromium, manganese, iron, cobalt, nickel, copper, gallium, zinc, indium, tin, molybdenum, tantalum, tungsten, palladium, gold, platinum, silver, yttrium, and neodymium, and an alloy containing any of these metals in appropriate combination. The examples of the material include indium tin oxide (In—Sn oxide, also referred to as ITO), In—Si—Sn oxide (also referred to as ITSO), indium zinc oxide (In—Zn oxide), and In—W—Zn oxide. The examples of the material include an alloy containing aluminum (aluminum alloy) such as an alloy of aluminum, nickel, and lanthanum (Al—Ni—La), and an alloy of silver, palladium, and copper (Ag—Pd—Cu, also referred to as APC). Other example of the material include elements belonging to Group 1 or Group 2 of the periodic table, which are not exemplified above (e.g., lithium, cesium, calcium, and strontium), rare earth metals such as europium and ytterbium, an alloy containing any of these metals in appropriate combination, and graphene.

The light-emitting device preferably employs a microcavity structure. Therefore, one of the pair of electrodes of the light-emitting device preferably includes an electrode having properties of transmitting and reflecting visible light (a transflective electrode), and the other preferably includes an electrode having a property of reflecting visible light (a reflective electrode). When the light-emitting device has a microcavity structure, light obtained from the light-emitting layer can be resonated between the electrodes, whereby light emitted from the light-emitting device can be intensified. The light-emitting and light-receiving device may employ a microcavity structure.

Note that the transflective electrode can have a stacked-layer structure of a conductive layer that can be used as a reflective electrode and a conductive layer having a visible-light-transmitting property (also referred to as a transparent electrode).

The light transmittance of the transparent electrode is higher than or equal to 40%. For example, an electrode having a visible light (light at wavelengths greater than or equal to 400 nm and less than 750 nm) transmittance higher than or equal to 40% is preferably used in the transparent electrode of the light-emitting device. The transflective electrode has a visible light reflectance higher than or equal to 10% and lower than or equal to 95%, preferably higher than or equal to 30% and lower than or equal to 80%. The reflective electrode has a visible light reflectance higher than or equal to 40% and lower than or equal to 100%, preferably higher than or equal to 70% and lower than or equal to 100%. These electrodes preferably have a resistivity less than or equal to $1\times10^{-2}$ Ωcm.

The light-emitting device includes at least the light-emitting layer. The light-emitting device may further include, as a layer other than the light-emitting layer, a layer containing a substance with a high hole-injection property, a substance with a high hole-transport property, a hole-blocking material, a substance with a high electron-transport property, an electron-blocking material, a substance with a high electron-injection property, a substance with a bipolar property (a substance with a high electron-transport property and a high hole-transport property), or the like. For example, the light-emitting device can include one or more of a hole-injection layer, a hole-transport layer, a hole-blocking layer, a charge-generation layer, an electron-blocking layer, an electron-transport layer, and an electron-injection layer in addition to the light-emitting layer.

Either a low molecular compound or a high molecular compound can be used in the light-emitting device, and an inorganic compound may be included. Each layer included in the light-emitting device can be formed, for example, by an evaporation method (including a vacuum evaporation method), a transfer method, a printing method, an inkjet method, or a coating method.

The light-emitting layer contains one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance emitting near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As the one or more kinds of organic compounds, one or both of a substance having a high hole-transport property (a hole-transport material) and a substance having a high electron-transport property (an electron-transport material) can be used. As the hole-transport material, it is possible to use a material with a high hole-transport property which can be used for the hole-transport layer and will be described later. As the electron-transport material, it is possible to use a material having a high electron-transport property which can be used for the electron-transport layer and will be described later. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

The hole-injection layer is a layer that injects holes from an anode to the hole-transport layer and contains a material with a high hole-injection property. Examples of a material with a high hole-injection property include an aromatic amine compound and a composite material containing a hole-transport material and an acceptor material (electron-accepting material).

As the hole-transport material, it is possible to use a material with a high hole-transport property which can be used for the hole-transport layer and will be described later.

As the acceptor material, an oxide of a metal belonging to any of Group 4 to Group 8 of the periodic table can be used, for example. As specific examples, molybdenum oxide, vanadium oxide, niobium oxide, tantalum oxide, chromium oxide, tungsten oxide, manganese oxide, and rhenium oxide can be given. Among these, molybdenum oxide is especially preferable because it is stable in the air, has a low hygroscopic property, and is easy to handle. Alternatively, an organic acceptor material containing fluorine can be used. Alternatively, organic acceptor materials such as a quinodimethane derivative, a chloranil derivative, and a hexaazatriphenylene derivative can also be used.

For example, a hole-transport material and a material containing an oxide of a metal belonging to Group 4 to Group 8 of the periodic table (typically, molybdenum oxide) may be used as the material having a high hole-injection property.

The hole-transport layer is a layer transporting holes, which are injected from the anode by the hole-injection layer, to the light-emitting layer. The hole-transport layer is a layer that contains a hole-transport material. As the hole-transport material, a substance having a hole mobility greater than or equal to $1 \times 10^{-6}$ cm$^2$/Vs is preferable. Note that other substances can also be used as long as they have a property of transporting more holes than electrons. As the hole-transport material, materials with a high hole-transport property, such as a Tc-electron rich heteroaromatic compound (e.g., a carbazole derivative, a thiophene derivative, and a furan derivative) and an aromatic amine (a compound having an aromatic amine skeleton), are preferable.

The electron-blocking layer is provided in contact with the light-emitting layer. The electron-blocking layer has a hole-transport property and contains a material capable of blocking electrons. Any of the materials having an electron-blocking property among the above hole-transport materials can be used for the electron-blocking layer.

The electron-blocking layer has a hole-transport property, and thus can also be referred to as a hole-transport layer. A layer having an electron-blocking property among the hole-transport layers can also be referred to as an electron-blocking layer.

The electron-transport layer is a layer transporting electrons, which are injected from the cathode by the electron-injection layer, to the light-emitting layer. The electron-transport layer is a layer that contains an electron-transport material. As the electron-transport material, a substance having an electron mobility greater than or equal to $1 \times 10^{-6}$ cm$^2$/Vs is preferable. Note that other substances can also be used as long as they have a property of transporting more electrons than holes. As the electron-transport material, it is possible to use a material with a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The hole-blocking layer is provided in contact with the light-emitting layer. The hole-blocking layer is a layer having an electron-transport property and containing a material that can block holes. Any of the materials having a hole-blocking property among the above electron-transport materials can be used for the hole-blocking layer.

The hole-blocking layer has an electron-transport property, and thus can also be referred to as an electron-transport layer. A layer having a hole-blocking property among the electron-transport layers can also be referred to as a hole-blocking layer.

The electron-injection layer is a layer that injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The difference between the LUMO level of the material having a high electron-injection property and the work function value of the material used for the cathode is preferably small (specifically, smaller than or equal to 0.5 eV).

The electron-injection layer can be formed using an alkali metal, an alkaline earth metal, or a compound thereof, such as lithium, cesium, ytterbium, lithium fluoride (LiF), cesium fluoride (CsF), calcium fluoride ($CaF_x$, where X is a given number), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide ($LiO_x$), or cesium carbonate, for example. The electron-injection layer may have a stacked-layer structure of two or more layers. In the stacked-layer structure, for example, lithium fluoride can be used for the first layer and ytterbium can be used for the second layer.

The electron-injection layer may contain an electron-transport material. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, or a pyridazine ring), and a triazine ring.

Note that the lowest unoccupied molecular orbital (LUMO) level of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen, diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition point (Tg) than BPhen and thus has high heat resistance.

As described above, the charge-generation layer includes at least a charge-generation layer. The charge-generation region preferably contains an acceptor material, and for example, a layer containing a hole-transport material and an acceptor material which can be used for the above-described hole-injection layer is preferably used.

The charge-generation layer preferably includes a layer containing a material having a high electron-injection property. The layer can also be referred to as an electron-injection buffer layer. The electron-injection buffer layer is preferably provided between the charge-generation region and the electron-transport layer. By provision of the electron-injection buffer layer, an injection barrier between the charge-generation region and the electron-transport layer can be lowered; thus, electrons generated in the charge-generation region can be easily injected into the electron-transport layer.

The electron-injection buffer layer preferably contains an alkali metal or an alkaline earth metal, and for example, can be configured to contain an alkali metal compound or an alkaline earth metal compound. Specifically, the electron-injection buffer layer preferably contains an inorganic compound containing an alkali metal and oxygen or an inorganic compound containing an alkaline earth metal and oxygen, further preferably contains an inorganic compound containing lithium and oxygen (e.g., lithium oxide ($Li_2O$)). Alternatively, a material that can be used for the electron-injection layer can be favorably used for the electron-injection buffer layer.

The charge-generation layer preferably includes a layer containing a material having a high electron-transport property. The layer can also be referred to as an electron-relay layer. The electron-relay layer is preferably provided between the charge-generation region and the electron-injection buffer layer. In the case where the charge-generation region does not include an electron-injection buffer layer, the electron-relay layer is preferably provided between the charge-generation region and the electron-transport layer. The electron-relay layer has a function of preventing interaction between the charge-generation region and the electron-injection buffer layer (or the electron-transport layer) and smoothly transferring electrons.

A phthalocyanine-based material such as copper(II) phthalocyanine (abbreviation: CuPc) or a metal complex having a metal-oxygen bond and an aromatic ligand is preferably used for the electron-relay layer.

Note that the charge-generation region, the electron-injection buffer layer, and the electron-relay layer cannot be clearly distinguished from each other in some cases on the basis of the cross-sectional shapes, properties, or the like.

Note that the charge-generation layer may contain a donor material instead of an acceptor material. For example, the charge-generation layer may include a layer containing an electron-transport material and a donor material, which can be used for the electron-injection layer.

When the light-emitting units are stacked, provision of a charge-generation layer between two light-emitting units can suppress an increase in driving voltage.

Note that there is no particular limitation on the light-emitting material of the light-emitting layer in the display device 500 illustrated in FIG. 24A. For example, the display device in FIG. 24A can have a structure in which the two light-emitting layers 523R included in the light-emitting device 550R each contain a phosphorescent material, the two light-emitting layers 523G included in the light-emitting device 550G each contain a fluorescent material, and the two light-emitting layers 523B included in the light-emitting device 550B each contain a fluorescent material.

Alternatively, for example, the display device in FIG. 24A can have a structure in which the two light-emitting layers 523R included in the light-emitting device 550R each contain a phosphorescent material, the two light-emitting layers 523G included in the light-emitting device 550G each contain a fluorescent material, and the two light-emitting layers 523B included in the light-emitting device 550B each contain a phosphorescent material.

For the display device of one embodiment of the present invention, a structure may be employed in which fluorescent materials are used for all the light-emitting layers included in the light-emitting device 550R, the light-emitting device 550G, and the light-emitting device 550B or a structure may be employed in which phosphorescent materials are used for all the light-emitting layers included in the light-emitting device 550R, the light-emitting device 550G, and the light-emitting device 550B.

In FIG. 24A, for example, the structure may be employed in which the light-emitting layer 523R included in the light-emitting unit 512R_1 contains a phosphorescent material and the light-emitting layer 523R included in the light-emitting unit 512R_2 contains a fluorescent material, or a structure in which the light-emitting layer 523R included in the light-emitting unit 512R_1 contains a fluorescent material and the light-emitting layer 523R included in the light-emitting unit 512R_2 contains a phosphorescent material, i.e., a structure in which a light-emitting layer in a first unit and a light-emitting layer in a second unit are formed using different light-emitting materials. Note that here, the light-emitting unit 512R_1 and the light-emitting unit 512R_2 are described, and the same structure can also be applied to the light-emitting unit 512G_1 and the light-emitting unit 512G_2, and the light-emitting unit 512B_1 and the light-emitting unit 512B_2.

Either a low molecular compound or a high molecular compound can be used for the light-receiving device, and an inorganic compound may also be contained. Each layer included in the light-receiving device can be formed, for example, by an evaporation method (including a vacuum evaporation method), a transfer method, a printing method, an inkjet method, or a coating method.

The active layer included in the light-receiving device contains a semiconductor. The active layer included in the light-receiving device includes a semiconductor. This embodiment describes an example where an organic semiconductor is used as the semiconductor included in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer are electron-accepting organic semiconductor materials such as fullerene (e.g., $C_{60}$ and $C_{70}$) and fullerene derivatives. Examples of fullerene derivatives include [6,6]-Phenyl-$C_{71}$-butyric acid methyl ester (abbreviation: PC70BM), [6,6]-Phenyl-$C_{61}$-butyric acid methyl ester (abbreviation: PC60BM), and 1',1'',4',4''-Tetrahydro-di[1,4]methanonaphthaleno[1,2:2',3',56,60:2'',3''][5,6]fullerene-$C_{60}$ (abbreviation: ICBA).

Examples of the n-type semiconductor material include perylenetetracarboxylic acid derivatives such as N,N-dimethyl-3,4,9,10-perylenetetracarboxylic diimide (abbreviation: Me-PTCDI) and 2,2'-(5,5'-(thieno[3,2-b]thiophene-2,5-diyl)bis(thiophene-5,2-diyl))bis(methan-1-yl-1-ylidene) dimalononitrile (abbreviation: FT2TDMN).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), quinacridone, and rubrene.

Other examples of a p-type semiconductor material include a carbazole derivative, a thiophene derivative, a furan derivative, and a compound having an aromatic amine skeleton. Other examples of a p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a rubrene derivative, a tetracene derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For the active layer, a high molecular compound such as Poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]]polymer (abbreviation: PBDB-T) or a PBDB-T derivative, which functions as a donor, can be used. For example, a method in which an acceptor material is dispersed to PBDB-T or a PBDB-T derivative can be used.

For example, the active layer is preferably formed by co-evaporation of an n-type semiconductor and a p-type semiconductor. Alternatively, the active layer may be formed by stacking an n-type semiconductor and a p-type semiconductor.

Three or more kinds of materials may be mixed for the active layer. For example, a third material may be mixed with an n-type semiconductor material and a p-type semiconductor material in order to extend the wavelength range. In this case, the third material may be a low molecular compound or a high molecular compound.

In addition to the active layer, the light-receiving device may further include a layer containing a substance having a high hole-transport property, a substance having a high electron-transport property, a substance having a bipolar property (a substance having a high electron- and hole-transport property), or the like. For example, the light-receiving device can include one or both of a hole-transport layer and an electron-transport layer in addition to the active layer. Without limitation to the above, the light-receiving device may further include a layer containing any of a substance with a high hole-injection property, a hole-blocking material, a material with a high electron-injection property, an electron-blocking material, and the like. Layers other than the active layer in the light-receiving device can be formed using a material that can be used for the light-emitting device.

As the hole-transport material or the electron-blocking material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material or the hole-blocking material, an inorganic compound such as zinc oxide (ZnO), or an organic compound such as polyethylenimine ethoxylate (PEIE) can be used. The light-receiving device may include a mixed film of PEIE and ZnO, for example.

This embodiment can be combined with any of the other embodiments as appropriate.

Embodiment 6

In this embodiment, a display device having a light detection function of one embodiment of the present invention will be described.

In the display device of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by detecting light with the display portion, an image can be captured or the proximity or contact of a target (e.g., a finger, a hand, or a pen) can be detected.

Furthermore, in the display device of one embodiment of the present invention, the light-emitting devices can be used as a light source of the sensor. In the display device of one embodiment of the present invention, when an object reflects (or scatters) light emitted by the light-emitting device included in the display portion, the light-receiving device can detect reflected light (or scattered light); thus, image capturing or touch detection is possible even in a dark place.

Accordingly, a light-receiving portion and a light source do not need to be provided separately from the display device; hence, the number of components of an electronic device can be reduced. For example, a biometric authentication device, a capacitive touch panel for scroll operation, or the like is not necessarily provided separately from the electronic device. Thus, with the use of the display device of one embodiment of the present invention, the electronic device can be provided with reduced manufacturing cost.

Specifically, the display device of one embodiment of the present invention includes a light-emitting device and a light-receiving device in a pixel. In the display device of one embodiment of the present invention, an organic EL device is used as the light-emitting device, and an organic photodiode is used as the light-receiving device. The organic EL device and the organic photodiode can be formed over the same substrate. Thus, the organic photodiode can be incorporated in the display device using the organic EL device.

In the display device including the light-emitting device and the light-receiving device in the pixel, the pixel has a light-receiving function; thus, the display device can detect the contact or proximity of an object while displaying an image. For example, all the subpixels included in the display device can display an image; alternatively, some of the subpixels can emit light as a light source, some of the rest of the subpixels can detect light, and the other subpixels can display an image.

In the case where the light-receiving device is used as an image sensor, the display device can capture an image with the use of the light-receiving device. For example, the display device of this embodiment can be used as a scanner.

For example, image capturing for personal authentication with the use of a fingerprint, a palm print, the iris, the shape of a blood vessel (including the shape of a vein and the shape of an artery), a face, or the like can be performed using the image sensor.

For example, an image of the periphery, surface, or inside (e.g., fundus) of an eye of a user of a wearable device can be captured using the image sensor. Therefore, the wearable device can have a function of detecting one or more selected from blinking, movement of an iris, and movement of an eyelid of the user.

The light-receiving device can be used for a touch sensor (also referred to as a direct touch sensor), a near touch sensor (also referred to as a hover sensor, a hover touch sensor, a contactless sensor, or a touchless sensor), or the like.

Here, the touch sensor or the near touch sensor can detect the proximity or contact of an object (e.g., a finger, a hand, or a pen).

The touch sensor can detect an object when the display device and the object come in direct contact with each other. The near touch sensor can detect an object even when the object is not in contact with the display device. For example, the display device is preferably capable of detecting an object when the distance between the display device and the object is greater than or equal to 0.1 mm and less than or equal to 300 mm, preferably greater than or equal to 3 mm and less than or equal to 50 mm. With this structure, the display device can be controlled without an object directly contacting with the display device. In other words, the display device can be controlled in a contactless (touchless) manner. With the above structure, the display device can have a reduced risk of being dirty or damaged, or can be operated without the object directly contacting with a dirt (e.g., dust or a virus) attached to the display device.

The refresh rate can be variable in the display device of one embodiment of the present invention. For example, the refresh rate is adjusted (adjusted in the range of 1 Hz to 240 Hz, for example) in accordance with contents displayed on the display device, whereby power consumption can be reduced. The driving frequency of the touch sensor or the near touch sensor may be changed in accordance with the refresh rate. For example, when the refresh rate of the display device is 120 Hz, the driving frequency of the touch sensor or the near touch sensor can be higher than 120 Hz (can typically be 240 Hz). With this structure, low power consumption can be achieved, and the response speed of the touch sensor or the near touch sensor can be increased.

In the display device of one embodiment of the present invention, a lens can be provided over the light-receiving device. When the width of the lens is larger than the width of the light-receiving portion, the light-condensing intensity can be increased, and the light sensitivity of the light-receiving device can be improved.

Figure 26A:
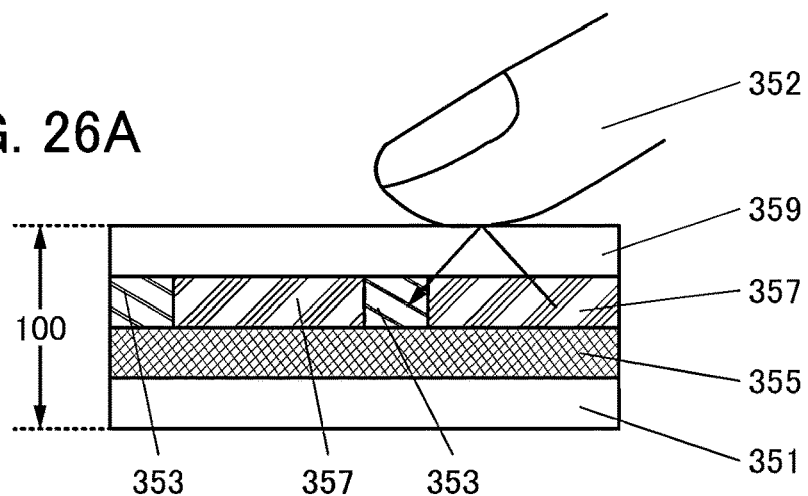
FIG. 26A to FIG. 26C are diagrams illustrating structure examples of a display device.
Figure 26B:
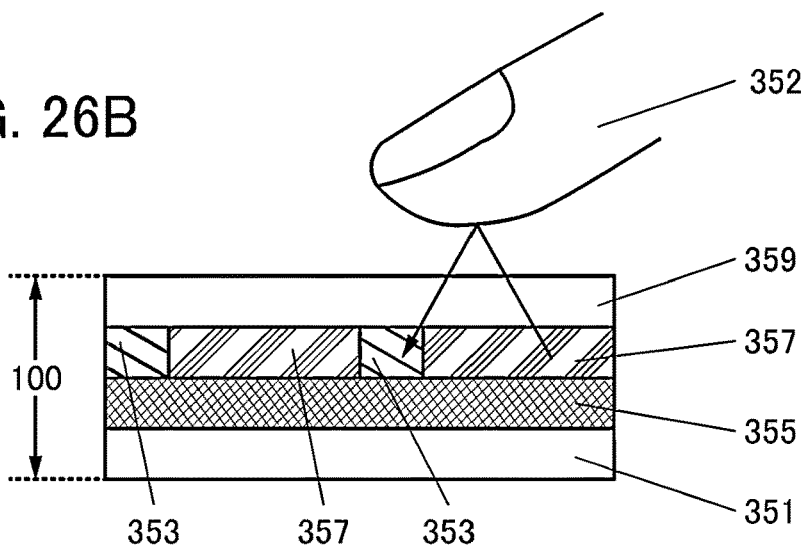
Figure 26C:
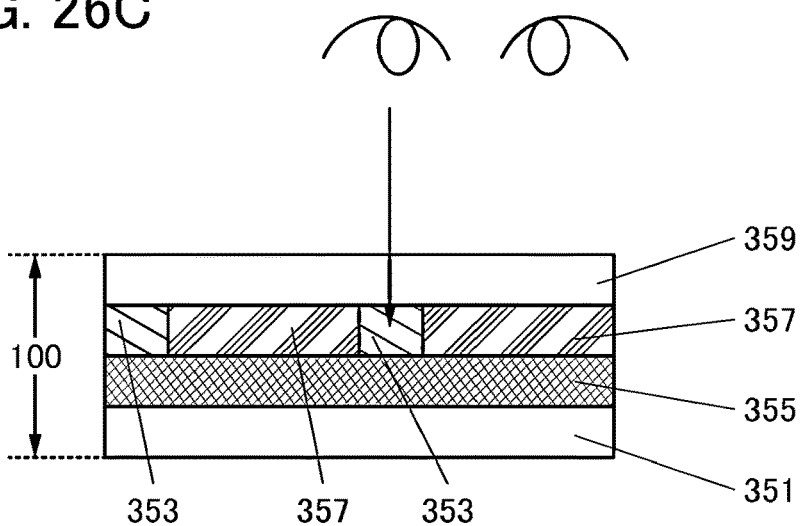

The display device 100 illustrated in FIG. 26A to FIG. 26C includes a layer 353 including a light-receiving device, a functional layer 355, and a layer 357 including a light-emitting device, between a substrate 351 and a substrate 359.

The functional layer 355 includes a circuit for driving a light-receiving device and a circuit for driving a light-emitting device. One or more of a switch, a transistor, a capacitor, a resistor, a wiring, a terminal, and the like can be provided in the functional layer 355. Note that in the case where the light-emitting device and the light-receiving device are driven by a passive-matrix method, a structure including neither a switch nor a transistor may be employed.

For example, after light emitted by the light-emitting device in the layer 357 including the light-emitting device is reflected by a finger 352 in contact with the display device 100 as illustrated in FIG. 26A, the light-receiving device in the layer 353 including the light-receiving device detects the reflected light. Thus, the contact of the finger 352 with the display device 100 can be detected.

Alternatively, the display device may have a function of detecting an object that is close to (i.e., not touching) the display device as illustrated in FIG. 26B and FIG. 26C or capturing an image of such an object. FIG. 26B illustrates an example where a human finger is detected, and FIG. 26C illustrates an example where information on the periphery, surface, or inside of the human eye (e.g., the number of blinks, movement of an eyeball, and movement of an eyelid) is detected.

This embodiment can be combined with any of the other embodiments as appropriate.

Embodiment 7

In this embodiment, electronic devices of embodiments of the present invention are described with reference to FIG. 27 to FIG. 29.

Electronic devices of this embodiment each include the display device of one embodiment of the present invention in a display portion. The display device of one embodiment of the present invention can be easily increased in resolution and definition. Thus, the display device of one embodiment of the present invention can be used for a display portion of a variety of electronic devices.

Examples of the electronic devices include electronic devices with a relatively large screen, such as a television device, a desktop or notebook personal computer, a monitor of a computer or the like, digital signage, and a large game machine such as a pachinko machine; a digital camera; a digital video camera; a digital photo frame; a mobile phone; a portable game console; a portable information terminal; and an audio reproducing device.

In particular, the display device of one embodiment of the present invention can have a high resolution, and thus can be suitably used for an electronic device having a relatively small display portion. Examples of such an electronic device include a watch-type or a bracelet-type information terminal device (wearable device), and a wearable device worn on a head, such as a device for VR such as a head-mounted display, a glasses-type device for AR, and a device for MR.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a definition of 4K, 8K, or higher is preferable. The pixel density (resolution) of the display device of one embodiment of the present invention is preferably higher than or equal to 100 ppi, further preferably higher than or equal to 300 ppi, still further preferably higher than or equal to 500 ppi, yet still further preferably higher than or equal to 1000 ppi, yet still further preferably higher than or equal to 2000 ppi, yet still further preferably higher than or equal to 3000 ppi, yet still further preferably higher than or equal to 5000 ppi, yet still further preferably higher than or equal to 7000 ppi. With the use of such a display device having one or both of high definition and high resolution, the electronic device can provide higher realistic sensation, sense of depth, and the like. There is no particular limitation on the screen ratio (aspect ratio) of the display device of one embodiment of the present invention. For example, the display device is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of a wearable device that can be worn on a head are described with reference to FIG. 27A to FIG. 27D. These wearable devices have at least one of a function of displaying AR contents, a function of displaying VR contents, a function of displaying SR contents, and a function of displaying MR contents. The electronic device having a function of displaying contents of at least one of AR, VR, SR, MR, and the like enables the user to feel a higher sense of immersion.

Figure 27A:
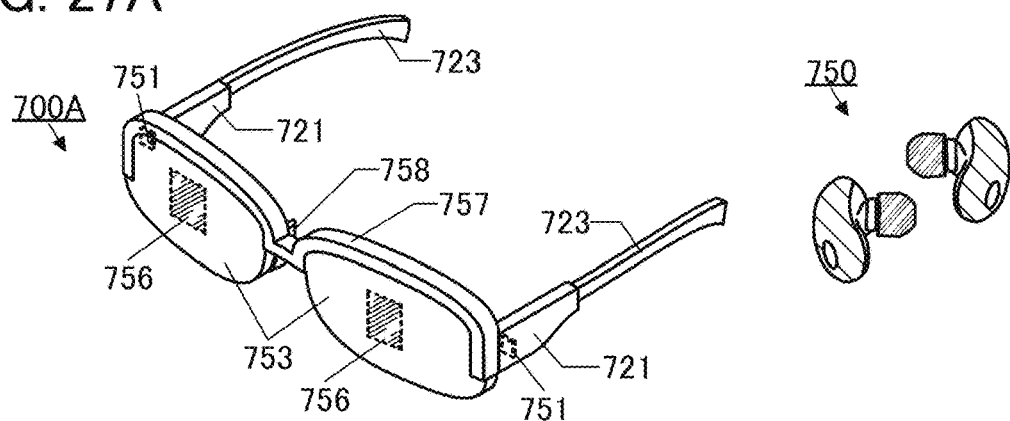
FIG. 27A to FIG. 27D are diagrams illustrating examples of electronic devices.
Figure 27B:
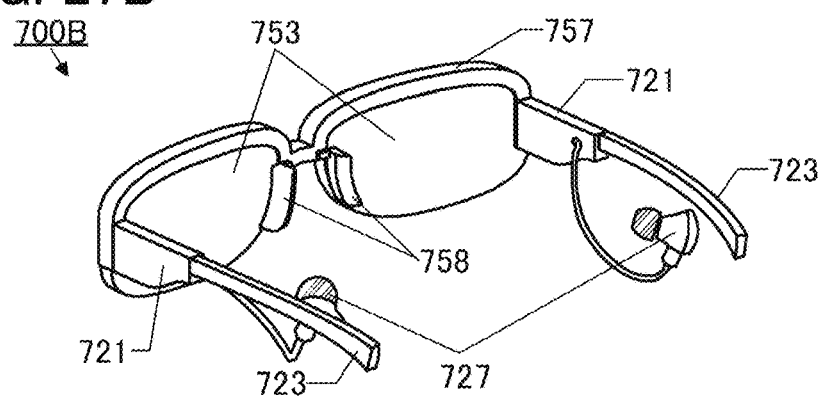

An electronic device 700A illustrated in FIG. 27A and an electronic device 700B illustrated in FIG. 27B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display device of one embodiment of the present invention can be used for the display panels 751. Thus, the electronic device with extremely high resolution can be achieved. Since light emitted from the light-emitting portion is extracted through a lens in the display device of one embodiment of the present invention, light extraction efficiency can be increased and an extremely bright image can be displayed. Thus, in the case of using the display device as an electronic device capable of AR display, an image with high visibility can be displayed even under intense external light.

In the case where the display device includes a light-receiving device, the light-receiving device can capture an image of an eye and perform the iris authentication. In addition, the light-receiving device can perform eye tracking. With eye tracking, an object or location at which a user looks can be specified, so that selection of the functions of the electronic device, execution of software, and the like can be performed.

The electronic device 700A and the electronic device 700B can each project images displayed on the display panels 751 onto display regions 756 of the optical members 753. Since the optical members 753 have a light-transmitting property, a user can see images displayed on the display regions, which are superimposed on transmission images seen through the optical members 753. Accordingly, the electronic device 700A and the electronic device 700B are electronic devices capable of AR display.

In the electronic device 700A and the electronic device 700B, a camera capable of capturing images of the front side may be provided as the image capturing portion. Furthermore, when the electronic device 700A and the electronic device 700B are provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Instead of or in addition to the wireless communication device, a connector that can be connected to a cable for supplying a video signal and a power supply potential may be provided.

The electronic device 700A and the electronic device 700B are provided with a battery so that they can be charged wirelessly and/or by wire.

A touch sensor module may be provided in the housing 721. The touch sensor module has a function of detecting a touch on the outer surface of the housing 721. Detecting a tap operation, a slide operation, or the like by the user with the touch sensor module enables executing various types of processing. For example, processing such as a pause or a restart of a moving image can be executed by a tap operation, and processing such as fast forward and fast rewind can be executed by a slide operation. When the touch sensor module is provided in each of the two housings 721, the range of the operation can be increased.

Any of various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion device (also referred to as a photoelectric conversion element) can be used as a light-receiving device. One or both of an inorganic semiconductor and an organic semiconductor can be used for an active layer of the photoelectric conversion device.

Figure 27C:
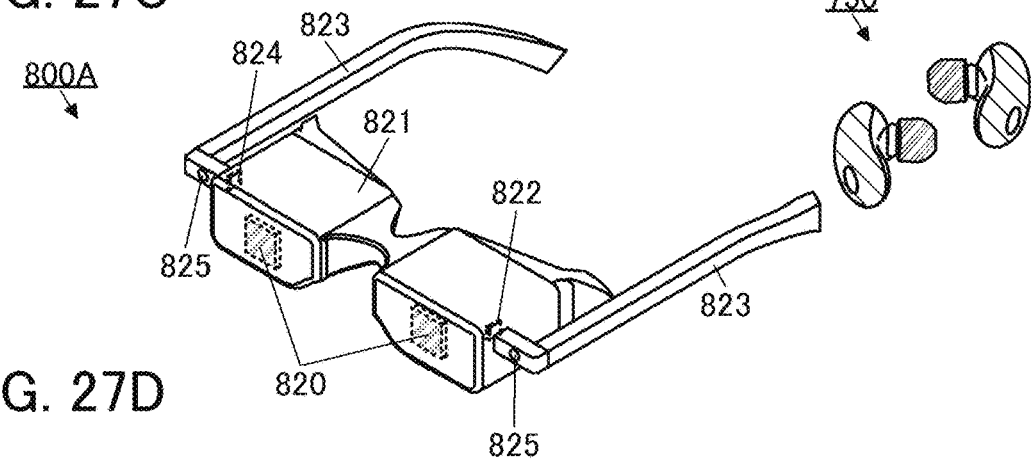
Figure 27D:
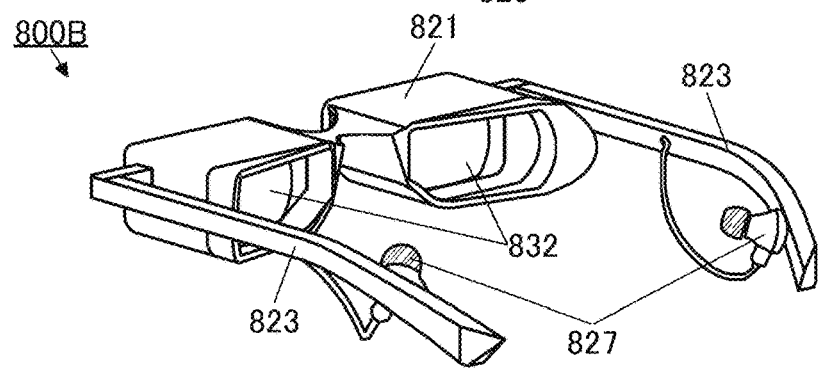

An electronic device 800A illustrated in FIG. 27C and an electronic device 800B illustrated in FIG. 27D each include a pair of display portions 820, a housing 821, a communication portion 822, a pair of wearing portions 823, a control portion 824, a pair of image capturing portions 825, and a pair of lenses 832.

The display device of one embodiment of the present invention can be used in the display portions 820. Thus, the electronic devices are capable of performing ultrahigh-resolution display. Such electronic devices provide an enhanced sense of immersion to the user.

The display portions 820 are positioned inside the housing 821 so as to be seen through the lenses 832. When the pair of display portions 820 display different images, three-dimensional display using parallax can be performed.

The electronic device 800A and the electronic device 800B can be regarded as electronic devices for VR. The user who wears the electronic device 800A or the electronic device 800B can see images displayed on the display portions 820 through the lenses 832.

The electronic device 800A and the electronic device 800B preferably include a mechanism for adjusting the lateral positions of the lenses 832 and the display portions 820 so that the lenses 832 and the display portions 820 are positioned optimally in accordance with the positions of the user's eyes. Moreover, the electronic device 800A and the electronic device 800B preferably include a mechanism for adjusting focus by changing the distance between the lenses 832 and the display portions 820.

The electronic device 800A or the electronic device 800B can be worn on the user's head with the wearing portions 823. FIG. 27C or the like illustrates an example where the wearing portion 823 has a shape like a temple (also referred to as a joint or the like) of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to cover a plurality of fields of view, such as a telescope field of view and a wide field of view.

Although an example where the image capturing portions 825 are provided is described here, a range sensor capable of measuring a distance from an object (hereinafter also referred to as a sensing portion) just needs to be provided. In other words, the image capturing portion 825 is one embodiment of the sensing portion. As the sensing portion, an image sensor or a distance image sensor such as LIDAR (Light Detection and Ranging) can be used, for example. By using images obtained by the camera and images obtained by the range image sensor, more information can be obtained and a gesture operation with higher accuracy is possible.

The electronic device 800A may include a vibration mechanism that functions as bone-conduction earphones. For example, any one or more of the display portion 820, the housing 821, and the wearing portion 823 can employ a structure including the vibration mechanism. Thus, without additionally requiring an audio device such as headphones, earphones, or a speaker, the user can enjoy video and sound only by wearing the electronic device 800A.

The electronic device 800A and the electronic device 800B may each include an input terminal. To the input terminal, a cable for supplying a video signal from a video output device or the like, power for charging the battery provided in the electronic device, and the like can be connected.

The electronic device of one embodiment of the present invention may have a function of performing wireless communication with earphones 750. The earphones 750 include a communication portion (not illustrated) and have a wireless communication function. The earphones 750 can receive information (e.g., audio data) from the electronic device with the wireless communication function. For example, the electronic device 700A in FIG. 27A has a function of transmitting information to the earphones 750 with the wireless communication function. For another example, the electronic device 800A illustrated in FIG. 27C has a function of transmitting information to the earphones 750 with the wireless communication function.

The electronic device may include an earphone portion. The electronic device 700B in FIG. 27B includes earphone portions 727. For example, the earphone portion 727 and the control portion can be connected to each other by wire. Part of a wiring that connects the earphone portion 727 and the control portion may be positioned inside the housing 721 or the wearing portion 723.

Similarly, the electronic device 800B illustrated in FIG. 27D includes earphone portions 827. For example, the earphone portion 827 and the control portion 824 can be connected to each other by wire. Part of a wiring that connects the earphone portion 827 and the control portion 824 may be positioned inside the housing 821 or the wearing portion 823. Alternatively, the earphone portions 827 and the wearing portions 823 may include magnets. This is preferable because the earphone portions 827 can be fixed to the wearing portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of what is called a headset by including the audio input mechanism.

As described above, both the glasses-type device (e.g., the electronic device 700A and the electronic device 700B) and the goggles-type device (e.g., the electronic device 800A and the electronic device 800B) are preferable as the electronic device of one embodiment of the present invention.

The electronic device of one embodiment of the present invention can transmit information to earphones by wire or wirelessly.

Figure 28A:
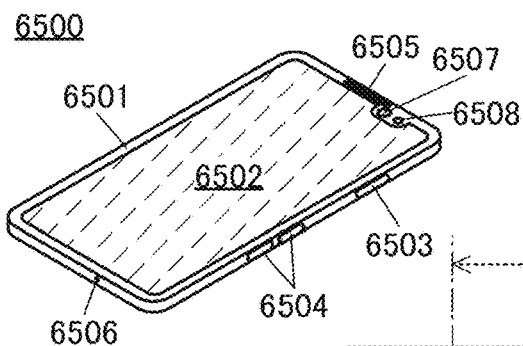
FIG. 28A to FIG. 28F are diagrams illustrating examples of electronic devices.

An electronic device 6500 illustrated in FIG. 28A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used for the display portion 6502. Since light emitted from the light-emitting portion is extracted through a lens in the display device of one embodiment of the present invention, light extraction efficiency can be increased and an extremely bright image can be displayed.

Figure 28B:
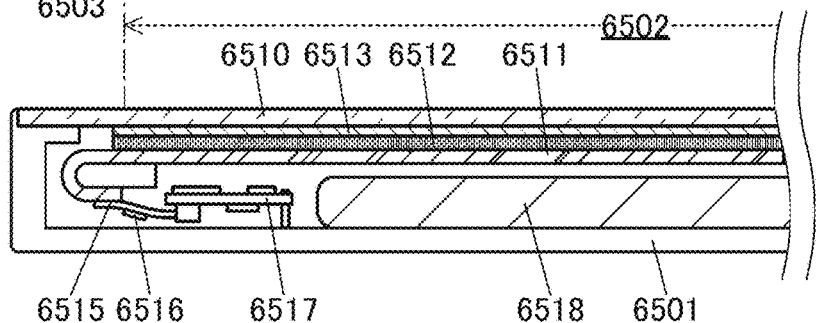

FIG. 28B is a schematic cross-sectional view including an end portion of the housing 6501 on the microphone 6506 side.

A protection member 6510 having a light-transmitting property is provided on a display surface side of the housing 6501, and a display device 6511, an optical member 6512, a touch sensor panel 6513, a printed circuit board 6517, a battery 6518, and the like are provided in a space surrounded by the housing 6501 and the protection member 6510.

The display device 6511, the optical member 6512, and the touch sensor panel 6513 are fixed to the protection member 6510 with an adhesive layer (not illustrated). The light-receiving device of the display apparatus of one embodiment of the present invention can have the function of the touch sensor panel. The light-receiving device of the display apparatus of one embodiment of the present invention is configured to detect light through a lens, has high sensitivity to light, and excels in detecting a touched position. Moreover, an image for fingerprint authentication can be obtained with the use of the light-receiving device.

Part of the display device 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display device 6511. Thus, an extremely lightweight electronic device can be achieved. Since the display device 6511 is extremely thin, the battery 6518 with high capacity can be mounted without an increase in the thickness of the electronic device. Moreover, part of the display device 6511 is folded back so that a connection portion with the FPC 6515 is provided on the back side of a pixel portion, whereby an electronic device with a narrow bezel can be achieved.

Figure 28C:
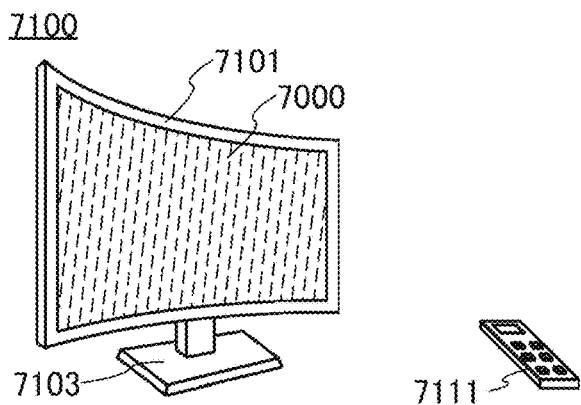

FIG. 28C illustrates an example of a television device. In a television device 7100, a display portion 7000 is incorporated in a housing 7101. Here, the housing 7101 is supported by a stand 7103.

The display device of one embodiment of the present invention can be used for the display portion 7000. Since light emitted from the light-emitting portion is extracted through a lens in the display device of one embodiment of the present invention, light extraction efficiency can be increased and an extremely bright image can be displayed.

Operation of the television device 7100 illustrated in FIG. 28C can be performed with an operation switch provided in the housing 7101 and a separate remote control 7111. Alternatively, the display portion 7000 may include a touch sensor, and the television device 7100 may be operated by touch on the display portion 7000 with a finger or the like. The remote control 7111 may be provided with a display portion for displaying information output from the remote control 7111. With operation keys or a touch panel provided in the remote control 7111, channels and volume can be controlled and videos displayed on the display portion 7000 can be operated.

Note that the television device 7100 has a structure in which a receiver, a modem, and the like are provided. A general television broadcast can be received with the receiver. When the television device is connected to a communication network by wire or wirelessly via the modem, one-way (from a transmitter to a receiver) or two-way (between a transmitter and a receiver or between receivers, for example) data communication can be performed.

Figure 28D:
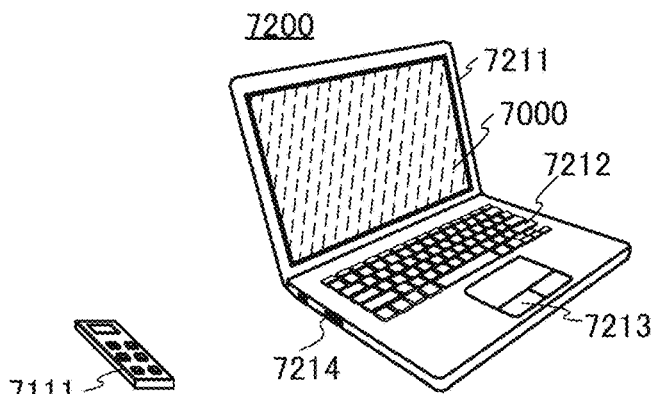

FIG. 28D illustrates an example of a notebook personal computer. A notebook personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000. Since light emitted from the light-emitting portion is extracted through a lens in the display device of one embodiment of the present invention, light extraction efficiency can be increased and an extremely bright image can be displayed.

Figure 28E:
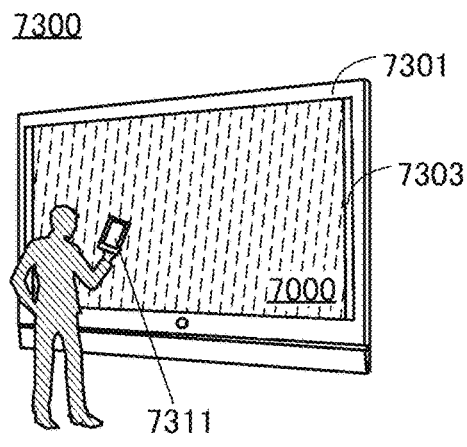
Figure 28F:
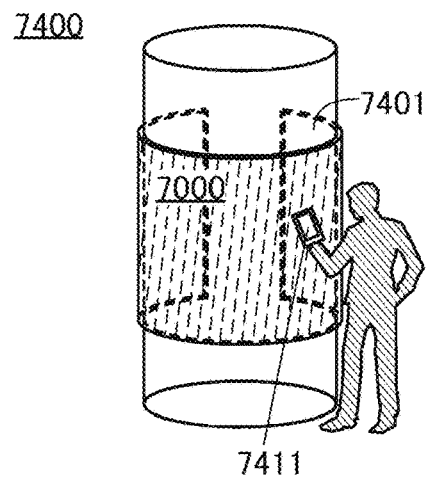

FIG. 28E and FIG. 28F illustrate examples of digital signage.

Digital signage 7300 illustrated in FIG. 28E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 28F is digital signage 7400 attached to a cylindrical pillar 7401. The digital signage 7400 includes the display portion 7000 provided along a curved surface of the pillar 7401.

The display device of one embodiment of the present invention can be used for the display portion 7000 illustrated in each of FIG. 28E and FIG. 28F. Since light emitted from the light-emitting portion is extracted through a lens in the display device of one embodiment of the present invention, light extraction efficiency can be increased and an extremely bright image can be displayed.

A larger area of the display portion 7000 can increase the amount of information that can be provided at a time. The larger display portion 7000 attracts more attention, so that the effectiveness of the advertisement can be increased, for example.

A touch panel is preferably used in the display portion 7000, in which case intuitive operation by a user is possible in addition to display of an image or a moving image on the display portion 7000. Moreover, for an application for providing information such as route information or traffic information, usability can be enhanced by intuitive operation. The touch panel can include the light-receiving device of the display apparatus of one embodiment of the present invention. The light-receiving device of the display apparatus of one embodiment of the present invention is configured to detect light through a lens and has high sensitivity to light. Thus, the touch panel can have high sensitivity and excel in detecting a touch position.

As illustrated in FIG. 28E and FIG. 28F, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIG. 29A to FIG. 29G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 29A to FIG. 29G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The electronic devices illustrated in FIG. 29A to FIG. 29G are described in detail below. Note that the display device of one embodiment of the present invention can be used in these electronic devices. Since light emitted from the light-emitting portion is extracted through a lens in the display device of one embodiment of the present invention, light extraction efficiency can be increased and an extremely bright image can be displayed. These electronic devices can each have a function of a touch sensor panel. The light-receiving device of the display apparatus of one embodiment of the present invention can have a function of the touch sensor panel. The light-receiving device of the display apparatus of one embodiment of the present invention is configured to detect light through a lens, has high sensitivity to light, and excels in detecting a touched position. Moreover, an image for fingerprint authentication can be obtained with the use of the light-receiving device.

Figure 29A:
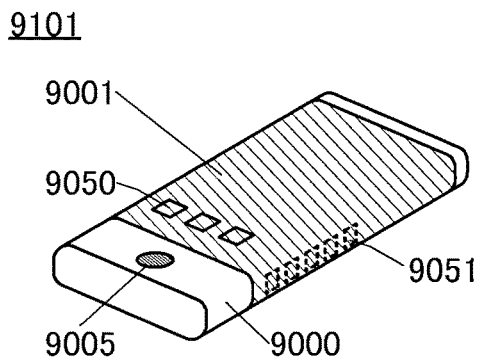
FIG. 29A to FIG. 29G are diagrams illustrating examples of electronic devices.

FIG. 29A is a perspective view illustrating a portable information terminal 9101. The portable information terminal 9101 can be used as a smartphone, for example. Note that the portable information terminal 9101 may include the speaker 9003, the connection terminal 9006, the sensor 9007, or the like. The portable information terminal 9101 can display characters and image information on its plurality of surfaces. FIG. 28A illustrates an example where three icons 9050 are displayed. Furthermore, information 9051 indicated by dashed rectangles can be displayed on another surface of the display portion 9001. Examples of the information 9051 include notification of reception of an e-mail, an SNS message, an incoming call, or the like, the title and sender of an e-mail, an SNS message, or the like, the date, the time, remaining battery, and the radio field intensity. Alternatively, the icon 9050 or the like may be displayed at the position where the information 9051 is displayed.

Figure 29B:
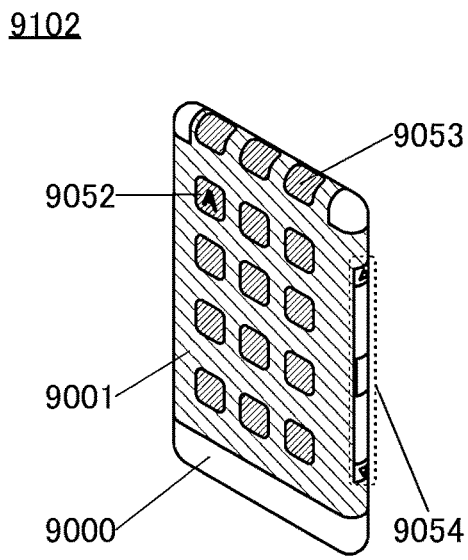

FIG. 29B is a perspective view illustrating a portable information terminal 9102. The portable information terminal 9102 has a function of displaying information on three or more surfaces of the display portion 9001. Here, an example is illustrated in which information 9052, information 9053, and information 9054 are displayed on different surfaces. A user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call.

Figure 29C:
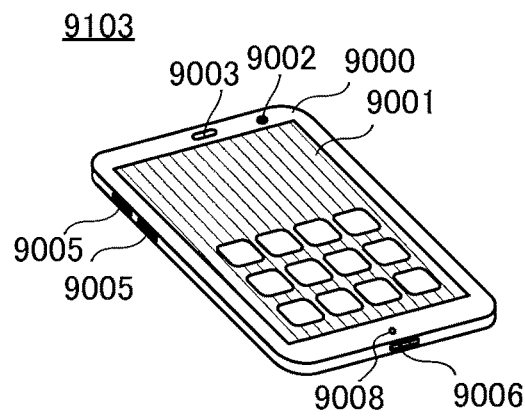

FIG. 29C is a perspective view illustrating a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 29D:
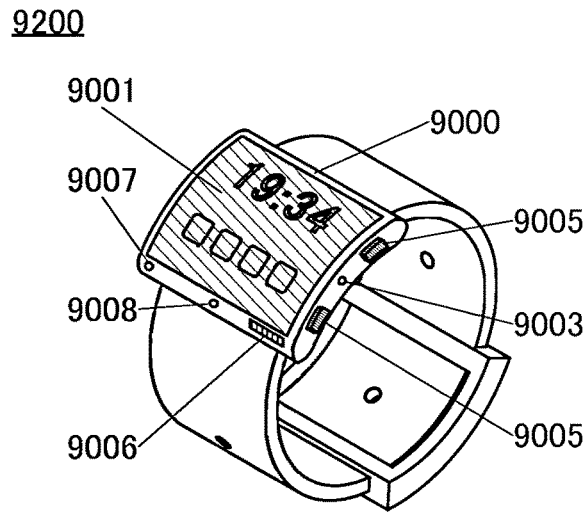

FIG. 29D is a perspective view illustrating a watch-type portable information terminal 9200. For example, the portable information terminal 9200 can be used as a Smartwatch (registered trademark). The display surface of the display portion 9001 is curved, and display can be performed on the curved display surface. Furthermore, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 29E:
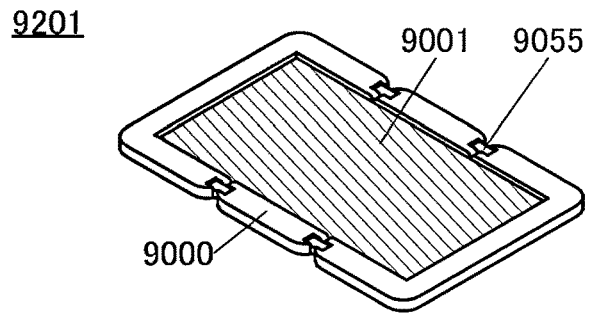
Figure 29F:
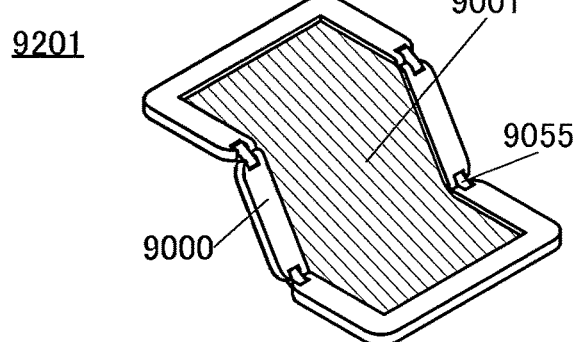
Figure 29G:
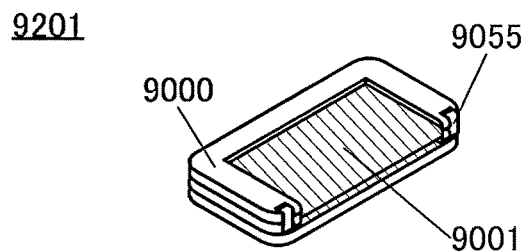

FIG. 29E to FIG. 29G are perspective views illustrating a foldable portable information terminal 9201. FIG. 29E is a perspective view of an opened state of the portable information terminal 9201, FIG. 29G is a perspective view of a folded state thereof, and FIG. 29F is a perspective view of a state in the middle of change from one of FIG. 29E and FIG. 29G to the other. The portable information terminal 9201 is highly portable in the folded state and is highly browsable in the opened state because of a seamless large display region. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

This embodiment can be combined with any of the other embodiments as appropriate.

REFERENCE NUMERALS

100A: display device, 100D: display device, 100E: display device, 100F: display device, 100G: display device, 100: display device, 101: layer, 110a: subpixel, 110b: subpixel, 110c: subpixel, 110d: subpixel, 110e: subpixel, 110: pixel, 111c: pixel electrode, 111d: pixel electrode, 112a: conductive layer, 112b: conductive layer, 112d: conductive layer, 113_1: light-emitting unit, 113_2: light-emitting unit, 113_3: charge-generation layer, 113c: layer, 113d: layer, 114: common layer, 115a: light-transmitting conductive film, 115b: semi-reflective electrode, 115: common electrode, 118c: mask layer, 118d: mask layer, 120: substrate, 122: adhesive layer, 123: conductive layer, 125: insulating layer, 126a: conductive layer, 126b: conductive layer, 126d: conductive layer, 127: insulating layer, 128: layer, 129a: conductive layer, 129b: conductive layer, 129d: conductive layer, 130c: light-emitting device, 130G: light-emitting device, 130GW: light-emitting device, 130R: light-emitting device, 130RW: light-emitting device, 131: protective layer, 133a: resin layer, 133b: resin layer, 133c: resin layer, 133F: planar region, 133R: convex surface region, 133: lens, 135: light-blocking layer, 136: lens, 137: planarization film, 138G: color filter, 138R: color filter, 139: planarization film, 140: connection portion, 145: photomask, 150P: light-receiving device, 150: light-receiving device, 151: substrate, 152: substrate, 162: display portion, 164: circuit, 165: wiring, 166: conductive layer, 172: FPC, 173: IC, 201: transistor, 204: connection portion, 205: transistor, 209: transistor, 210: transistor, 211: insulating layer, 213: insulating layer, 214: insulating layer, 215: insulating layer, 218: insulating layer, 221: conductive layer, 222a: conductive layer, 222b: conductive layer, 223: conductive layer, 225: insulating layer, 231i: channel formation region, 231n: low-resistance region, 231: semiconductor layer, 240: capacitor, 241: conductive layer, 242: connection layer, 243: insulating layer, 245: conductive layer, 251: conductive layer, 252: conductive layer, 254: insulating layer, 255a: insulating layer, 255b: insulating layer, 255c: insulating layer, 256: plug, 261: insulating layer, 262: insulating layer, 263: insulating layer, 264: insulating layer, 265: insulating layer, 271: plug, 274a: conductive layer, 274b: conductive layer, 274: plug, 280: display module, 281: display portion, 282: circuit portion, 283a: pixel circuit, 283: pixel circuit portion, 284a: pixel, 284: pixel portion, 285: terminal portion, 286: wiring portion, 290: FPC, 291: substrate, 292: substrate, 301: substrate, 310: transistor, 311: conductive layer, 312: low-resistance region, 313: insulating layer, 314: insulating layer, 315: element isolation layer, 320A: transistor, 320B: transistor, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 351: substrate, 352: finger, 353: layer, 355: functional layer, 357: layer, 359: substrate, 500: display device, 501: electrode, 502: electrode, 512B_1: light-emitting unit, 512B_2: light-emitting unit, 512B_3: light-emitting unit, 512G_1: light-emitting unit, 512G_2: light-emitting unit, 512G_3: light-emitting unit, 512R_1: light-emitting unit, 512R_2: light-emitting unit, 512R_3: light-emitting unit, 521: layer, 522: layer, 523B: light-emitting layer, 523G: light-emitting layer, 523R: light-emitting layer, 524: layer, 525: layer, 531: charge-generation layer, 542: light-receiving unit, 543: active layer, 550B: light-emitting device, 550G: light-emitting device, 550R: light-emitting device, 560: light-receiving device, 700A: electronic device, 700B: electronic device, 721: housing, 723: mounting portion, 727: earphone portion, 750: earphone, 751: display panel, 753: optical member, 756: display region, 757: frame, 758: nose pad, 800A: electronic device, 800B: electronic device, 820: display portion, 821: housing, 822: communication portion, 823: mounting portion, 824: control portion, 825: image capturing portion, 827: earphones portion, 832: lens, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote control, 7200: notebook personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9002: camera, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9103: tablet terminal, 9200: portable information terminal, 9201: portable information terminal

The invention claimed is:
1. A display device comprising:
a first pixel comprising a light-emitting device;
a second pixel comprising a light-receiving device and a lens overlapping the light-receiving device; and a first substrate over the lens, a first surface of the first substrate having a light-blocking layer, wherein the lens is provided in an opening portion of the light-blocking layer on the first surface of the first substrate, wherein the light-emitting device and the light-receiving device share a common electrode, wherein a width of the opening portion is greater than a width of a light-receiving portion of the light-receiving device, wherein a cross section of the lens in a thickness direction including an optical axis has a substantially trapezoidal shape, wherein a first surface of the lens comprises a leg of the substantially trapezoidal shape and has a convex shape, wherein a second surface of the lens comprises an upper base of the substantially trapezoidal shape and is provided to face the light-receiving portion, wherein a third surface of the lens comprises a lower base of the substantially trapezoidal shape and is in contact with the first surface of the first substrate, wherein a width of the lower base is greater than a width of the upper base, and wherein the first pixel and the second pixel are provided to be adjacent to each other.

2. The display device according to claim 1, wherein the light-emitting device and the light-receiving device share a common layer provided under the common electrode.

3. The display device according to claim 1, wherein the second surface of the lens comprises a region having a convex shape.

4. The display device according to claim 1, wherein the lens and the light-receiving device are separately provided so that a center of the lens and a center of the light-receiving device overlap with each other.

5. The display device according to claim 1, wherein the light-emitting device has a tandem structure.

6. The display device according to claim 5,
wherein the tandem light-emitting device comprises a plurality of light-emitting units, and
wherein the plurality of light-emitting units emit light of the same color.

7. An electronic device comprising the display device according to claim 1, wherein the electronic device obtains an image of a fingerprint using the light-receiving device to perform fingerprint authentication.

8. A display device comprising:
a first pixel comprising a light-emitting device and a first lens overlapping the light-emitting device;
a second pixel comprising a light-receiving device and a second lens overlapping with the light-receiving device; and
a first substrate over the first lens and the second lens, a first surface of the first substrate having a light-blocking layer,
wherein the light-emitting device and the light-receiving device share a common electrode,
wherein the first lens is provided in a first opening portion of the light-blocking layer on the first surface of the first substrate,
wherein the second lens is provided in a second opening portion of the light-blocking layer on the first surface of the first substrate,
wherein a width of the first opening portion is greater than a width of a light-emitting portion of the light-emitting device,
wherein a width of the second opening portion is greater than a width of a light-receiving portion of the light-receiving device,
wherein a cross section of each of the first lens and the second lens in a thickness direction including an optical axis has a substantially trapezoidal shape,
wherein a first surface of each of the first lens and the second lens comprises a leg of the substantially trapezoidal shape and has a convex shape,
wherein a second surface of the second lens comprises an upper base of the substantially trapezoidal shape and is provided to face the light-receiving portion,
wherein a third surface of the second lens comprises a lower base of the substantially trapezoidal shape and is in contact with the first surface of the first substrate,
wherein a width of the lower base is greater than a width of the upper base, and
wherein the first pixel and the second pixel are provided to be adjacent to each other.

9. The display device according to claim 8, wherein the light-emitting device and the light-receiving device share a common layer provided under the common electrode.

10. The display device according to claim 8, wherein a second surface of the first lens comprises an upper base of the substantially trapezoidal shape and is provided to face the light-emitting portion.

11. The display device according to claim 8, wherein the second surface of the second lens comprise a region having a convex shape.

12. The display device according to claim 8,
wherein the first lens and the light-emitting device are separately provided in such a manner that a center of the first lens and a center of the light-emitting device overlap with each other, and
wherein the second lens and the light-receiving device are separately provided in such a manner that a center of the second lens and a center of the light-receiving device overlap with each other.

13. The display device according to claim 8, wherein the light-emitting device has a tandem structure.

14. The display device according to claim 13,
wherein the tandem light-emitting device comprises a plurality of light-emitting units, and
wherein the plurality of light-emitting units emit light of the same color.

15. An electronic device comprising the display device according to claim 8, wherein the electronic device obtains an image of a fingerprint using the light-receiving device to perform fingerprint authentication.

* * * * *